(12) United States Patent
Masuoka et al.

(10) Patent No.: US 8,901,640 B2
(45) Date of Patent: Dec. 2, 2014

(54) SEMICONDUCTOR ELEMENT AND SEMICONDUCTOR DEVICE

(75) Inventors: Fujio Masuoka, Tokyo (JP); Tomohiko Kudo, Tokyo (JP)

(73) Assignee: Unisantis Electronics Singapore PTE Ltd., Peninsula Plaza (SG)

( * ) Notice: Subject to any disclaimer, the term of this patent is extended or adjusted under 35 U.S.C. 154(b) by 354 days.

(21) Appl. No.: 12/944,310

(22) Filed: Nov. 11, 2010

(65) Prior Publication Data

US 2011/0115011 A1    May 19, 2011

Related U.S. Application Data

(60) Provisional application No. 61/281,437, filed on Nov. 16, 2009.

(30) Foreign Application Priority Data

Nov. 13, 2009   (JP) ................................. 2009-259491

(51) Int. Cl.

| H01L 29/76 | (2006.01) |
|---|---|
| H01L 29/94 | (2006.01) |
| H01L 31/062 | (2012.01) |
| H01L 31/113 | (2006.01) |
| H01L 31/119 | (2006.01) |
| H01L 29/78 | (2006.01) |
| H01L 21/8234 | (2006.01) |
| H01L 29/06 | (2006.01) |
| H01L 29/423 | (2006.01) |
| H01L 29/66 | (2006.01) |
| H01L 29/786 | (2006.01) |

(52) U.S. Cl.
CPC .... *H01L 29/7827* (2013.01); *H01L 21/823431* (2013.01); *H01L 29/0657* (2013.01); *H01L 29/42356* (2013.01); *H01L 29/42392* (2013.01); *H01L 29/66666* (2013.01); *H01L 29/78642* (2013.01); *H01L 29/42364* (2013.01); *H01L 29/42372* (2013.01)
USPC .................... 257/329; 257/328; 257/E29.262

(58) Field of Classification Search
USPC .................... 257/329, E29.262, 328
See application file for complete search history.

(56) References Cited

U.S. PATENT DOCUMENTS

2010/0102361 A1* 4/2010 Chen ............................ 257/204

FOREIGN PATENT DOCUMENTS

| FR | 2789227 A1 | 8/2000 |
|---|---|---|
| JP | 07-297406 A | 11/1995 |

(Continued)

OTHER PUBLICATIONS

Takato, Hiroshi et al., "Impact of Surrounding Gate Transistor (SGT) for Ultra-High-Density LSI's", IEEE Transactions on Electron Devices, vol. 38, No. 3, Mar. 1991, pp. 573-578.
Watanabe, Shigeyoshi, "Impact of Three-Dimensional Transistor on the Pattern Area Reduction for ULSI", IEEE Transactions on Electron Devices, vol. 50, No. 10, Oct. 2003, pp. 2073-2080.

(Continued)

*Primary Examiner* — Thien F Tran
(74) *Attorney, Agent, or Firm* — Brinks Gilson & Lione

(57) ABSTRACT

The object of the invention is to provide a semiconductor device realizing high-speed operation of surrounding gate transistors (SGTs), which are three-dimensional semiconductors, by increasing the ON current of the SGTs. This object is achieved by a semiconductor element being provided in which a source, a drain and a gate are positioned in layers on a substrate, the semiconductor element being provided with: a silicon column; an insulating body surrounding the side surface of the silicon column; a gate surrounding the insulating body; a source region positioned above or below the silicon column; and a drain region positioned below or above the silicon column; wherein the contact surface of the silicon column with the source region is smaller than the contact surface of the silicon column with the drain region.

5 Claims, 109 Drawing Sheets

(56) References Cited

FOREIGN PATENT DOCUMENTS

| | | |
|---|---|---|
| JP | 09-121152 A | 5/1997 |
| JP | 2006-294995 A | 10/2006 |
| JP | 2007-123415 A | 5/2007 |
| JP | 2007-250652 A | 9/2007 |

OTHER PUBLICATIONS

Oh, Sang-Hyun et al., "50 nm Vertical Replacement-Gate (VRG) pMOSFETs," IEEE, 2000, pp. 65-68.

Extended European Search Report for counterpart European Application No. 10014577.0, dated Feb. 16, 2011, 7 pages.

\* cited by examiner

PRIOR ART

PRIOR ART

SEMICONDUCTOR ELEMENT AND SEMICONDUCTOR DEVICE

RELATED APPLICATIONS

Pursuant to 35 U.S.C. §119(e), this application claims the benefit of the filing date of Provisional U.S. Patent Application Ser. No. 61/281,437 filed on Nov. 16, 2009. This application also claims priority under 35 U.S.C. §119(a) to JP2009-259491 filed on Nov. 13, 2009. The entire contents of these applications are hereby incorporated by reference.

FIELD OF THE INVENTION

The present invention relates to a semiconductor element and to a semiconductor device which uses the semiconductor element, and specifically relates to a semiconductor device which uses a surrounding gate transistor (SGT) comprising a three-dimensional semiconductor and the semiconductor device by which it is used.

BACKGROUND OF THE INVENTION

A miniaturized planar transistor is used in the broad sector of computers, communication equipment, instruments, automatic control devices, and machinery and tools used in daily life, as microprocessors, ASIC and microcomputers which have low power consumption, are low in cost and which have high information processing ability; and as low-cost high-capacity memory. With a planar type transistor, a source, gate, and drain are horizontally arranged relative to a silicon substrate surface. On the other hand, with an SGT, the source, gate and drain are arranged vertically relative to the silicon substrate. The gate incorporates a convex semiconductor layer arranged on a silicon substrate (for example, reference is made to non-patent literature 1, and to FIG. 94 of the specification of the present application). Furthermore, in comparison to a planar type transistor, the area possessed by the SGT is small relative to the substrate (for example, reference is made to non-patent literature 2).

For an SGT as well, as with the planar transistor, the realization of high-speed operation and low power consumption is sought. The SGT structure is greatly influenced by the creation process. With a typical SGT production method, an SGT silicon column is formed by etching the silicon layer by means of the dry etching method. The cross-sectional shape of an SGT silicon column thus formed by the characteristics and dry etching generally becomes a trapezoid (for example, reference is made to patent literature 1, and to FIG. 94 of the specification of the present application). Furthermore, with an SGT in which the cross-section of a silicon column is a trapezoid, the realization of high-speed operation and low power consumption is sought.

[Patent Literature 1] Unexamined Japanese Patent Application KOKAI Publication No. 2007-123415

[Non-Patent Literature 1] H. Takato. Et. al, IEEE Transactions on electron devices vol. 38, No. 3, March 1991, pp. 573-578

[Non-Patent Literature 2] S. Watanabe, IEEE Transactions on electron devices, vol. 50, October 2003, pp. 2073-2080

SUMMARY OF THE INVENTION

The present invention, in considering the problem, has the objective of providing a semiconductor element and semiconductor device which operates at high speed.

The semiconductor element relating to the first aspect of the present invention is wherein it is provided with:

a silicon column, and an insulating body arranged on the silicon column so as to encompass the side surface of the silicon column, and a gate arranged on the insulating body so is to encompass the insulating body, and a source region arranged on the upper part or the lower part of the silicon column, and a drain region arranged on the lower part or the upper part of the silicon column, wherein the contact surface between the silicon column and the source region is smaller than the contact surface between the silicon column and the drain region.

At this time, a semiconductor element is composed to be capable of being arranged on the substrate, and on the substrate are arranged one or more semiconductor elements having the same structure as a semiconductor element which is different from that of the referenced semiconductor element, and it would be desirable for the gate of the semiconductor element to be connected to the gate of a separate semiconductor element, and for the drain region of the semiconductor element to be connected to the drain region of a separate semiconductor, and for the source region of the semiconductor element to be connected to the source region of a separate semiconductor element.

The semiconductor device relating to a second aspect of the present invention is wherein it is a semiconductor device that operates as a NAND circuit composed of four semiconductor elements arranged on a substrate in an array of 2 rows and 2 columns, and the drain regions of the semiconductor element arranged in a 1st row 1st column, 2nd row 1st column, and 2nd row 2nd column are respectively arranged toward the substrate side from the silicon column; and the source region of the semiconductor elements arranged in the 1st row 2nd column is arranged toward the substrate side from the silicon column; and the gates of the semiconductor elements arranged in a 1st row 1st column and 1st row 2nd column are mutually connected; and the gates of the semiconductor elements arranged in a 2nd row 1st column and 2nd row 2nd column are mutually connected; and the drain regions of the semiconductor elements arranged in a 1st row 1st column, 2nd row 1st column and 2nd row 2nd column are mutually connected; and the source region of the semiconductor element arranged in a 2nd row 2nd column is connected to the drain region of the semiconductor element arranged in the 1st row 2nd column.

The semiconductor device relating to a third aspect of the present invention is wherein it is a semiconductor device that operates as a NAND circuit composed of four semiconductor elements arranged on a substrate in an array of 2 rows and 2 columns, the drain regions of the semiconductor elements are respectively arranged toward the substrate side from the silicon column; and the gates of the semiconductor elements arranged in a 1st row 1st column and 1st row 2nd column are mutually connected; and the gates of the semiconductor elements arranged in a 2nd row 1st column and 2nd row 2nd column are mutually connected; and the drain regions of the semiconductor elements arranged in a 1st row 1st column, 2nd row 1st column and 2nd row 2nd column are mutually connected; and the source region of the semiconductor element arranged in a 2nd row 2nd column is connected to the drain region of the semiconductor element arranged in the 1st row 2nd column.

The semiconductor device relating to a fourth aspect of the present invention is wherein it is a semiconductor device that operates as a NAND circuit composed of four semiconductor elements arranged on a substrate in an array of 2 rows and 2 columns, and the drain region of the semiconductor element arranged in a 1st row 2nd column is arranged toward the substrate side from the silicon column; and the source regions of the semiconductor elements arranged in a 1st row 1st column, 2nd row 1st column and 2nd row 2nd column are arranged toward the substrate side from the silicon column; and the gates of the semiconductor elements arranged in a 1st row 1st column and 1st row 2nd column are mutually connected; and the gates of the semiconductor elements arranged in a 2nd row 1st column and 2nd row 2nd column are mutually connected; and the drain regions of the semiconductor elements arranged in a 1st row 1st column, 2nd row 1st column and 2nd row 2nd column are mutually connected; and the source region of the semiconductor element arranged in a 2nd row 2nd column, is connected to the drain region of the semiconductor element arranged in the 1st row 2nd column.

The semiconductor device relating to a fifth aspect of the present invention is wherein it is a semiconductor device that operates as a NAND circuit composed of four semiconductor elements arranged on a substrate in an array of 2 rows and 2 columns, and the source regions of the semiconductor elements arranged in a 1st row 1st column, 1st row 2nd column, 2nd row 1st column and 2nd row 2nd column are respectively arranged toward the substrate side from the silicon column; and the gates of the semiconductor elements arranged in a 1st row 1st column and 1st row 2nd column are mutually connected; and the gates of the semiconductor elements arranged in a 2nd row 1st column and 2nd row 2nd column are mutually connected; and the drain regions of the semiconductor elements arranged in a 1st row 1st column, 2nd row 1st column and 2nd row 2nd column are mutually connected; and the source regions of the semiconductor elements arranged in a 2nd row 2nd column, are connected to the drain region of the semiconductor element arranged in the 1st row 2nd column.

A semiconductor element relating to the sixth aspect of the present invention is wherein it is provided with:

a first silicon column which has a first contact surface and a second contact surface, and an insulating body arranged on the first silicon column so as to encompass the side surface of the first silicon column, and a gate arranged on the insulating body so as to encompass the insulating body, and a second silicon column connected to the first silicon column within the side of the first contact surface, wherein it is a second silicon column arranged on the upper part or the lower part of the first silicon column, and a third silicon column connected to the first silicon column within the side of the second contact surface, wherein it is a third silicon column arranged on the lower part or the upper part of the first silicon column, and a source region which covers the second silicon column in accompaniment with covering the part which does not contact the second silicon column within the first contact surface, and a drain region which covers the third silicon column in accompaniment with covering the part which does not contact the third silicon column within the second contact surface, wherein the first contact surface is smaller than the second contact surface.

At this time, a semiconductor element is composed so as to be capable of being arranged on a substrate, and on the substrate are arranged one or more separate semiconductor elements of the same structure as semiconductor elements which are different from the above semiconductor element, wherein it is desirable that:

the gate of the semiconductor element is connected to the gate of the separate semiconductor element, and that the drain region of the semiconductor element is connected to the drain region of the separate semiconductor element, and that the source region of the semiconductor element is connected to the source region of the separate semiconductor element.

The semiconductor device relating to a seventh aspect of the present invention is wherein it is a semiconductor device that operates as a NAND circuit composed of four semiconductor elements arranged on a substrate in an array of 2 rows and 2 columns, and that:

the drain regions of the semiconductor element arranged in a 1st row 1st column, 2nd row 1st column, and 2nd row 2nd column are respectively arranged toward the substrate side from the first silicon column; and the source region of the semiconductor element arranged in a 1st row 2nd column is arranged on the substrate side from the first silicon column; and the gates of the semiconductor elements arranged in a 1st row 1st column and 1st row 2nd column are mutually connected; and the gates of the semiconductor elements arranged in a 2nd row 1st column and 2nd row 2nd column are mutually connected; and the drain regions of the semiconductor elements arranged in a 1st row 1st column, 2nd row 1st column and 2nd row 2nd column are mutually connected; and the source region of the semiconductor element arranged in a 2nd row 2nd column is connected to the drain region of the semiconductor element arranged in the 1st row 2nd column.

The semiconductor device relating to a eighth aspect of the present invention is wherein it is a semiconductor device that operates as a NAND circuit composed of four semiconductor elements arranged on a substrate in an array of 2 rows and 2 columns, and the drain regions of all of the semiconductor elements are respectively arranged toward the substrate side from the first silicon column; and the gates of the semiconductor elements arranged in a 1st row 1st column and 1st row 2nd column are mutually connected; and the gates of the semiconductor elements arranged in a 2nd row 1st column and 2nd row 2nd column are mutually connected; and the drain regions of the semiconductor elements arranged in a 1st row 1st column, 2nd row 1st column and 2nd row 2nd column are mutually connected; and the source region of the semiconductor element arranged in a 2nd row 2nd column is connected to the drain region of the semiconductor element arranged in a 1st row 2nd column.

The semiconductor device relating to a ninth aspect of the present invention is wherein it is a semiconductor device that operates as a NAND circuit composed of four semiconductor elements arranged on a substrate in an array of 2 rows and 2 columns, and the drain region of the semiconductor element arranged in a 1st row 2nd column is arranged toward the substrate side from the first silicon column, and the source regions of the semiconductor elements arranged in a 1st row 1st column, 2nd row 1st column and 2nd row 2nd column are respectively arranged toward the substrate side from the first silicon column, and the gates of the semiconductor elements arranged in a 1st row 1st column and 1st row 2nd column are mutually connected; and the gates of the semiconductor elements arranged in a 2nd row 1st column and 2nd row 2nd column are mutually connected; and the drain regions of the semiconductor elements arranged in a 1st row 1st column, 2nd row 1st column and 2nd row 2nd column are mutually connected; and the source region of the semiconductor element arranged in a 2nd row 2nd column is connected to the drain region of the semiconductor element arranged in a 1st row 2nd column.

The semiconductor device relating to a tenth aspect of the present invention is wherein it is a semiconductor device that operates as a NAND circuit composed of four semiconductor elements arranged on a substrate in an array of 2 rows and 2 columns, and the source regions of all of the semiconductor elements are respectively arranged towards the substrate side from the first silicon column, and the gates of the semiconductor elements arranged in a 1st row 1st column and 1st row 2nd column are mutually connected; and the gates of the semiconductor elements arranged in a 2nd row 1st column and 2nd row 2nd column are mutually connected; and the drain regions of the semiconductor elements arranged in a 1st row 1st column, 2nd row 1st column and 2nd row 2nd column are mutually connected; and the source region of the semiconductor element arranged in a 2nd row 2nd column is connected to the drain region of the semiconductor element arranged in a 1st row 2nd column.

According to the semiconductor element having the above structure, since the ON current through which the SGT flows is large in comparison with a conventional SGT, high speed processing of the semiconductor device is made possible using this semiconductor element.

BRIEF DESCRIPTION OF THE DRAWINGS

A more complete understanding of this application can be obtained when the following detailed description is considered in conjunction with the following drawings, in which:

FIG. 57 is the line b-b' of the semiconductor device in FIG. 55;

FIG. 58 is the line c-c' of the semiconductor device in FIG. 55;

FIG. 59 is the line d-d' of the semiconductor device in FIG. 55;

FIG. 60A is a top view showing an example of producing a semiconductor device according to a fifth embodiment of the present invention;

FIG. 60B is a cross-sectional view along the line a-a' of the semiconductor device in FIG. 60A showing an example of producing a semiconductor device according to a fifth embodiment of the present invention;

FIG. 60C is a cross-sectional view along line b-b' of the semiconductor device in FIG. 60A showing an example of producing a semiconductor device according to a fourth embodiment of the present invention;

FIG. 61A is a top view showing an example of producing a semiconductor device according to a fifth embodiment of the present invention;

FIG. 61B is a cross-sectional view along line a-a' of the semiconductor device in FIG. 61A showing an example of producing a semiconductor device according to a fifth embodiment of the present invention;

FIG. 61C is a cross-sectional view along line b-b' of the semiconductor device in FIG. 61A showing an example of producing a semiconductor device according to a fifth embodiment of the present invention;

FIG. 62A is a top view showing an example of producing a semiconductor device according to a fifth embodiment of the present invention.

FIG. 62B is a cross-sectional view along line a-a' of the semiconductor device in FIG. 62A showing an example of producing a semiconductor device according to a fifth embodiment of the present invention;

FIG. 62C is a cross-sectional view along line b-b' of the semiconductor device in FIG. 62A showing an example of producing a semiconductor device according to a fifth embodiment of the present invention;

Figure 63A:
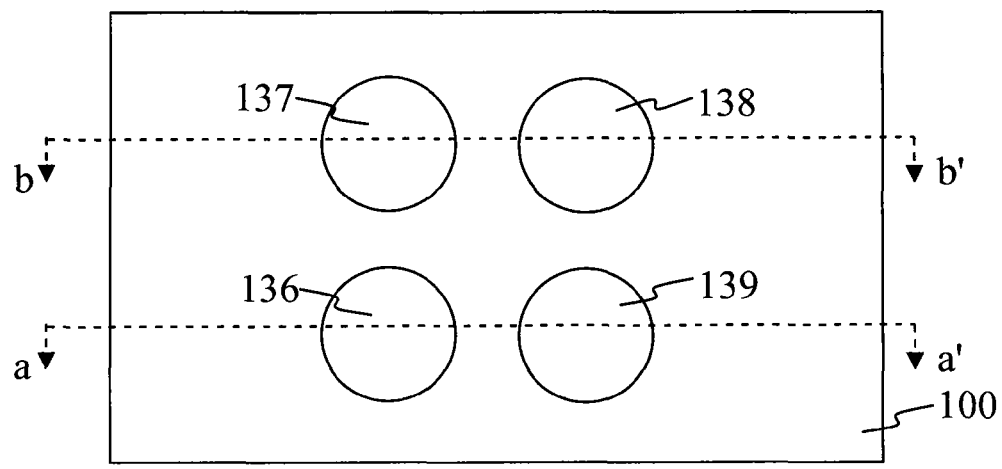
Figure 63B:
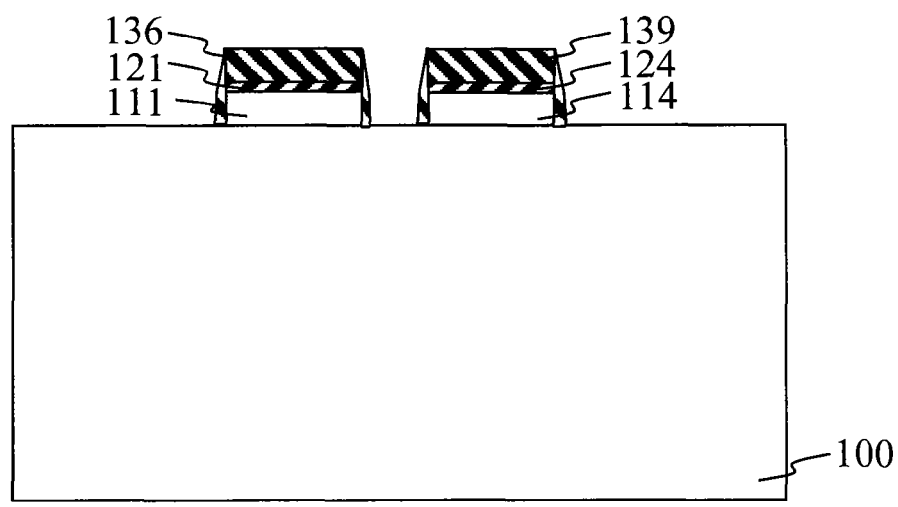
Figure 63C:
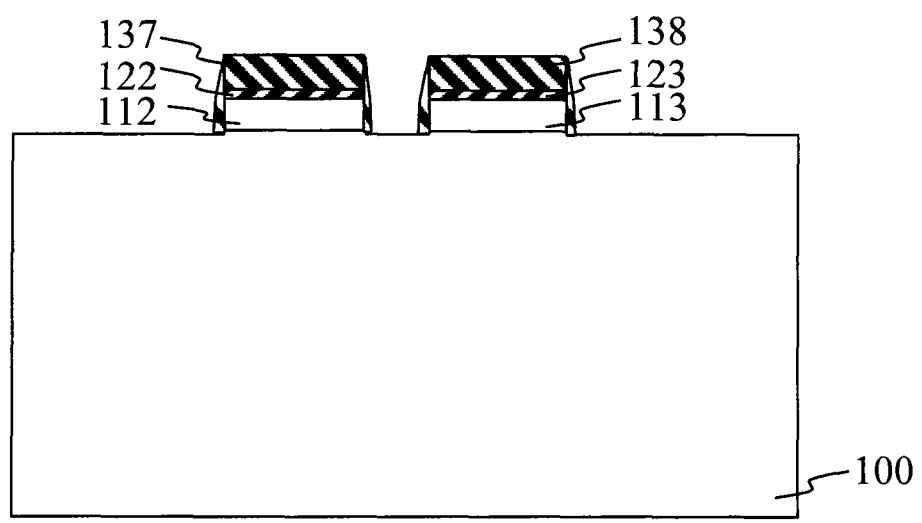
Figure 64A:
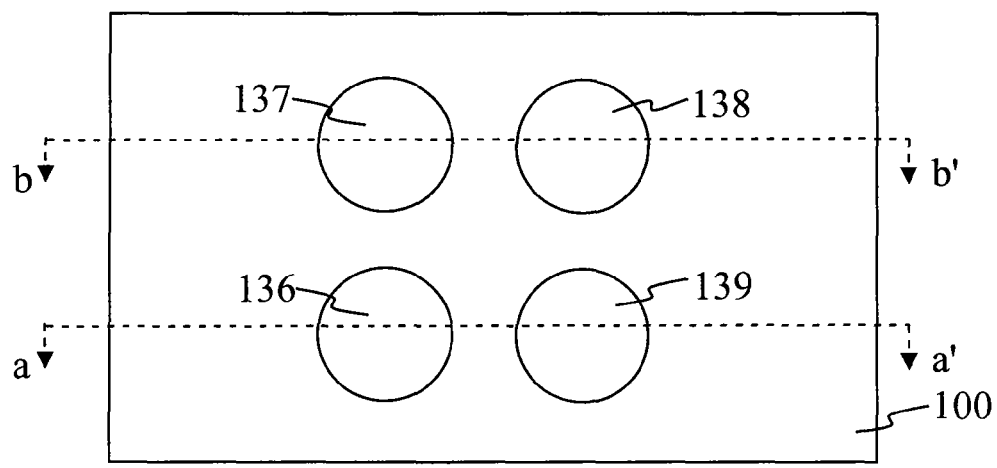
Figure 64B:
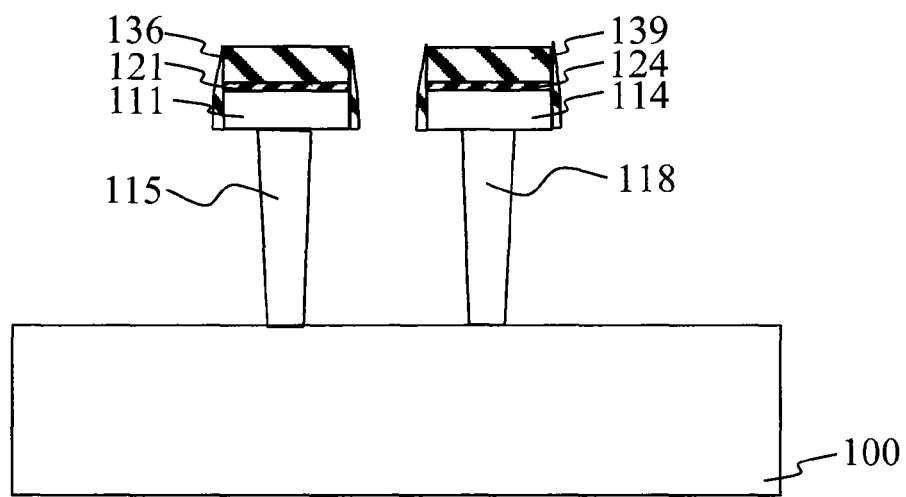
Figure 64C:
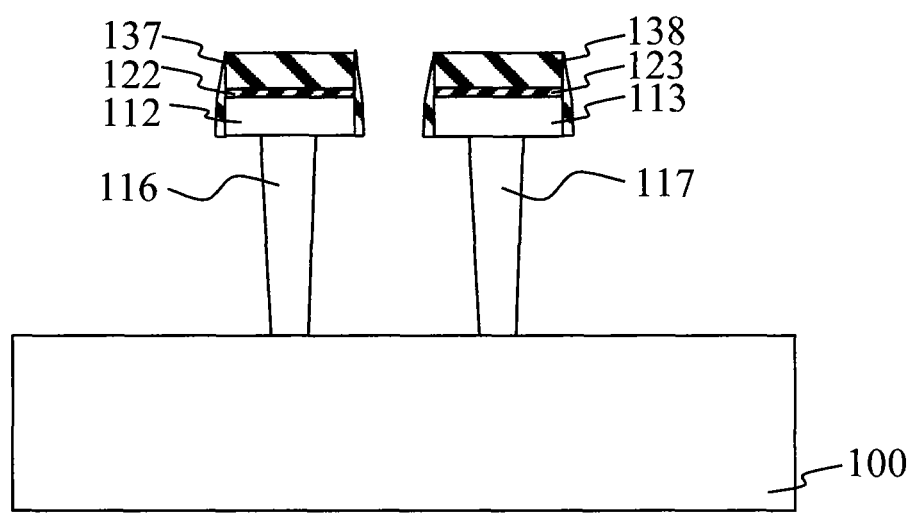
Figure 65A:
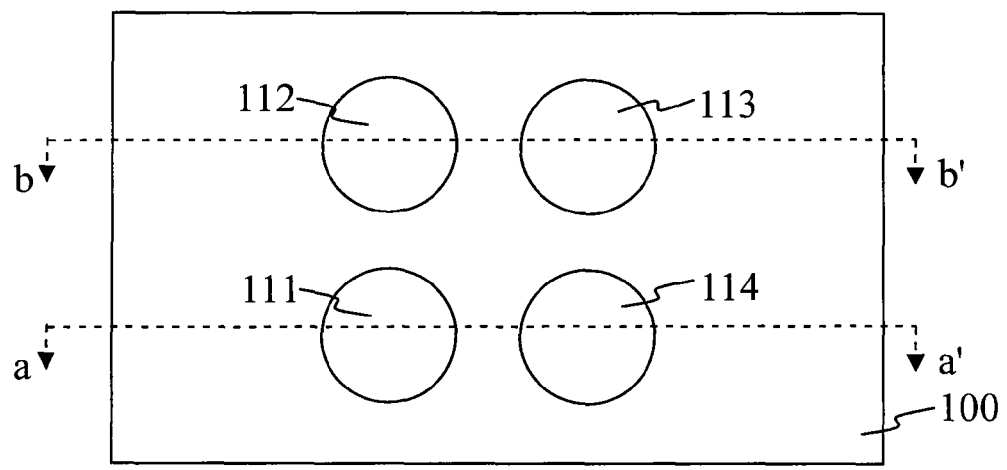
Figure 65B:
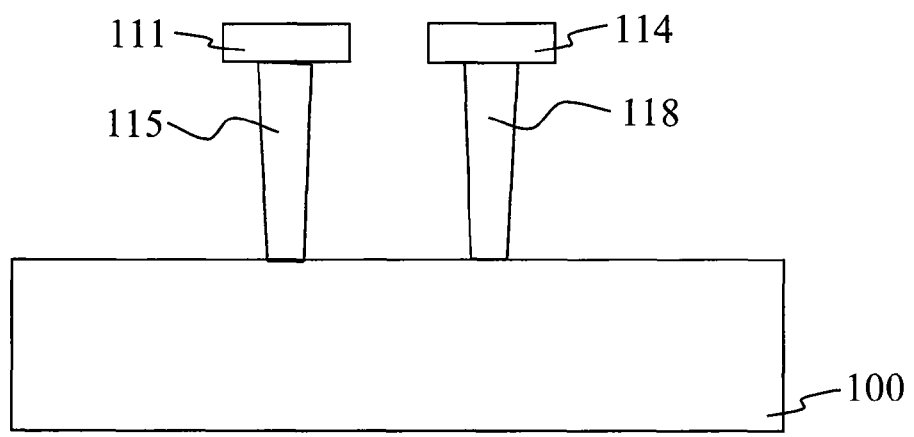
Figure 65C:
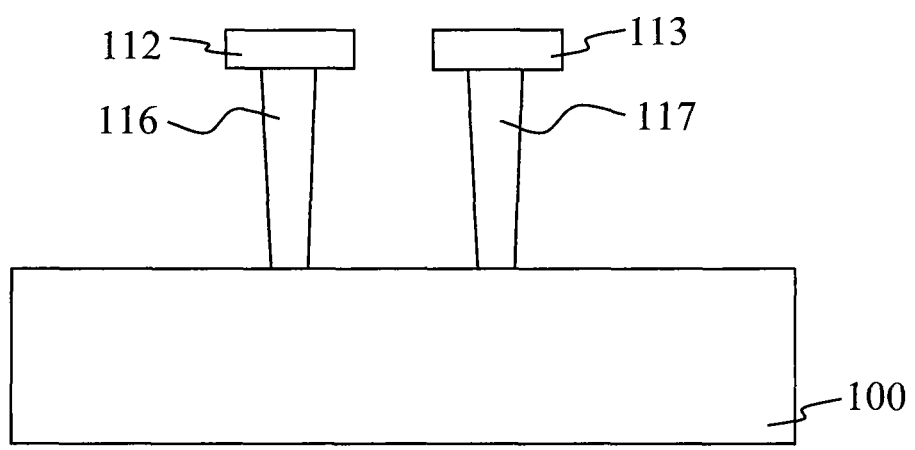
Figure 66A:
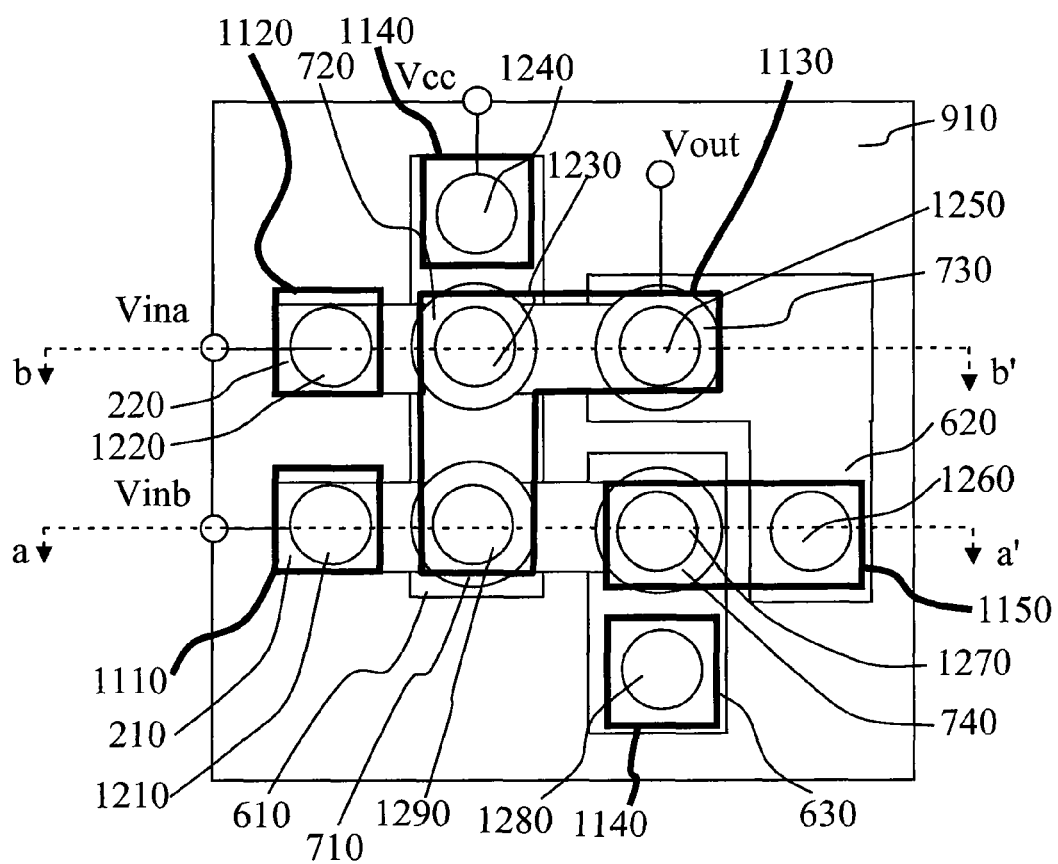
Figure 66B:
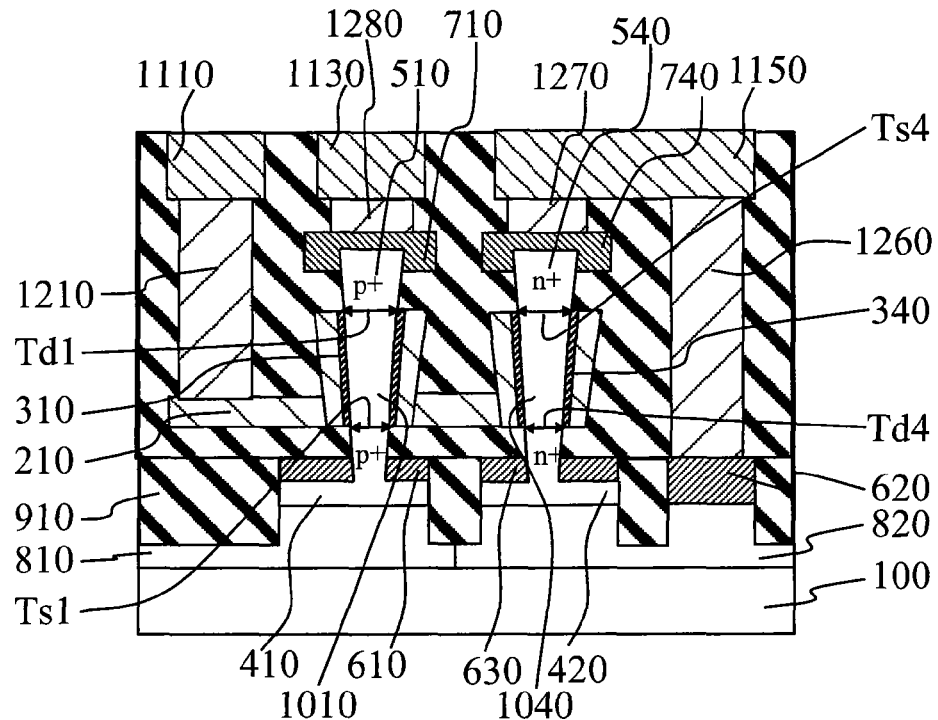
Figure 66C:
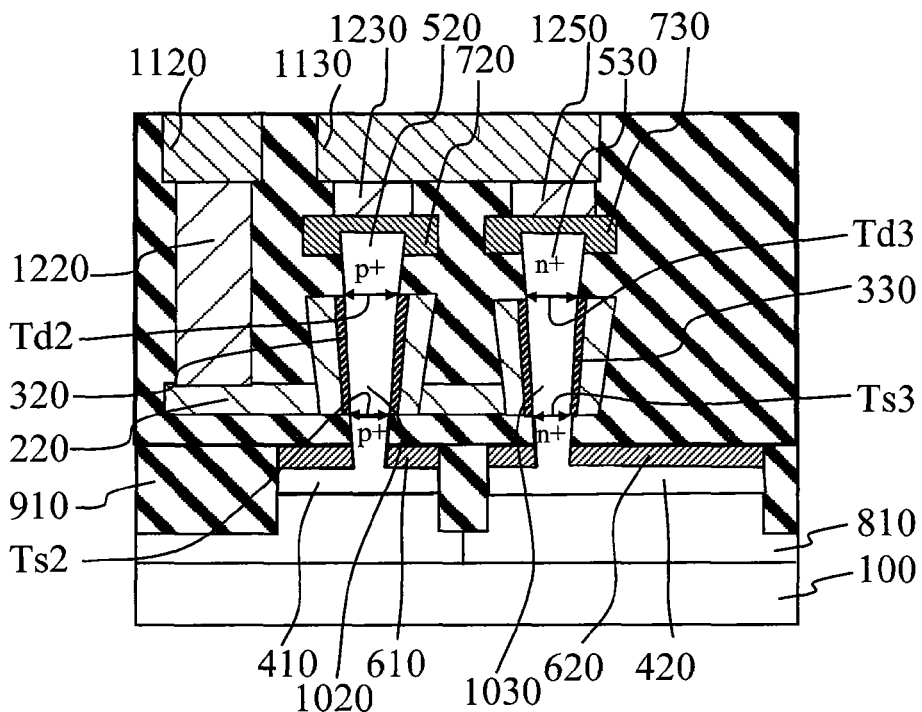
Figure 67:
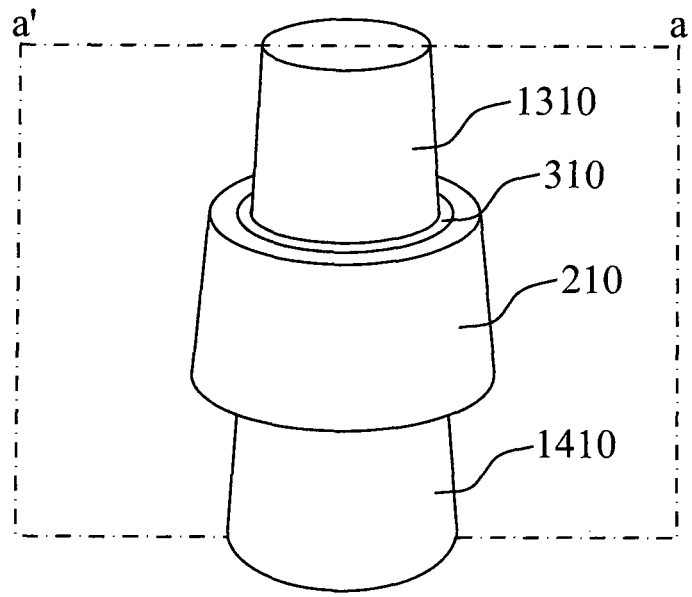
Figure 68:
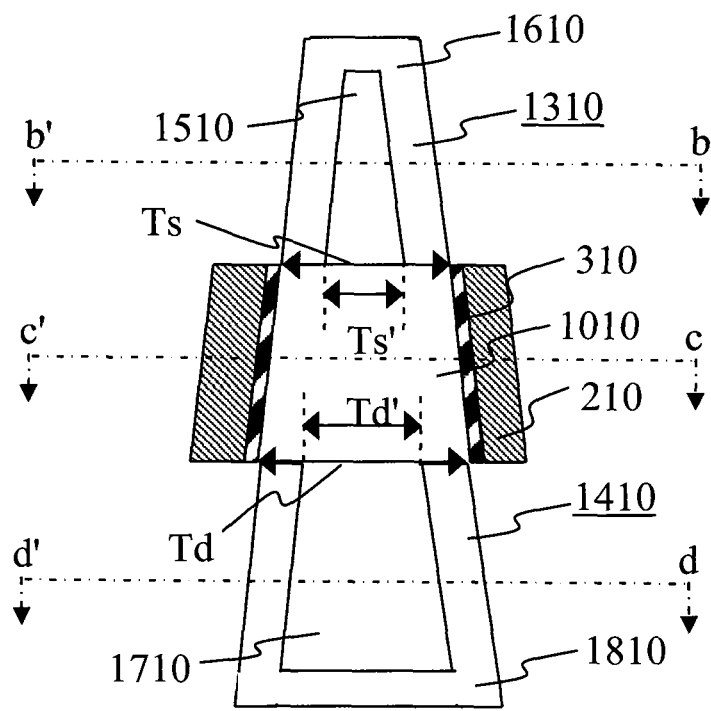
Figure 69:
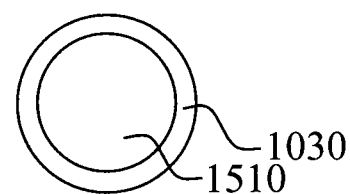
Figure 70:
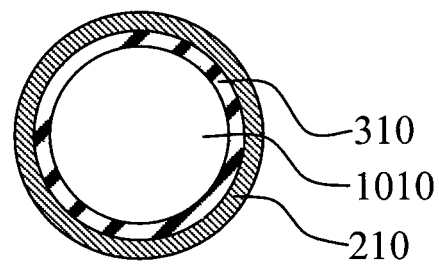
Figure 71:
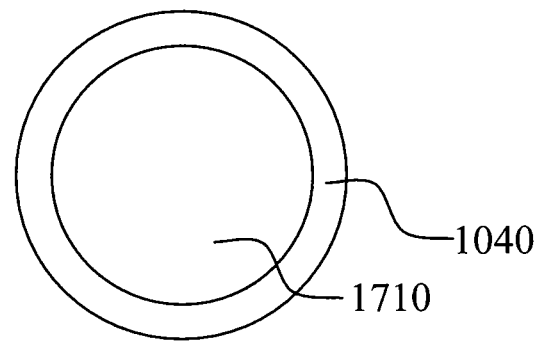
Figure 72:
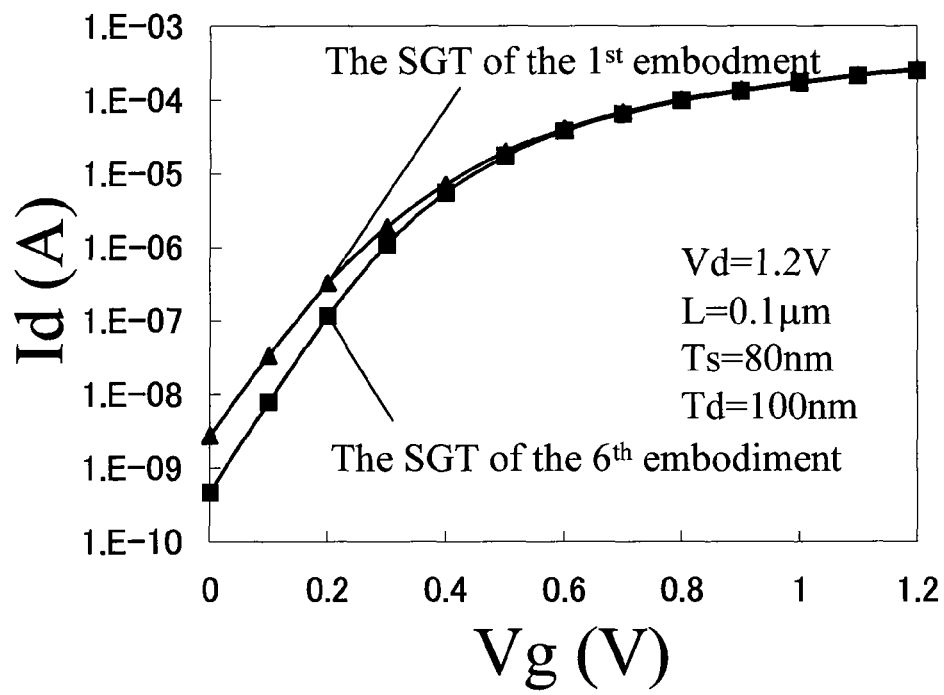
Figure 73:
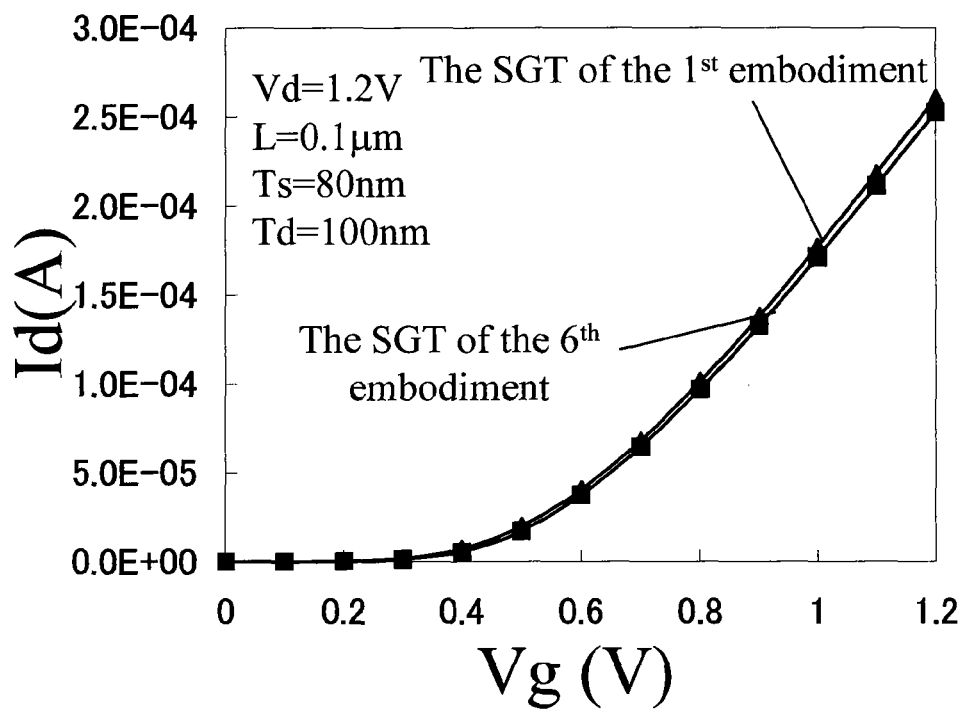
Figure 74:
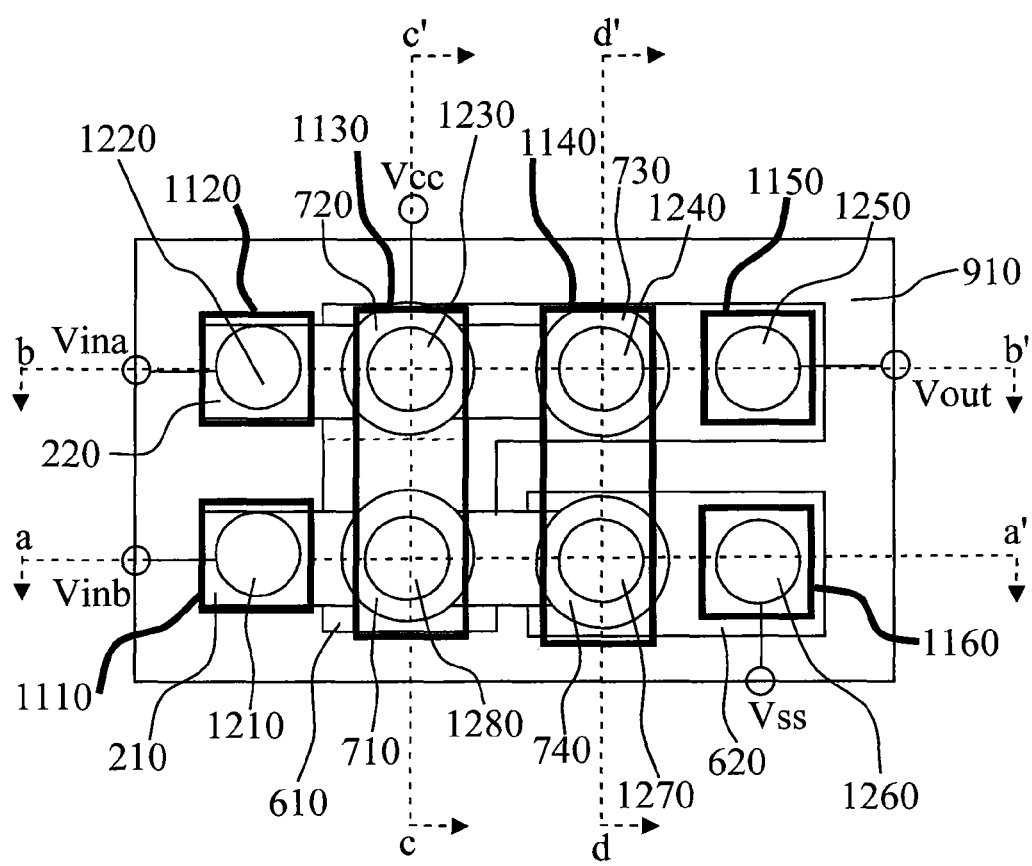
Figure 75:
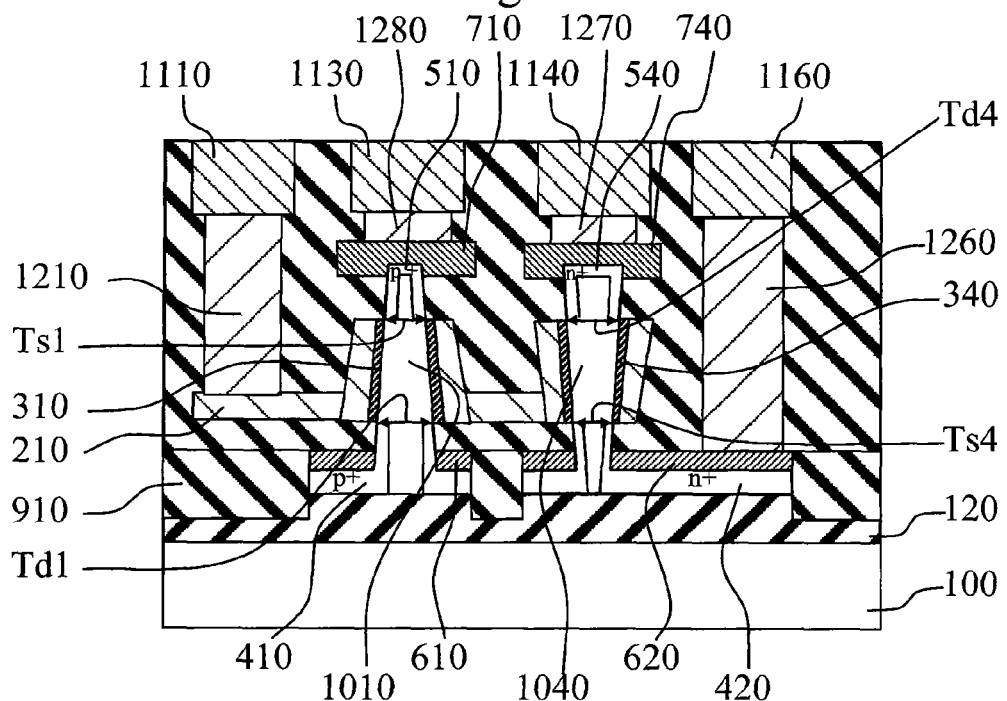
Figure 76:
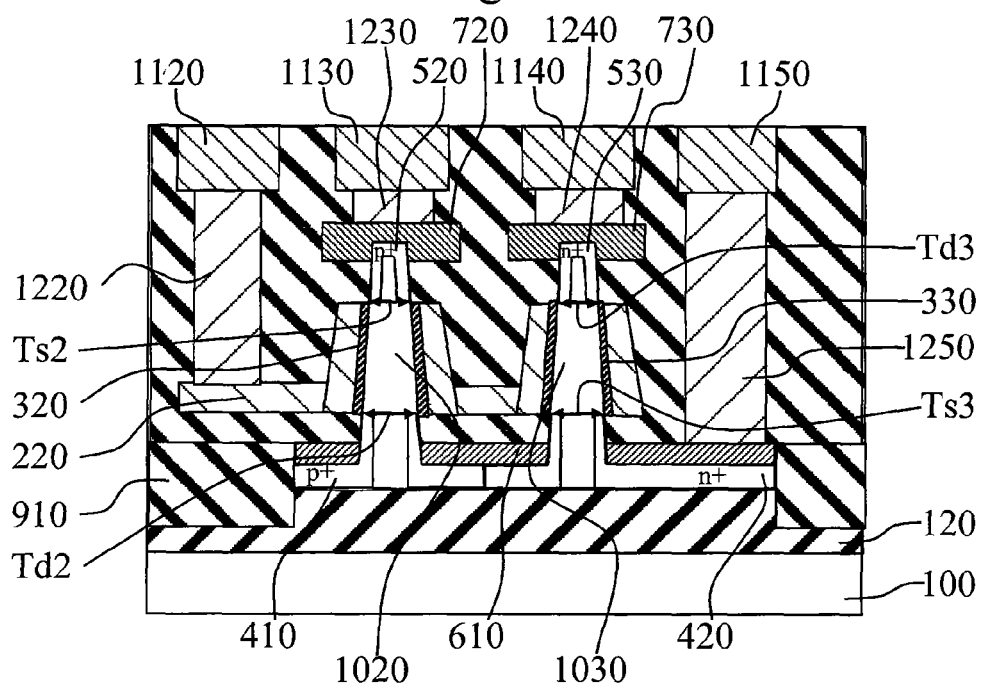
Figure 77:
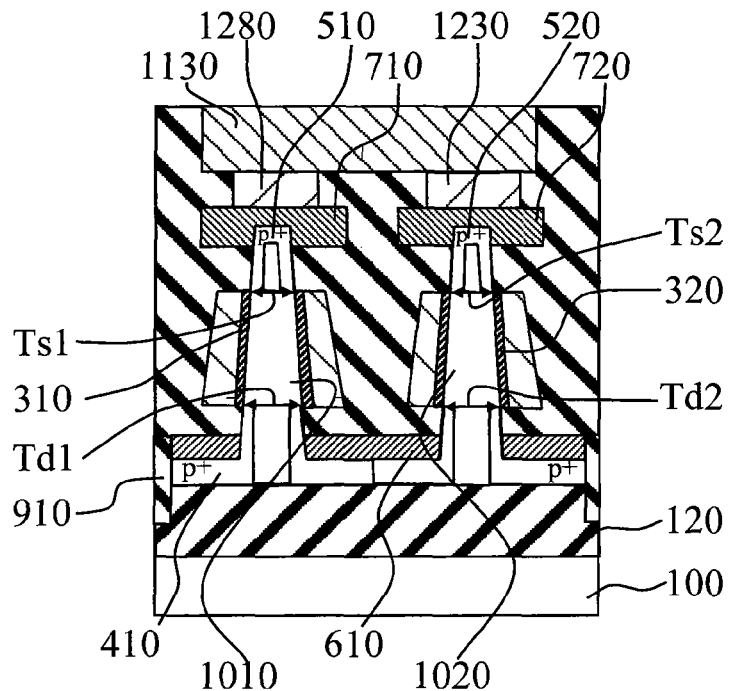
Figure 78:
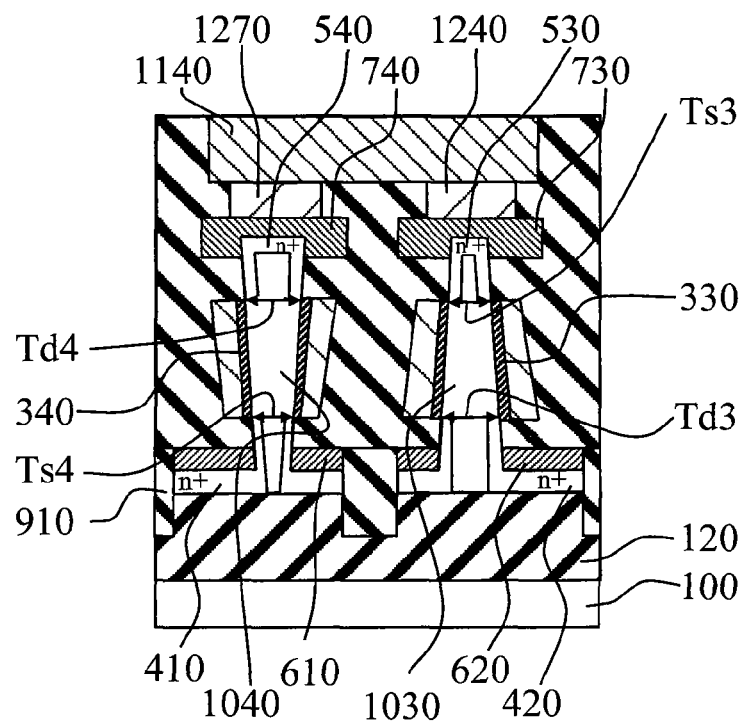
Figure 79:
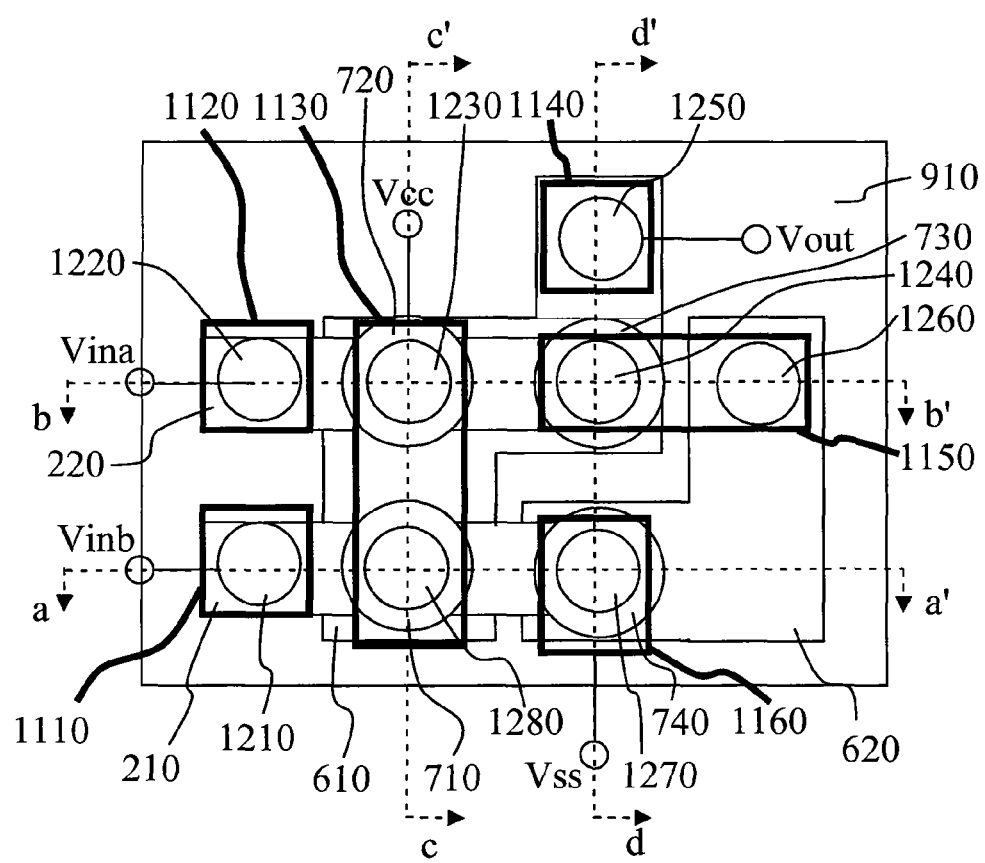
Figure 80:
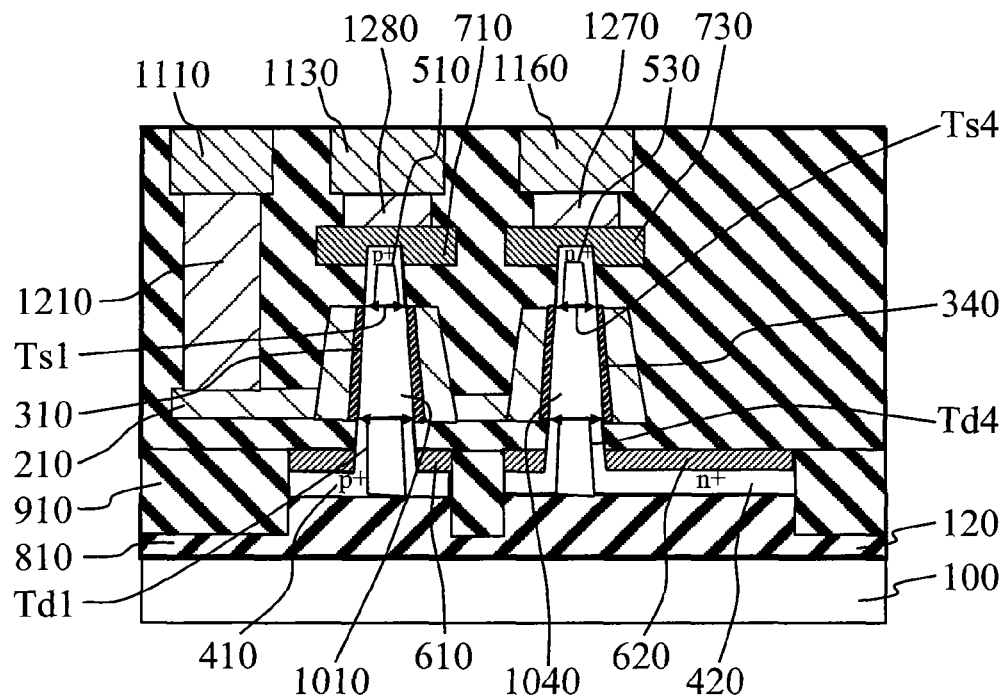
Figure 81:
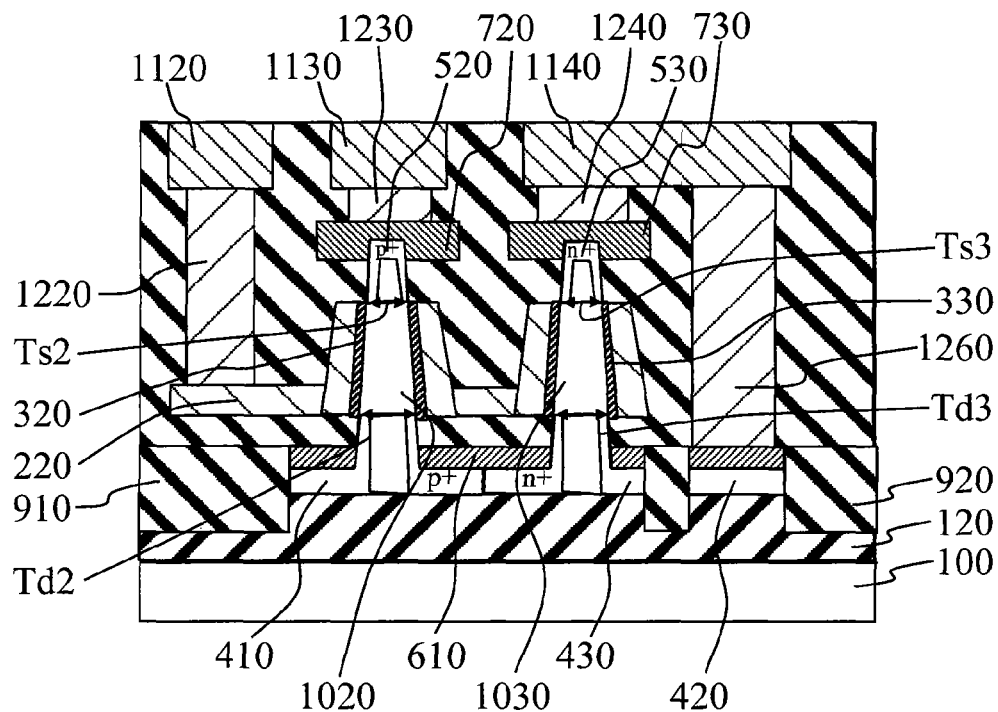
Figure 82:
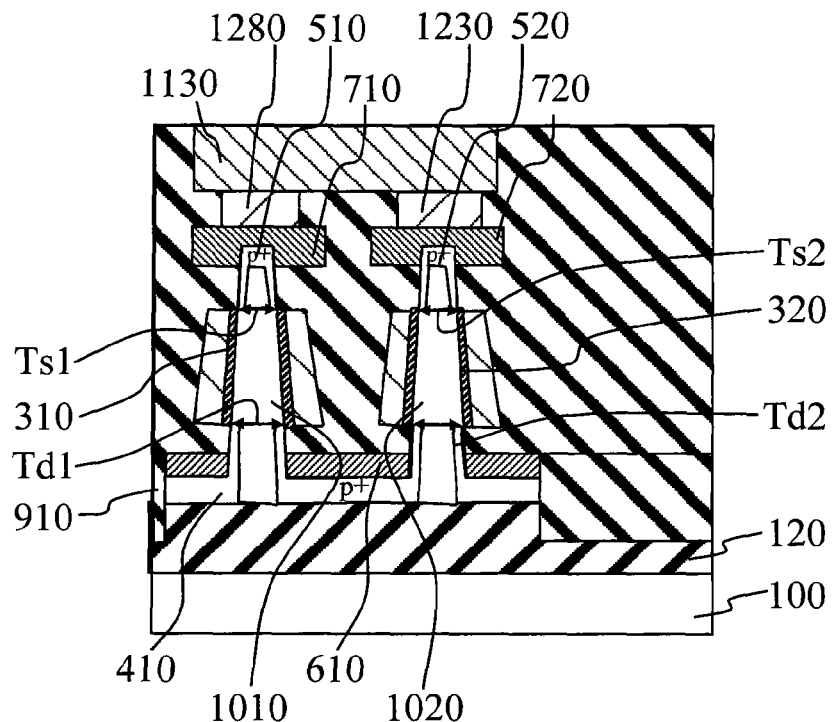
Figure 83:
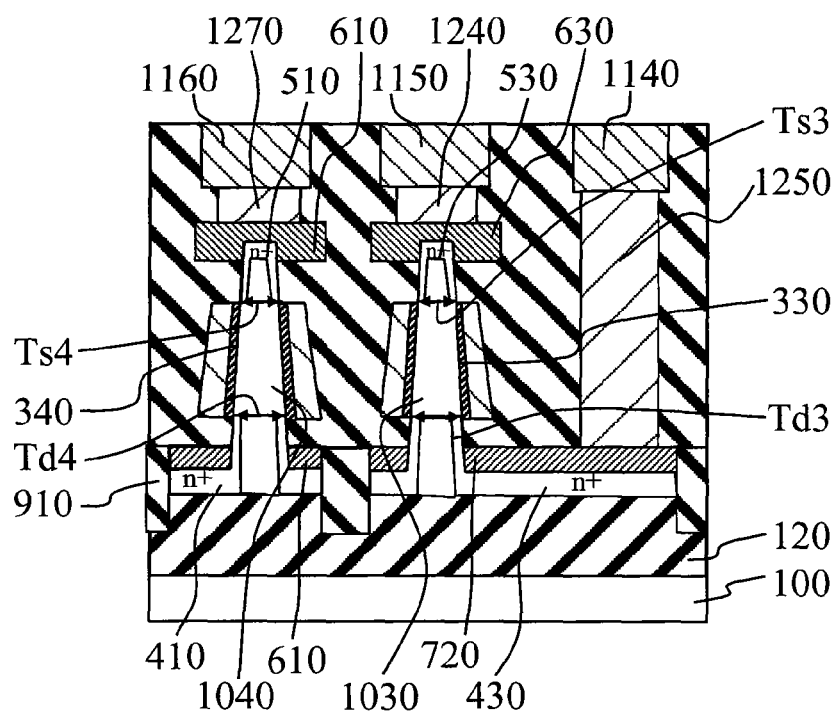
Figure 84:
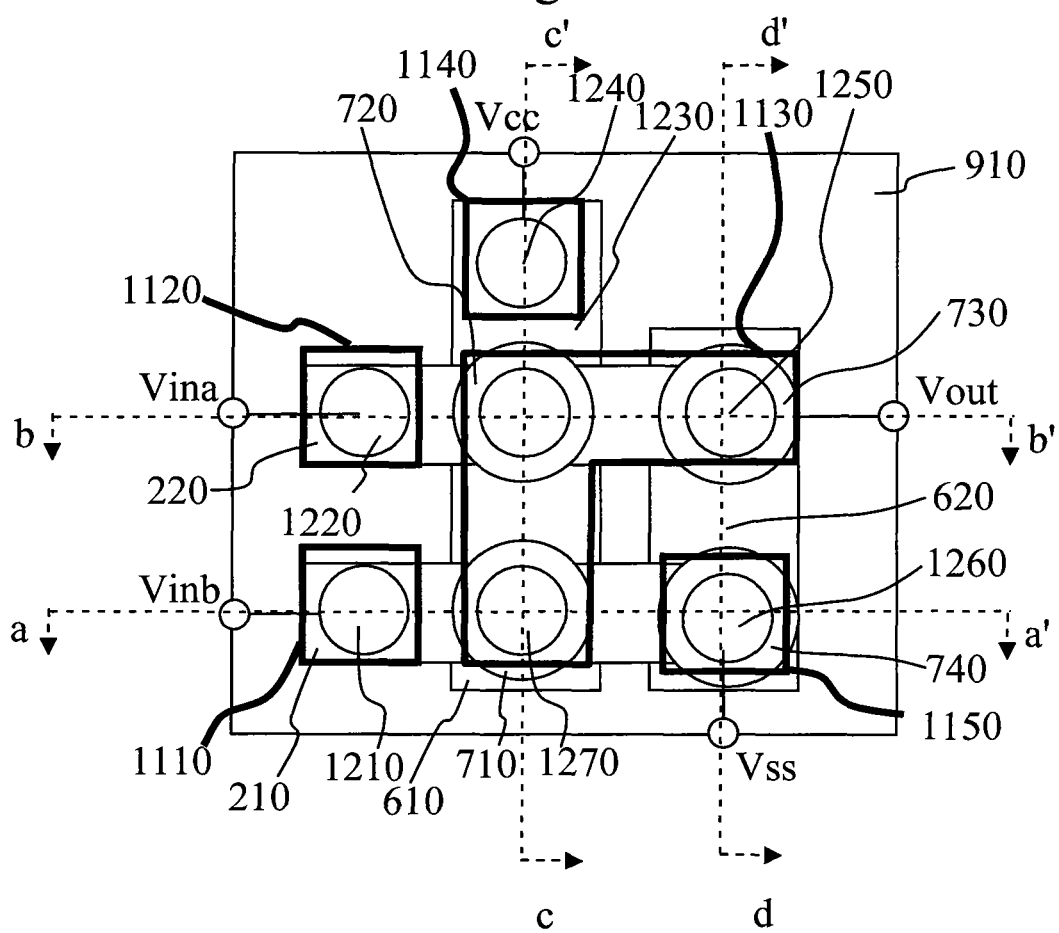
Figure 85:
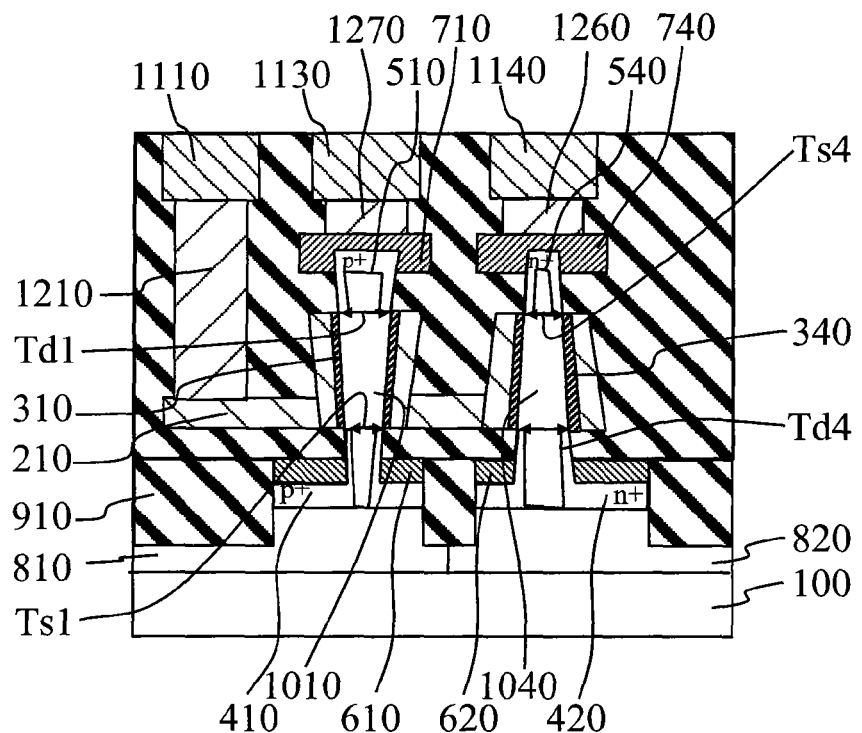
Figure 86:
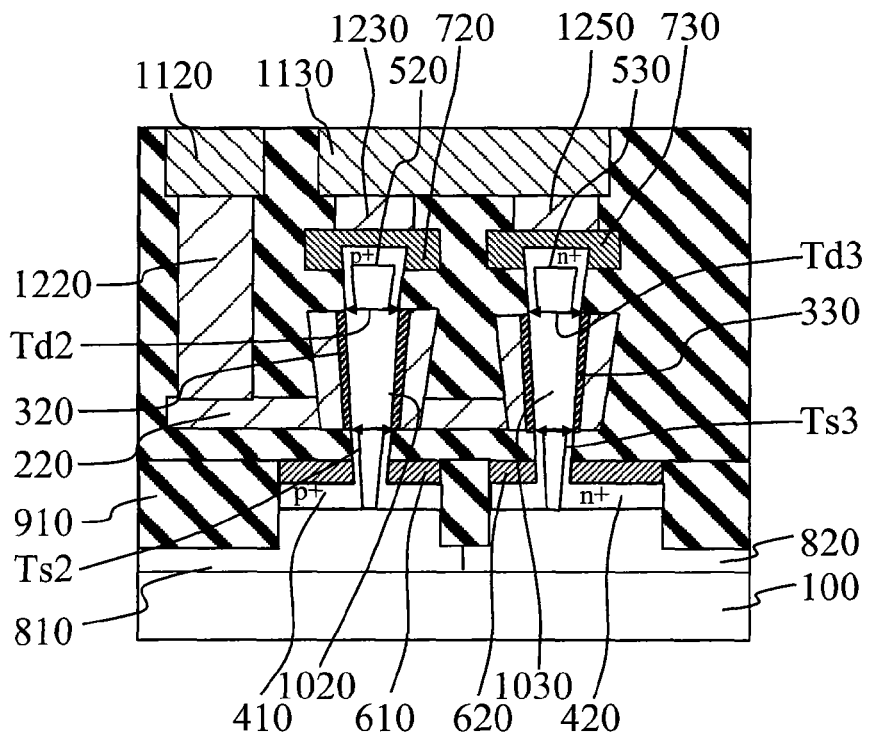
Figure 87:
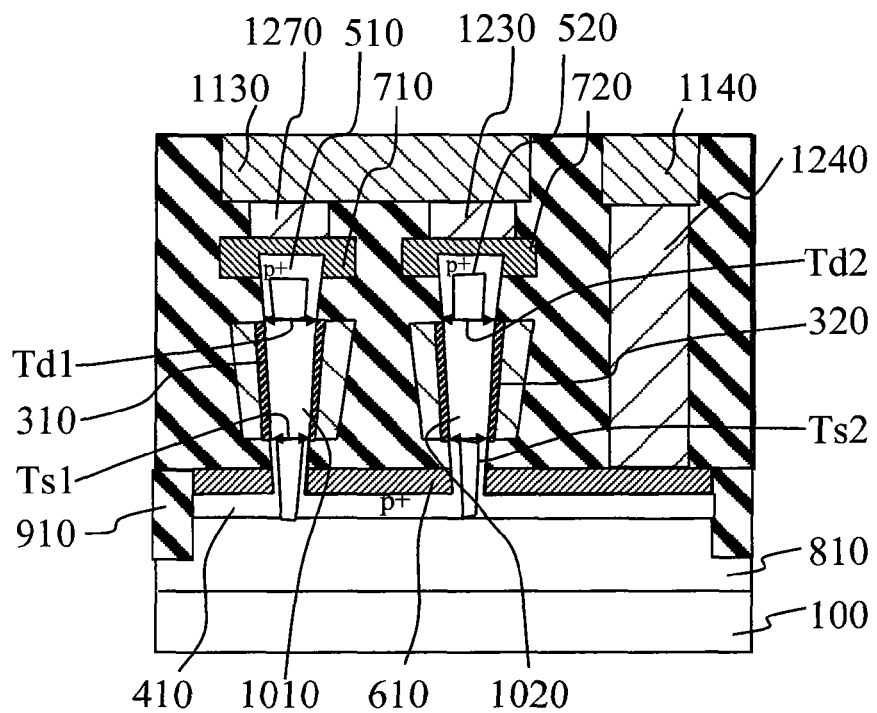
Figure 88:
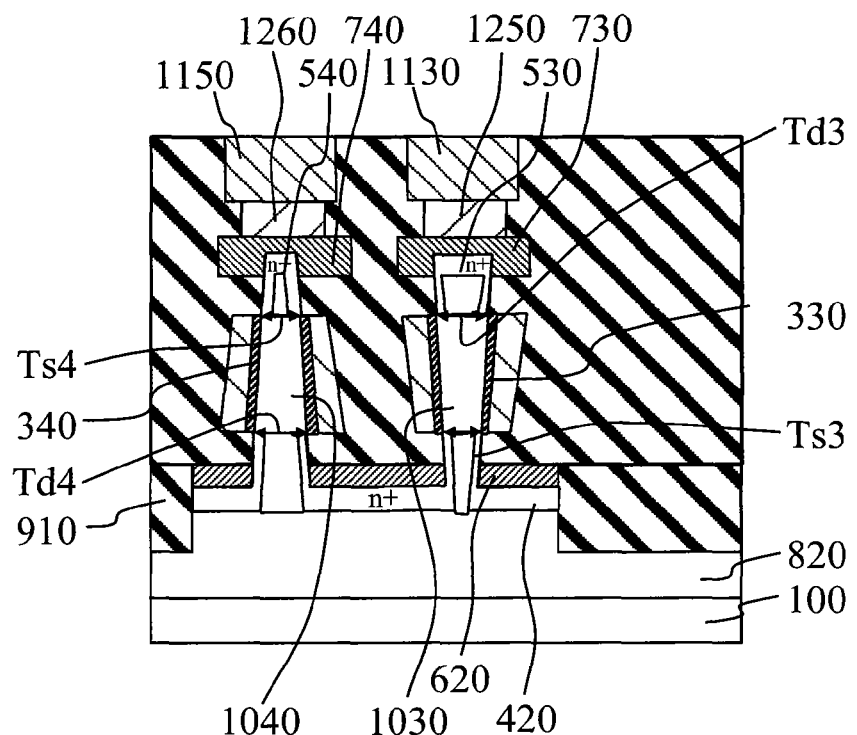
Figure 89:
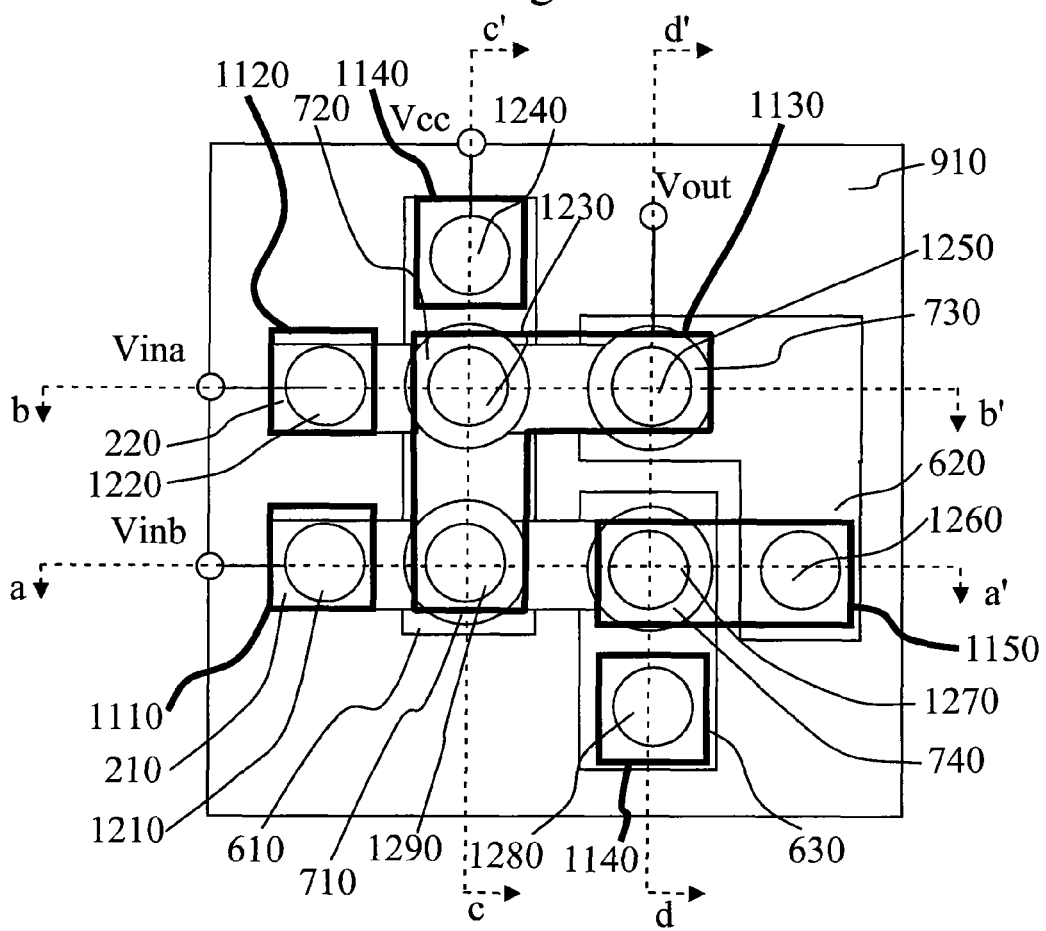
Figure 90:
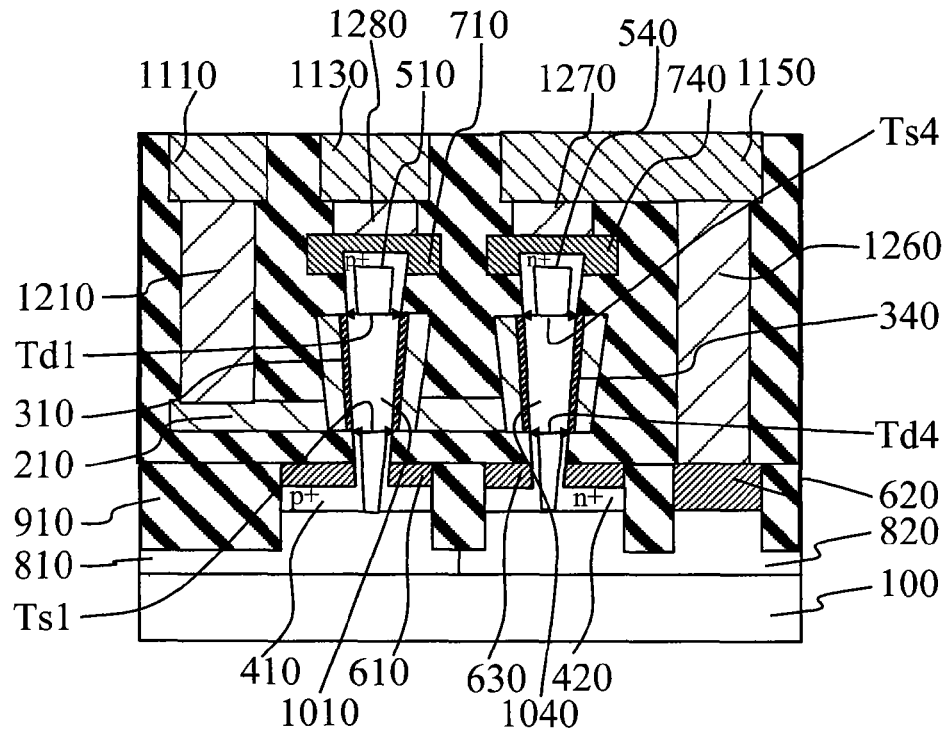
Figure 91:
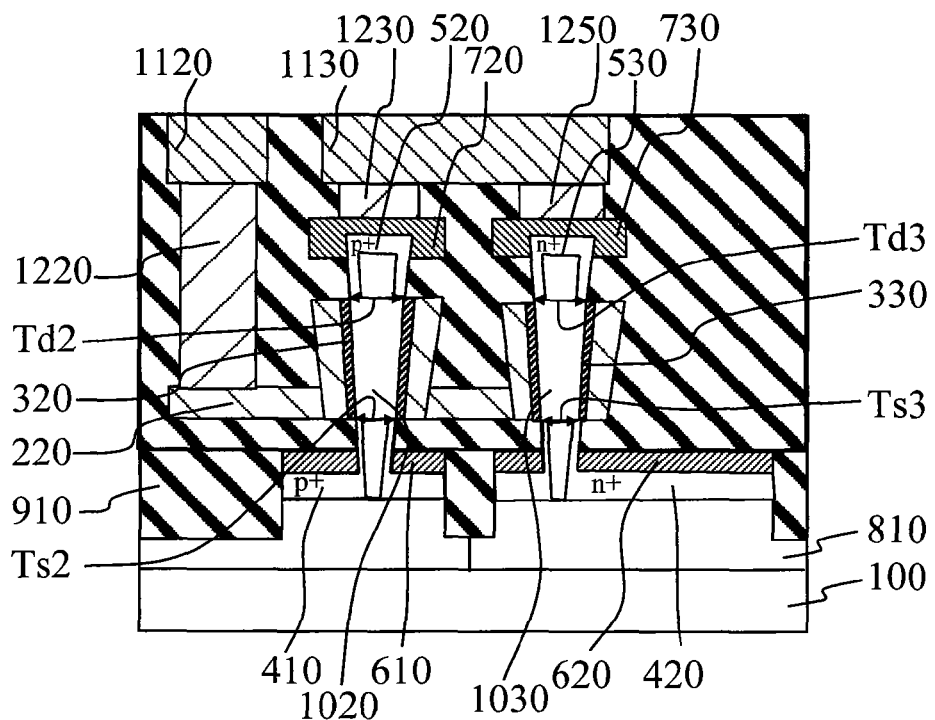
Figure 92:
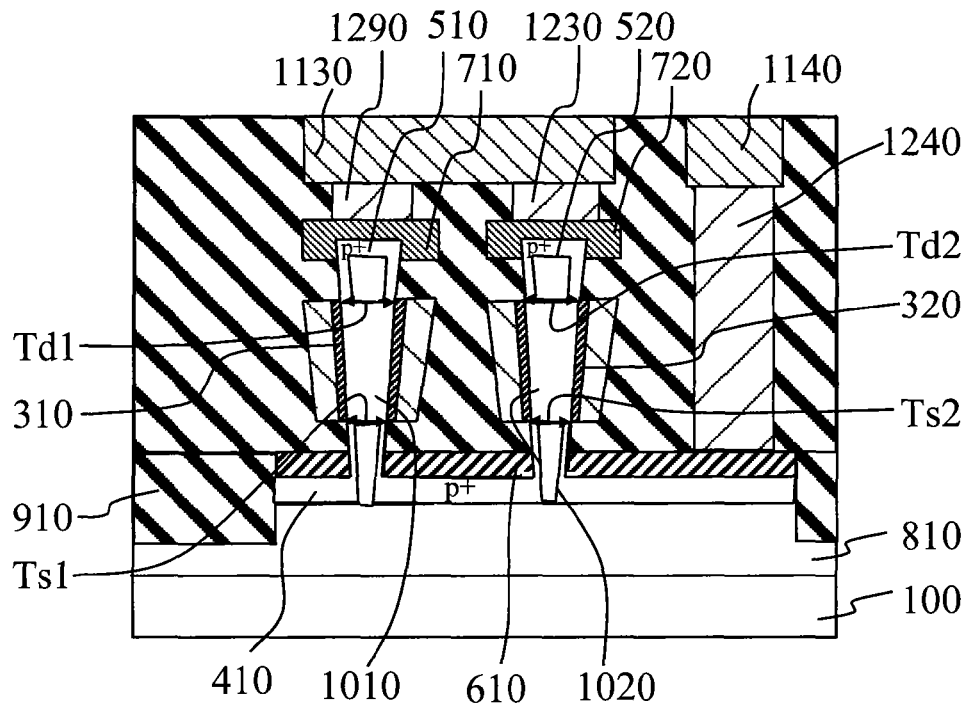
Figure 93:
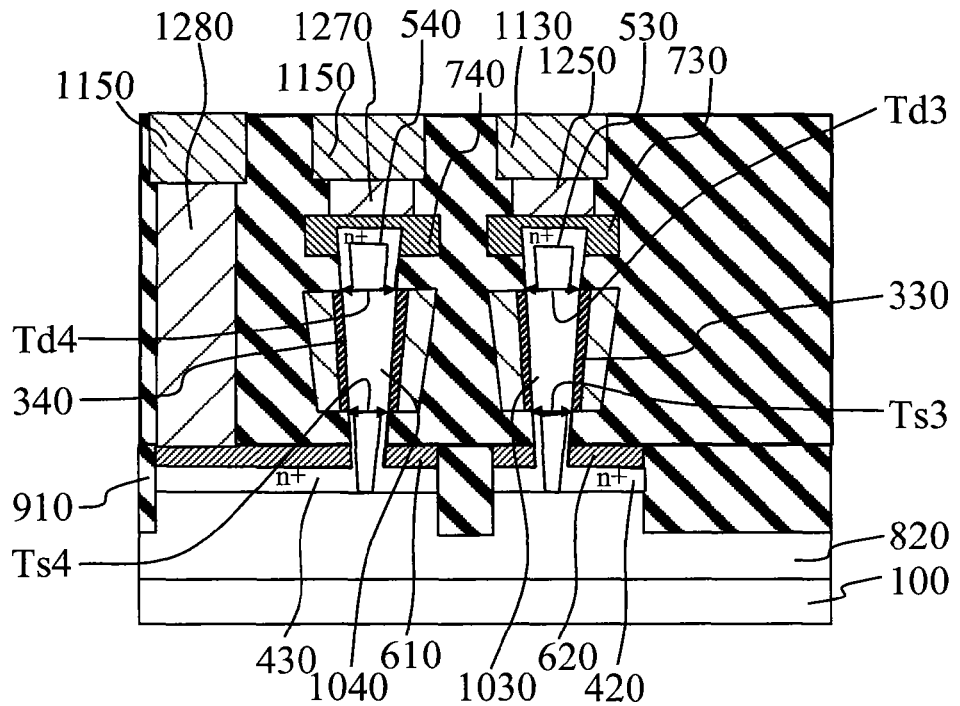
Figure 94:
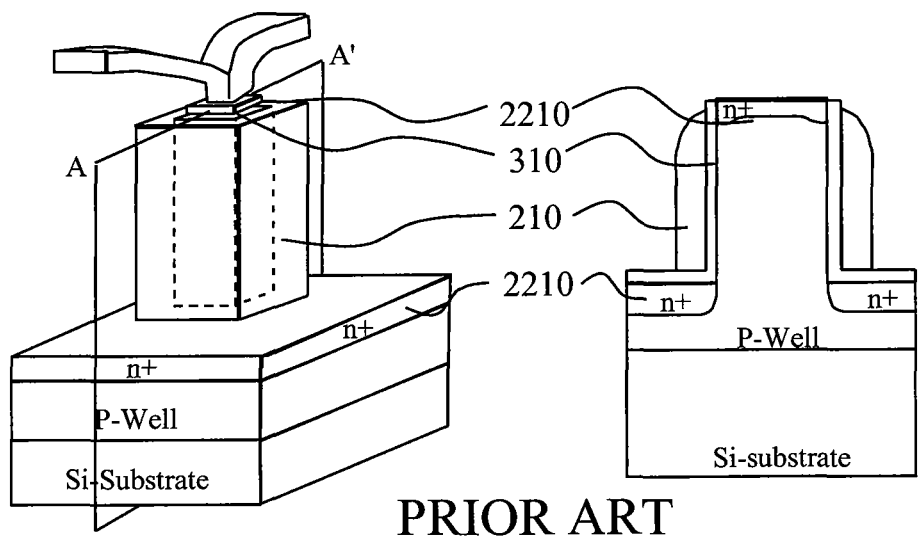
Figure 95:
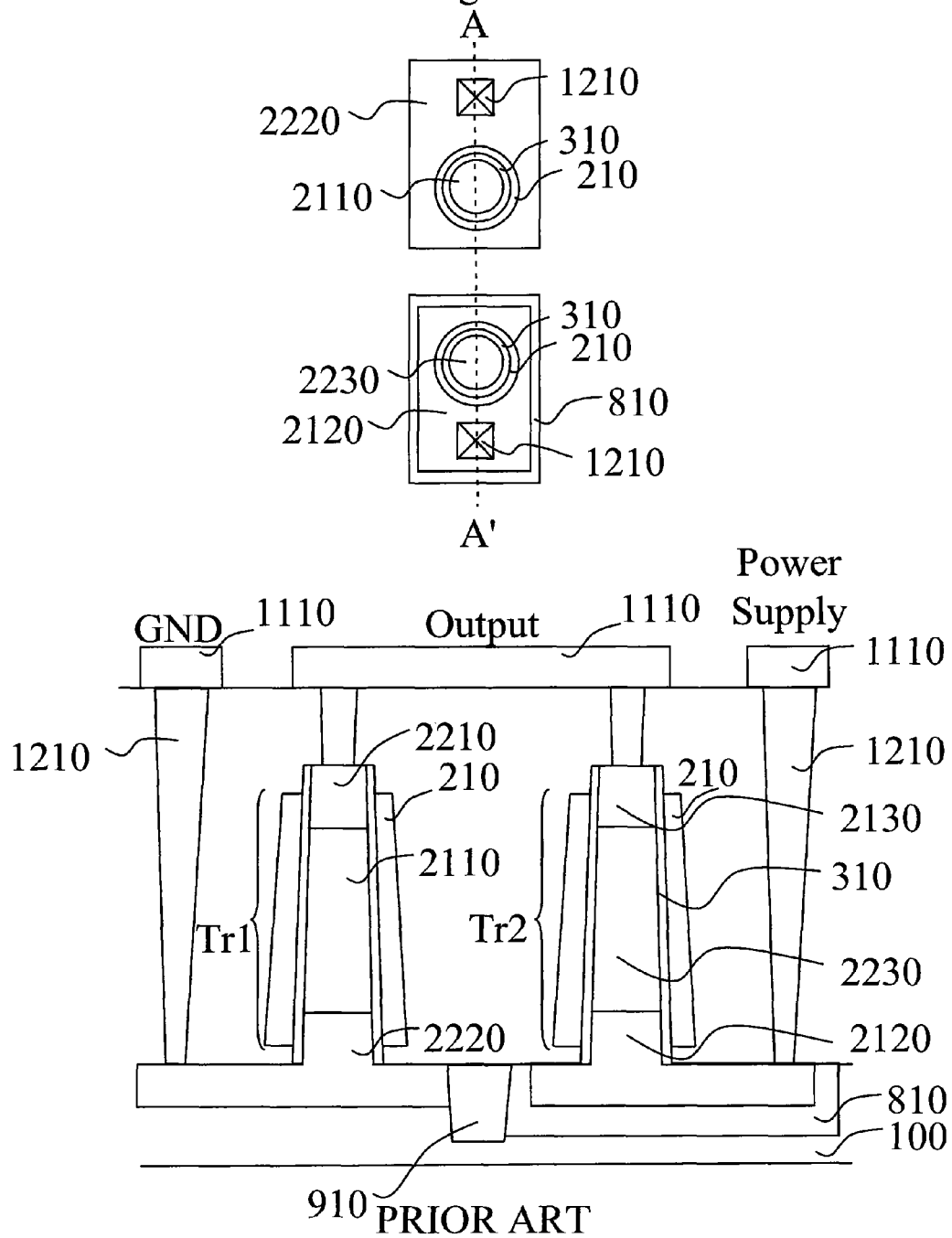
Figure 96:
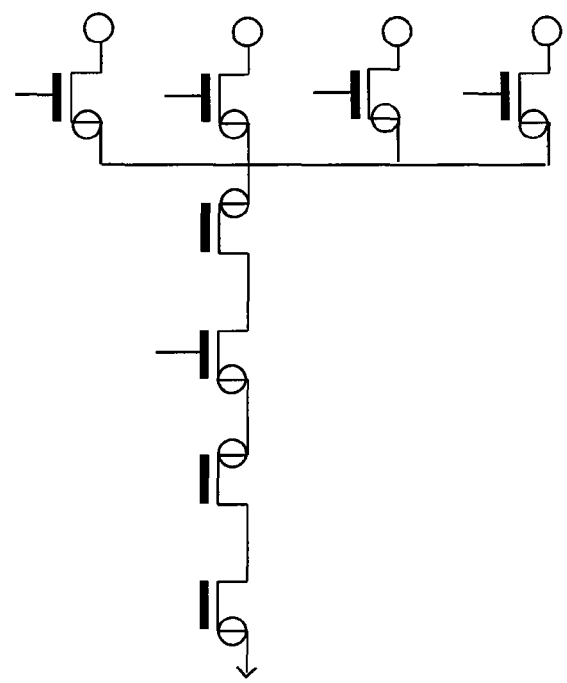
Figure 97:
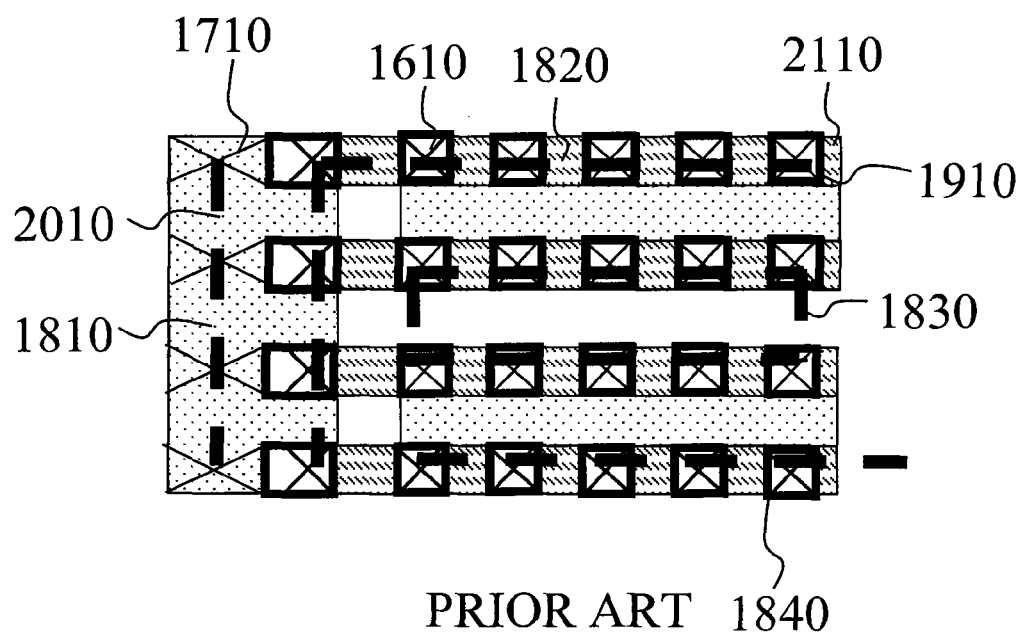

FIG. 63A is a top view showing an example of producing a semiconductor device according to a fifth embodiment of the present invention;

FIG. 63B is a cross-sectional view along line a-a' of the semiconductor device in FIG. 63A showing an example of producing a semiconductor device according to a fifth embodiment of the present invention;

FIG. 63C is a cross-sectional view along line b-b' of the semiconductor device in FIG. 63A showing an example of producing a semiconductor device according to a fifth embodiment of the present invention;

FIG. 64A is a top view showing an example of producing a semiconductor device according to a fifth embodiment of the present invention;

FIG. 64B is a cross-sectional view along line a-a' of the semiconductor device in FIG. 64A showing an example of producing a semiconductor device according to a fifth embodiment of the present invention;

FIG. 64C is a cross-sectional view along line b-b' of the semiconductor device in FIG. 64A showing an example of producing a semiconductor device according to a fifth embodiment of the present invention;

FIG. 65A is a top view showing an example of producing a semiconductor device according to a fifth embodiment of the present invention;

FIG. 65B is a cross-sectional view along line a-a' of the semiconductor device in FIG. 65A showing an example of producing a semiconductor device according to a fifth embodiment of the present invention;

FIG. 65C is a cross-sectional view along line b-b' of the semiconductor device in FIG. 65A showing an example of producing a semiconductor device according to a fifth embodiment of the present invention;

FIG. 66A is a top view showing an example of producing a semiconductor device according to a fifth embodiment of the present invention;

FIG. 66B is a cross-sectional view along line a-a' of the semiconductor device in FIG. 66A showing an example of producing a semiconductor device according to a fifth embodiment of the present invention;

FIG. 66C is a cross-sectional view along line b-b' of the semiconductor device in FIG. 66A showing an example of producing a semiconductor device according to a fifth embodiment of the present invention;

FIG. 67 is a planar drawing showing a transistor according to a sixth embodiment of the present invention;

FIG. 68 is a cross-sectional view along line a-a' of the semiconductor device in FIG. 67;

FIG. 69 is a cross-sectional view along line b-b' of the semiconductor device in FIG. 67;

FIG. 70 is a cross-sectional view along line c-c' of the semiconductor device in FIG. 67;

FIG. 71 is a cross-sectional view along line d-d' of the semiconductor device in FIG. 67;

FIG. 72 is an electric current-voltage drawing of a transistor concerning a first and sixth embodiment accomplished by means of model simulation analysis with the gate electric current (Id) plotted logarithmically;

FIG. 73 is an electric current-voltage drawing in which the electric current in FIG. 72 is plotted linearly;

FIG. 74 is a summary top view of a semiconductor device concerning a seventh embodiment of the present invention functioning as a NAND circuit;

FIG. 75 is the line a-a' of the semiconductor device in FIG. 74;

FIG. 76 is the line b-b' of the semiconductor device in FIG. 74;

FIG. 77 is the line c-c' of the semiconductor device in FIG. 74;

FIG. 78 is the line d-d' of the semiconductor device in FIG. 74;

FIG. 79 is a summary top view of a semiconductor device concerning an eighth embodiment of the present invention functioning as a NAND circuit;

FIG. 80 is the line a-a' of the semiconductor device in FIG. 79;

FIG. 81 is the line b-b' of the semiconductor device in FIG. 79;

FIG. 82 is the line c-c' of the semiconductor device in FIG. 79;

FIG. 83 is the line d-d' of the semiconductor device in FIG. 79;

FIG. 84 is a summary top view of a ninth embodiment of the present invention functioning as a NAND circuit;

FIG. 85 is the line a-a' of the semiconductor device in FIG. 84;

FIG. 86 is the line b-b' of the semiconductor device in FIG. 84;

FIG. 87 is the line c-c' of the semiconductor device in FIG. 84;

FIG. 88 is the line d-d' of the semiconductor device in FIG. 84;

FIG. 89 is a summary top view of a semiconductor device concerning a seventh embodiment functioning as a NAND circuit;

FIG. 90 is the line a-a' of the semiconductor device in FIG. 89;

FIG. 91 is the line b-b' of the semiconductor device in FIG. 89;

FIG. 92 is the line c-c' of the semiconductor device in FIG. 89;

FIG. 93 is the line d-d' of the semiconductor device in FIG. 89;

FIG. 94 is a bird's-eye view showing one example of a conventional SGT, and a cross-section along line A-A' therein;

FIG. 95 is a cross-sectional view showing one example of a conventional SGT;

FIG. 96 is a cross-sectional view showing one example of a conventional SGT; and FIG. 97 is a cross-sectional view showing one example of a conventional SGT.

DETAILED DESCRIPTION OF THE PREFERRED EMBODIMENTS

A detailed explanation of the semiconductor element and semiconductor device relating to the present invention is provided hereafter, with reference to the drawings.

First Embodiment

Semiconductor Element

An explanation will be provided first concerning the transistor relating to the first embodiment of the present invention. The transistor relating to the embodiment is an SGT of the pMOS type or the nMOS type.

Figure 1:
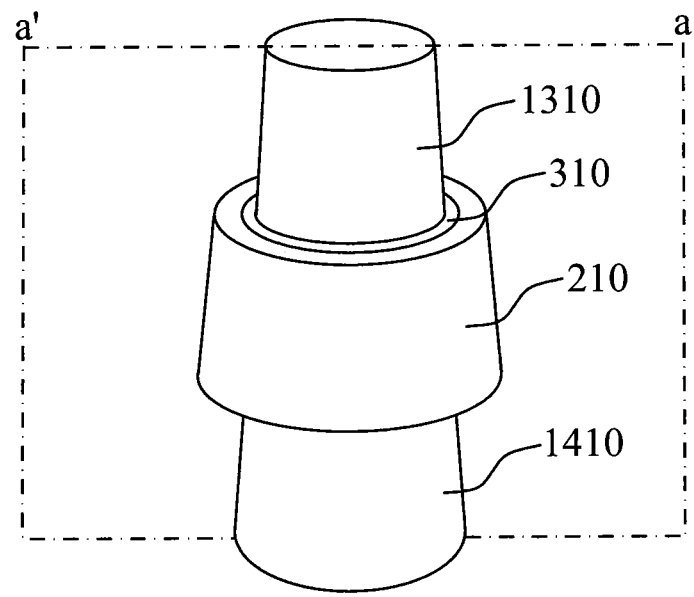
FIG. 1 is a planar drawing which shows the transistor relating to the first embodiment of the present invention.
Figure 2:
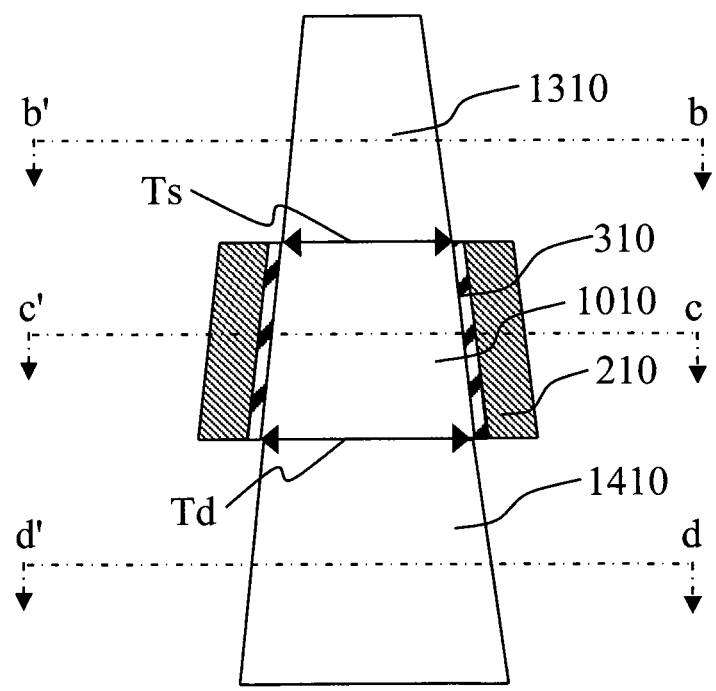
FIG. 2 is a cross-sectional view along line a-a' of the transistor in FIG. 1.
Figure 3:
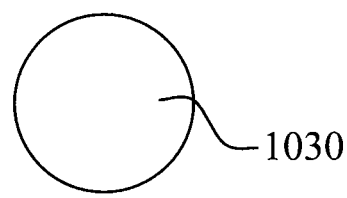
FIG. 3 is a cross-sectional view along line b-b' of the transistor in FIG. 2.
Figure 4:
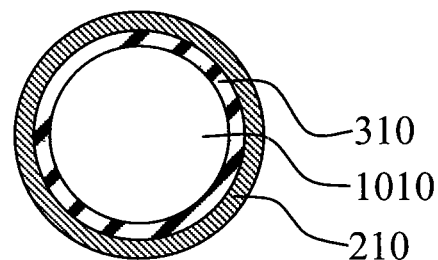
FIG. 4 is a cross-sectional view along line c-c' of the transistor in FIG. 2.
Figure 5:
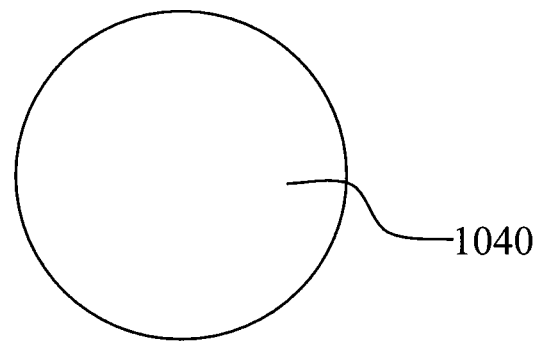
FIG. 5 is a cross-sectional view a long line d-d' of the transistor in FIG. 2.

FIG. 1 is a summary bird's eye view of the transistor relating to the first embodiment of the present invention. FIG. 2 is a simplified cross-sectional view along the vertical cut line a-a'. FIG. 3 is a simplified cross-sectional view along the horizontal cut line b-b' in the upper part of FIG. 2. FIG. 4 is a simplified cross-sectional view along the horizontal cut line c-c' in the center part of FIG. 2. FIG. 5 is a simplified cross-sectional view along the horizontal cut line d-d' in the lower part of FIG. 2.

The transistor relating to the first embodiment is provided with a silicon column 1010 comprising the high resistance region. Above the silicon column 1010 is arranged a silicon column 131; and below the silicon column 1010 is arranged silicon column 1410. The silicon column 1010, silicon column 1310 and silicon column 1410 are arranged as a complete circular truncated cone. In the embodiment, the silicon column 1310 functions as a source diffusion layer, and the silicon column 1410 functions as a drain diffusion layer respectively.

The silicon column 1310 and the silicon column 1410 are of the p type and n type, into which the impurities of arsenic and boron are introduced. The silicon column 1010 between the silicon column 1310 and a silicon column 1410 functions as a channel region. A first gate insulating film 310 is arranged so as to encompass the silicon column 1010. The first gate insulating film 310 is a high-k film, composed for example, of a silicon oxynitride film, a silicon nitride film, hafnium oxide, hafnium oxynitride, and lanthanum oxide, and the like. The gate electrode 210 is arranged so as to encompass the first gate insulating film 310. Gate electrode 210 is composed for example from titanium, titanium nitride, tantalum, tantalum nitride and tungsten, and the like.

In the present embodiment, during operation, a channel is formed in the silicon column 1010 by impressing voltage on the gate electrode 210.

The SGT relating to the present embodiment is an overall circular truncated cone. Owing to this, as shown in FIG. 2, its vertical cross-section is shaped like a trapezoid, and as shown in FIGS. 3-5 the horizontal cross-section is a circular shape. In the embodiment, the diameter Td of the contact surface between the silicon column 1010 and the silicon column 1410 comprising the drain diffusion layer is larger than the diameter Ts of the contact surface between the silicon column 1010 and the silicon column 1310 comprising the source of diffusion layer. By this means, as explained hereafter, the transistor ON/OFF current ratio relating to the present embodiment is relatively large.

Regarding a transistor composed where Ts<Td, the fact that the ON/OFF current ratio is greater than that of a transistor composed where Td<Ts is explained based on the analytical results of model simulation. In order to examine the ON/OFF current ratio of a trapezoid cross-section transistor flow, two types of transistor models were designed and simulation testing performed. Each of the two types of transistors used in the tests had, in common, a metal gate in which, the gate length (L) is 100 nm, the work function is 4.3 eV, the film thickness of the gate insulating film is 2 nm, the height of the silicon column which functions as a channel region is 100 nm and the impurity concentration of its P type impurity region is $10^{15}$ (/cm$^3$) (for a summary form reference is made to FIG. 1).

In the transistor composed where Ts<Td, Td is 100 nm and Ts is 80 nm. In the transistor composed where Td<Ts, Td is 80 nm and Ts is 100 nm. The silicon column functioning as a source region with the height of 100 nm and the silicon column functioning as a drain region with the height of 100 nm are truncated cone-shaped as the silicon column functioning as the channel region (for a summary form reference is made to FIG. 1). In addition, the impurity concentration of the N-type impurity region of these columns is $10^{20}$ (/cm$^3$).

Using the above structure, the drain flow voltage dependency was calculated by solving the Poisson equation and the drift diffusion transport equation. In addition, consideration was also given to the Boltzmann carrier statistical model, the Shockley lead whole recombination model and the Darwish CVT mobility model.

Figure 6:
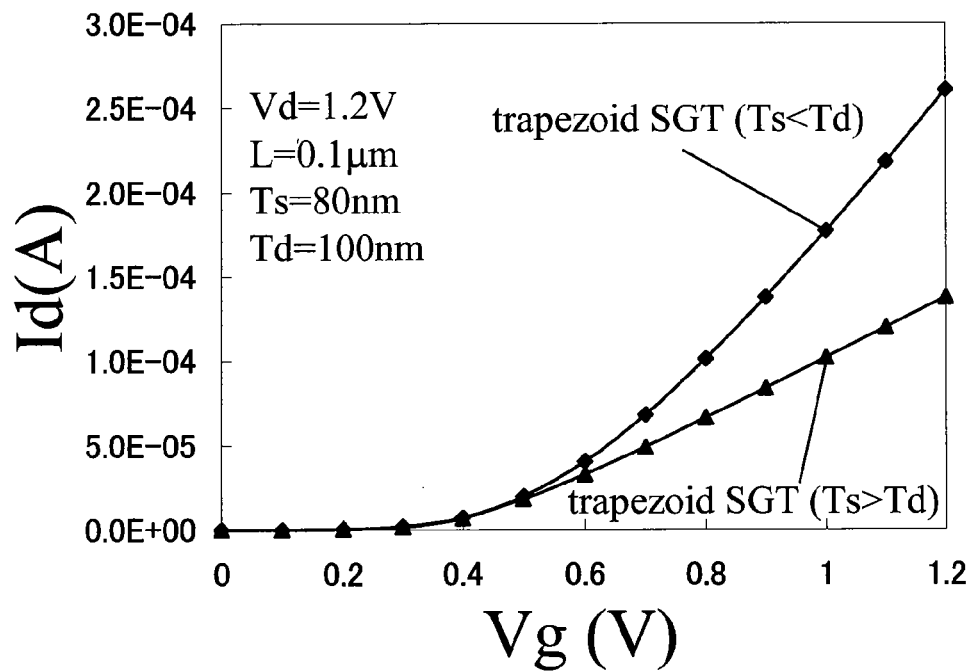
FIG. 6 is an electric current-voltage drawing of the transistor relating to the first embodiment of the present invention accomplished by model simulation analysis.
Figure 7:
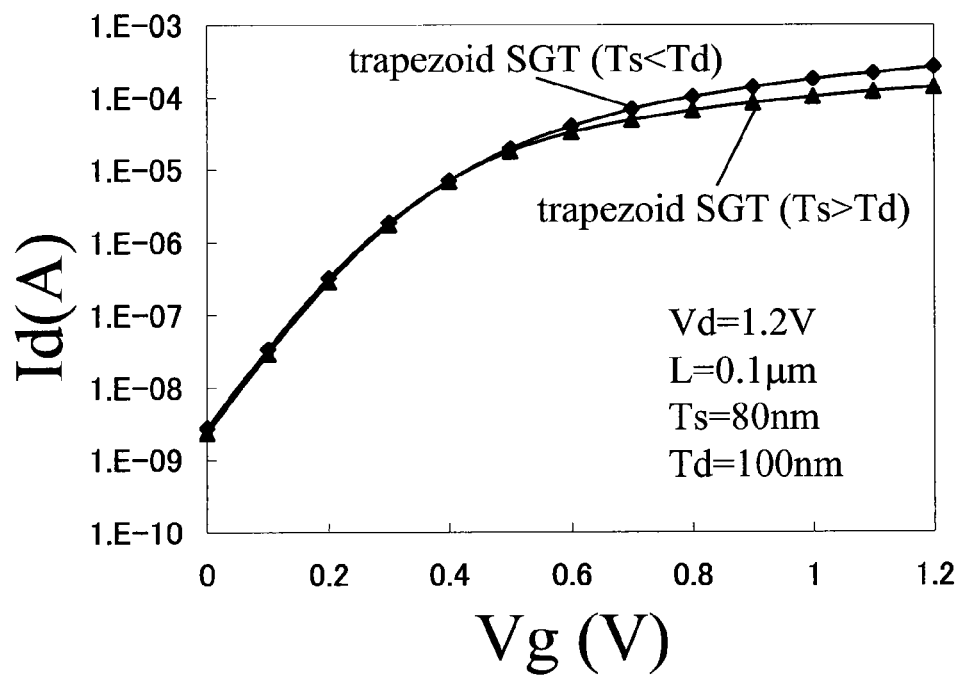
FIG. 7 is an electric current-voltage drawing in which the electric current in FIG. 6 is logarithmically plotted.

FIG. 6 is a block diagram of the drain current (Id) of the simulation results using these transistor models and the gate voltage (Vg). In addition, FIG. 7 is a drawing which plot the simulation results of FIG. 6 and the drain current (Id) using logarithms, and shows a magnification of the drain current (Id). With this experiment, the ON current is equal to the drain current (Id) when the drain voltage (Vd) and the gate voltage (Vg) is 1.2 V, and the OFF leakage current is equal to the drain current (Id) when the gate voltage (Vg) is OV. As shown in FIG. 6, the ON current of a transistor composed where Td<Ts is greater than the ON current composed where Ts<Td. In addition, as shown in FIG. 6 and FIG. 7, the OFF leakage current of the transistor composed where Td<Ts is substantially the same as the OFF leakage current of a transistor composed where Ts<Td. From these results, for a transistor composed where Ts<Td, in comparison with a transistor composed where Td<Ts, it is understood that the ON current is great where the OFF leakage current does not change.

As indicated above, the transistor relating to the present embodiment shows a relatively large ON current with the above structure in which Ts<Td. Owing to this, the transistor is capable of high speed operation.

Second Embodiment

Semiconductor Device

Figure 8:
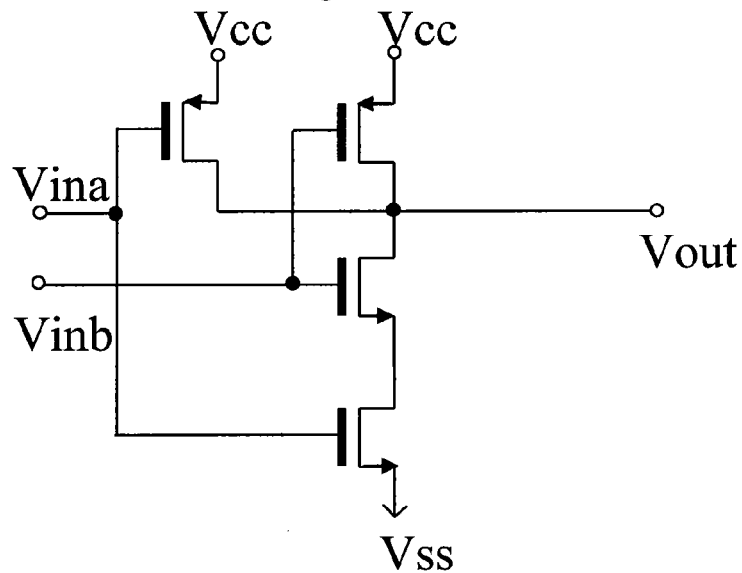
FIG. 8 is a drawing of a NAND circuit.

The first embodiment explained only a single semiconductor element. However, with the second embodiment, an explanation is provided of the example of a semiconductor device composed of multiple units of the semiconductor elements relating to the first embodiment. The semiconductor device relating to the second embodiment functions as a NAND circuit. An electronic circuit diagram of a NAND circuit is shown in FIG. 8. Moreover, the NAND circuit shows nothing more than an example of an electronic circuit. Other circuits are also capable of creating high-speed operation through the use of the transistor relating to the first embodiment.

Figure 9:
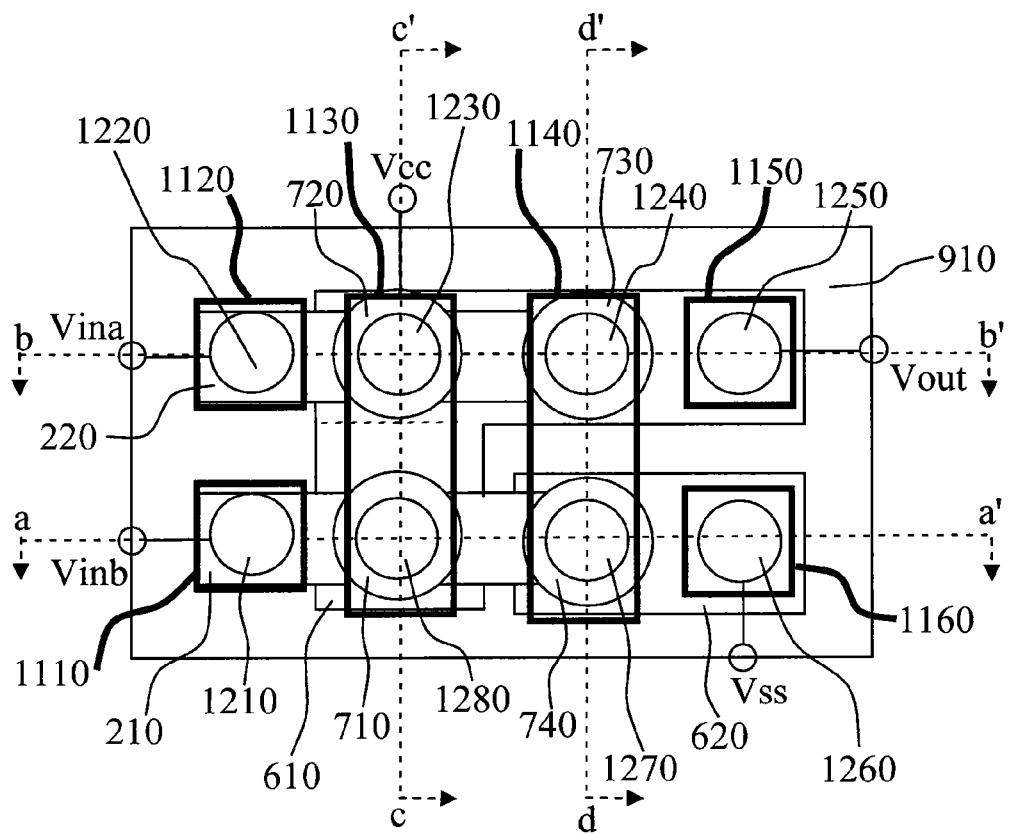
FIG. 9 is a summary top view of the semiconductor device relating to the second embodiment of the present invention which functions as a NAND circuit.
Figure 10:
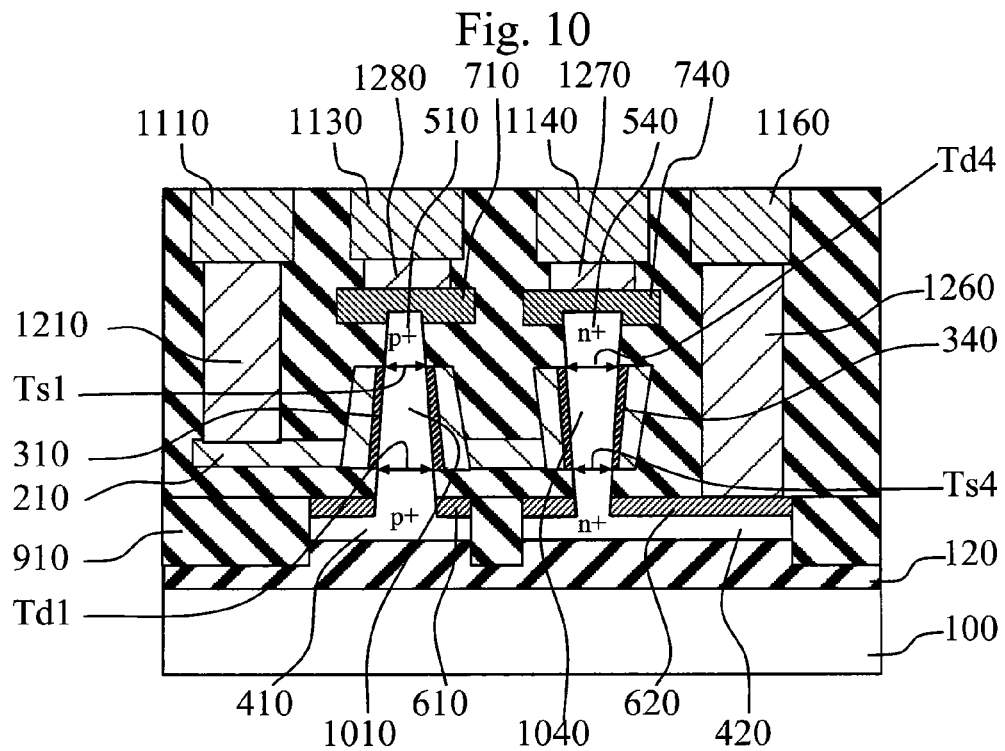
FIG. 10 is a cross-sectional view along the line a-a' of the semiconductor device in FIG. 9.
Figure 11:
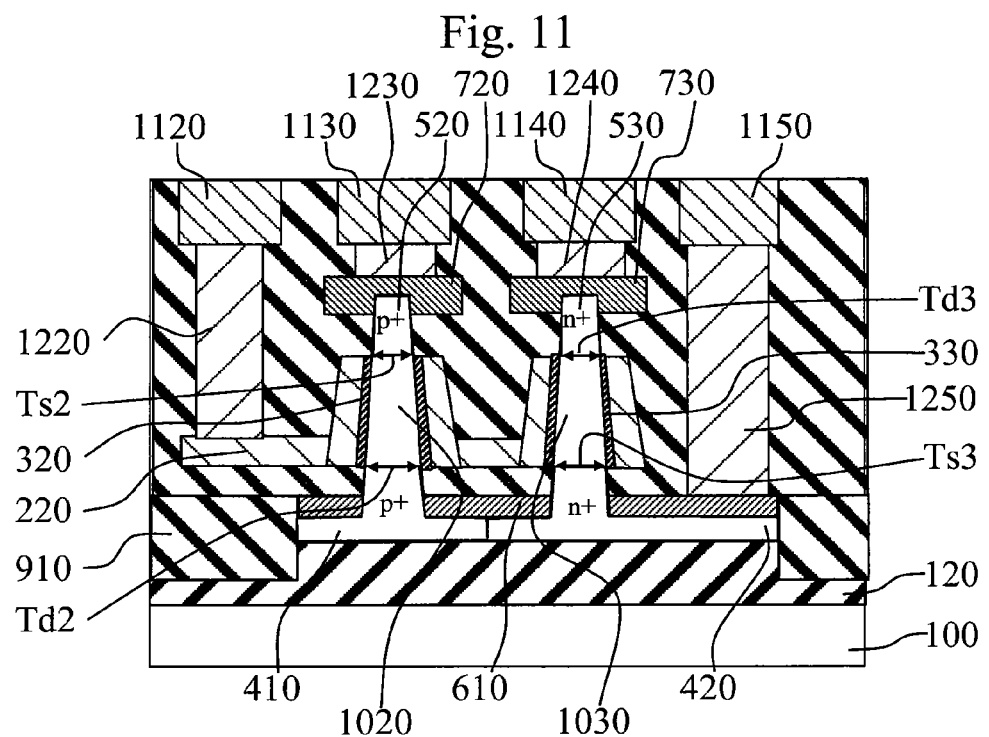
FIG. 11 is a cross-sectional view along the line b-b' of the semiconductor device in FIG. 9.
Figure 12:
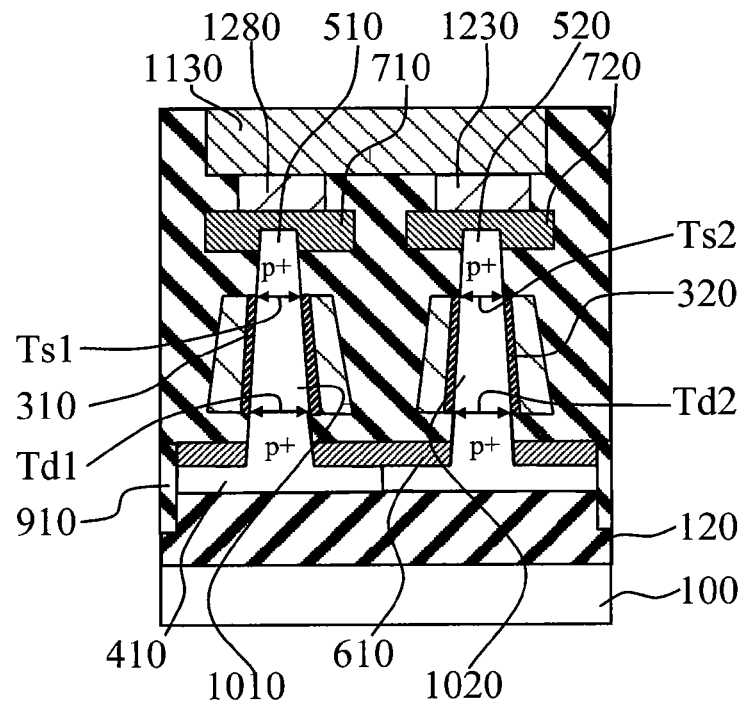
FIG. 12 is a cross-sectional view along line c-c' of the semiconductor device in FIG. 9.
Figure 13:
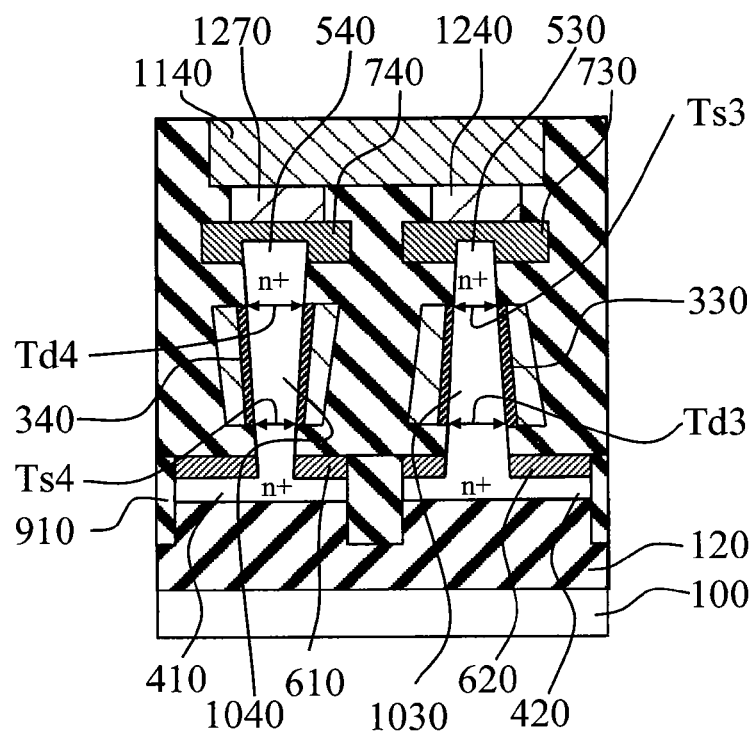
FIG. 13 is a cross-sectional view along line d-d' of the semiconductor device in FIG. 9.

FIG. 9 is a summary top view of a semiconductor device relating to the second embodiment of the present invention. FIG. 10 is a simplified cross-sectional view along the cut line a-a' in FIG. 9. FIG. 11 is a simplified cross-sectional view along the cut line b-b' in FIG. 9. FIG. 12 is a simplified cross-sectional view along the cut line c-c' in FIG. 9. FIG. 13 is a simplified cross-sectional view along the cut line d-d' in FIG. 9.

As shown in FIG. 9, the semiconductor device relating to the present embodiment is composed from an SGT relating to four first embodiments arranged in two rows and two columns. The width of each SGT channel is equal to the perimeter length of the silicon column. With the present embodiment, since the size of each SGT silicon column is equal, the width of each SGT channel is also equal.

In order to accomplish circuit optimization, in the case of increasing the SGT channel width by increasing the diameter of the silicon column, since there will also be an accompanying current leakage, which leads to concern of an increase in the amount of power consumed by the circuit, or to the operational deficiency of the circuit. Therefore, in the present embodiment, in the case of increasing some SGT channel width, it would be desirable to connect in parallel multiple SGT units having the same diameter silicon column as the SGT silicon column, mutually to the gates, drain region and source region. By this means, the channel width can be increased and the circuit optimized without increasing the amount of current leakage. This method for obtaining increased channel width by connecting the SGT in parallel is not limited to NAND circuits, but may be applied to all other circuits as well.

The first SGT arranged in a 1st row 1st column is provided with a silicon column 1010 comprising the high resistance region. The silicon column 1010 forms the ordered taper of a circular truncated cone. The first insulating body 310 is arranged on an upper side surface of the silicon column 1010 so as to encompass the silicon column 1010. A gate electrode 210 is arranged on a side surface of the first insulating body 310 so as to encompass the first insulating body 310. On the lower part of the silicon column 1010 is arranged a p+ high-density impurity region 410 (drain region), and on the upper part, is arranged a p+ high density impurity region 510, respectively. The p+ high-density impurity region 410 (drain region) is arranged on an oxide film 120 formed above a semiconductor substrate 100. On the upper part of the p+ high-density impurity region 410, is formed a silicide region 610, and on the upper part of the p+ high-density impurity region 510 is formed a silicide region 710, respectively. On the silicide region 710 is arranged a contact 1280.

With the first SGT, the diameter Ts1 of the contact cross-sectional surface between the silicon column 1010 and the p+ high-density impurity region 510 is smaller than the diameter Td1 of the contact cross-sectional surface between the silicon column 1010 and the p+ high-density impurity region 410.

The second SGT arranged in the 2nd row 1st column is provided with a silicon column 1020 comprising a high resistance region. Overall, the silicon column 1020 has an ordered tapered circular truncated cone. In order to encompass the silicon column 1020, a first insulating body 320 is arranged on a side surface of the silicon column 1020. In order to encompass the first insulating body 320, a gate electrode 220 is arranged on the side surface of the first insulating body 320. On the lower part of the silicon column 1020 is arranged a p+ high-density impurity region 410 (drain region), and on the upper part is arranged a p+ high-density impurity region 520 (source region), respectively. The p+ high-density impurity region 410 (drain region) is arranged on the oxide film 120 formed on the semiconductor substrate 100. On the upper part of the p+ high-density impurity region 420 is formed a silicide region 610, and on the upper part of the p+ high-density impurity region 520, a silicide region 720, respectively.

On the silicide region 720 is arranged a contact 1230. On the contact 1230 is arranged metal wiring 1130. The metal wiring 1130 is connected to a first SGT contact and an electric source potential Vcc.

With the second SGT, the diameter Ts2 of the contact cross-sectional surface between the silicon column 1020 and the p+ high-density impurity region 520 is smaller than the diameter Td2 of the contact cross-sectional surface between the silicon column 1020 and the p+ high-density impurity region 410.

The third SGT arranged in the 2nd row 2nd column is provided with a silicon column 1030 comprising a high resistance region. The silicon column 1030 forms an overall ordered tapered circular truncated cone. In order to encompass the silicon column 1030, a first insulating body 330 is arranged on the side surface of the silicon column 1030. In order to compass the first insulating body 330, a gate electrode 220 is arranged on the side surface of the first insulating body 330. On the lower part of the silicon column 1030 is arranged an n+ high-density impurity region 420 (drain region), and on the upper part is arranged an n+ high-density impurity region 530 (source region), respectively. The n+ high density impurity region 420 (drain region) is arranged on the oxide film 120 formed on the semiconductor substrate 100. On the upper part of the n+ high-density impurity region 420 is formed a silicide region 610, and on the upper part of the n+ high-density impurity region 530 is formed a silicide region 730, respectively. On the silicide region 730, is arranged a contact 1240.

With the third SGT, the diameter Ts3 of the contact cross-sectional surface of the silicon column 1030 and the n+ high density impurity region 530 is smaller than the diameter Td3 of the contact surface between the silicon column 1030 and the n+ high density impurity region 410.

The fourth SGT arranged in the 1st row 2nd column is provided with a silicon column 1040 comprising a high resistance region. The silicon column 1040 forms an overall reverse taper circular truncated cone. In order to encompass the silicon column 1040 the first insulating body 340 is arranged on the side surface of the silicon column 1040. In order to encompass the first insulating body 340, a gate electrode 210 is arranged on the side surface of the first insulating body 340. On the lower part of the silicon column 1040 is arranged an n+ high-density impurity region 420 (source region), and on the upper part is arranged an n+ high-density impurity region 540 (drain region), respectively. The n+ high-density impurity region 420 is arranged on the oxide film 120 formed on the semiconductor substrate 100. On the upper part of the n+ high-density impurity region 420 is formed a silicide region 620, and on the upper part of the n+ high-density impurity region 540 is formed a silicide region 740, respectively. On the silicide region 740 is arranged a contact 1270. On the contact 1270 is arranged metal wiring 1140. The metal wiring 1140 is connected to the third SGT contact 1240.

With the fourth SGT, the diameter Ts4 of the contact cross-sectional surface of the silicon column 1040 and the n+ high density impurity region 420 is smaller than the diameter Td4 of the contact surface between the silicon column 1040 and the n+ high density impurity region 540.

In addition, on the first SGT gate 210 is arranged a contact 1210. On the contact 1210, is arranged metal wiring 1110. Metal wiring 1110 is connected to input electric potential Vinb. On the gate 220 of the second SGT is arranged a contact 1220. On the contact 1220 is arranged metal wiring 1120. Metal wiring 1120 is connected to input electric potential Vina. On the third SGT n+ high-density impurity region 420 is arranged a contact 1250. On the contact 1250 is arranged metal wiring 1150. The metal wiring 1150 is connected to output electric potential Vout. On the fourth SGT n+ high-density impurity region 420 is arranged a contact 1260. On the contact 1260 is arranged metal wiring 1160. Metal wiring 1160 is connected to ground potential Vss. The silicide region 610 formed on the first SGT p+ high-density impurity region 410 is connected to the second SGT p+ high-density impurity region 410 and the third SGT n+ high-density impurity region 420. In addition, on the side surface of the p+ high-density region 410 and the n+ high-density impurity region 420 is formed an element isolation insulating film 910.

With the present embodiment, all of the transistors composing the electronic circuit have the same structure as the transistors relating to the first embodiment, and since it is high-speed operation capable, the semiconductor device relating to the present embodiment is also capable of high-speed operation.

Figure 14A:
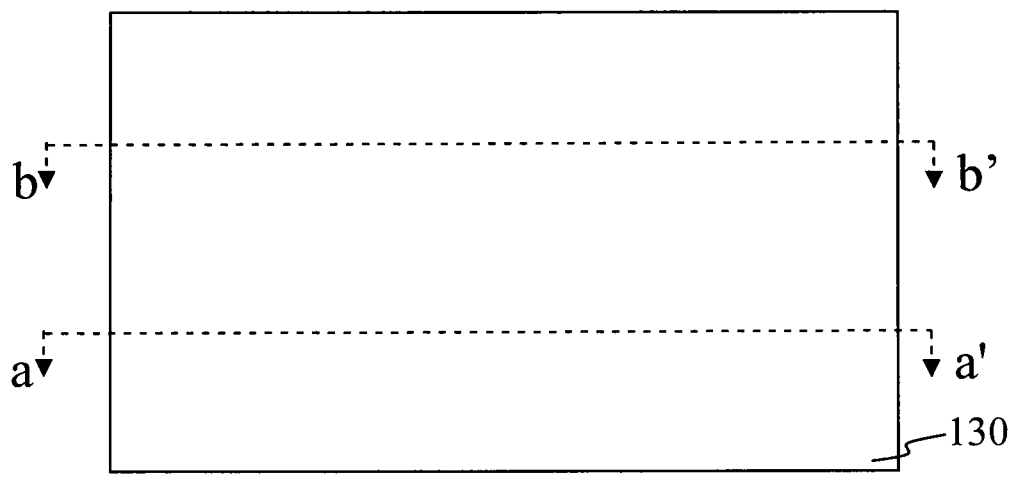
FIG. 14A is a top view showing an example of producing a semiconductor device according to a second embodiment of the present invention.
Figure 24A:
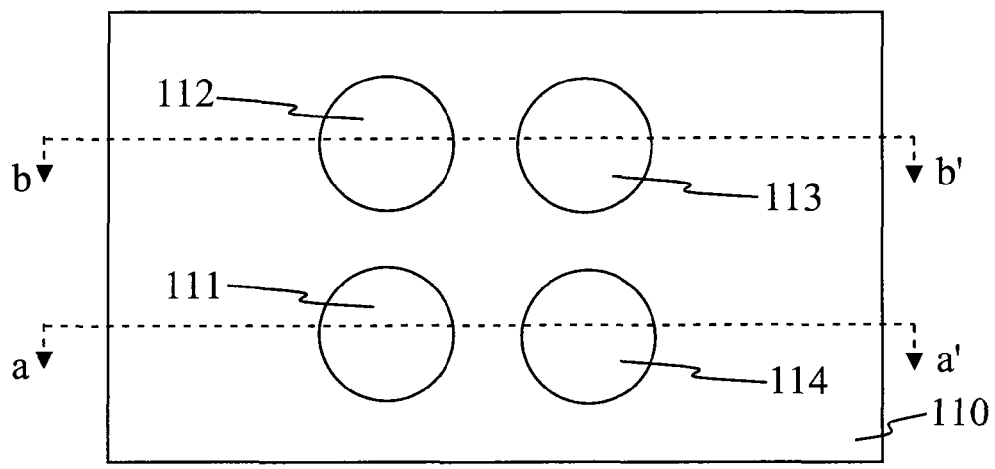
FIG. 24A is a top view showing an example of producing a semiconductor device according to a second embodiment of the present invention.
Figure 24B:
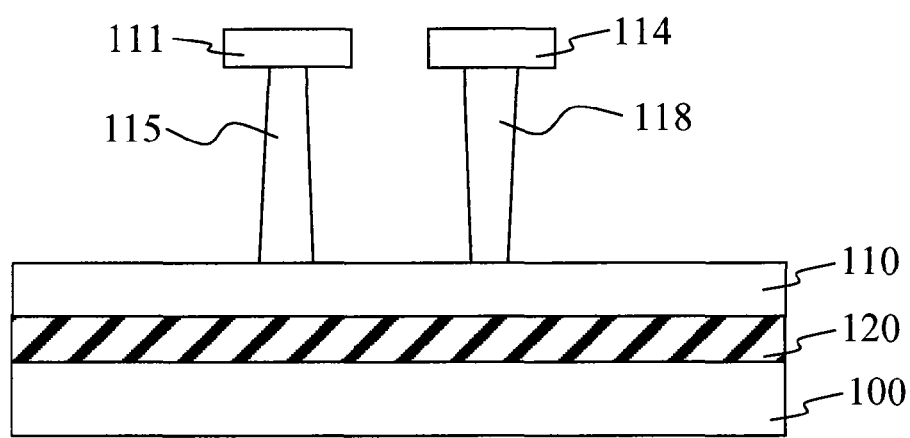
FIG. 24B is a cross-sectional view along line a-a' of the semiconductor device in FIG. 24A showing an example of producing a semiconductor device according to a second embodiment of the present invention.
Figure 24C:
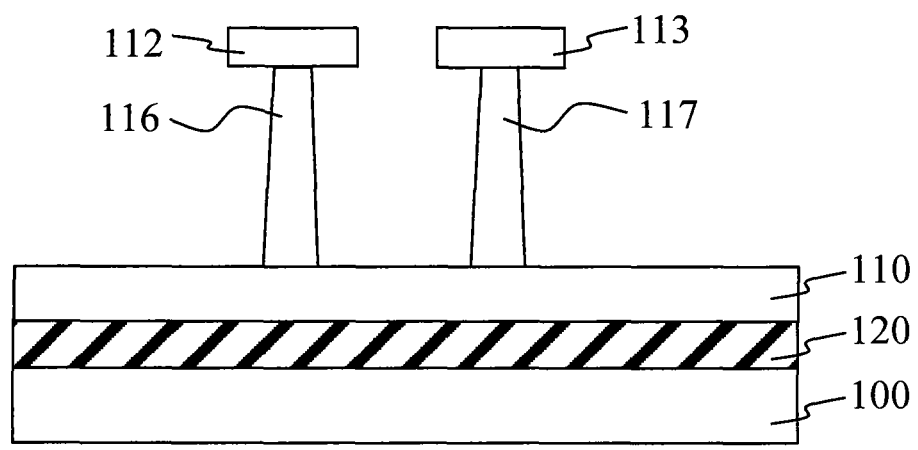
FIG. 24C is a cross-sectional view along line b-b' of the semiconductor device in FIG. 24A showing an example of producing a semiconductor device according to a second embodiment of the present invention.
Figure 25A:
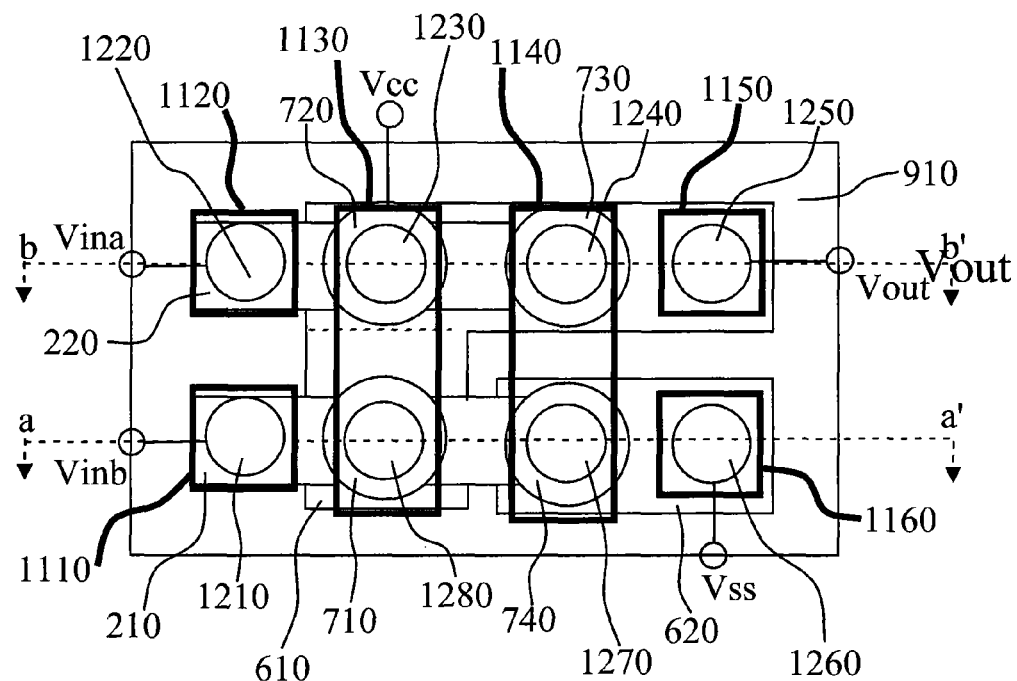
FIG. 25A is a top view showing an example of producing a semiconductor device according to a second embodiment of the present invention.
Figure 25B:
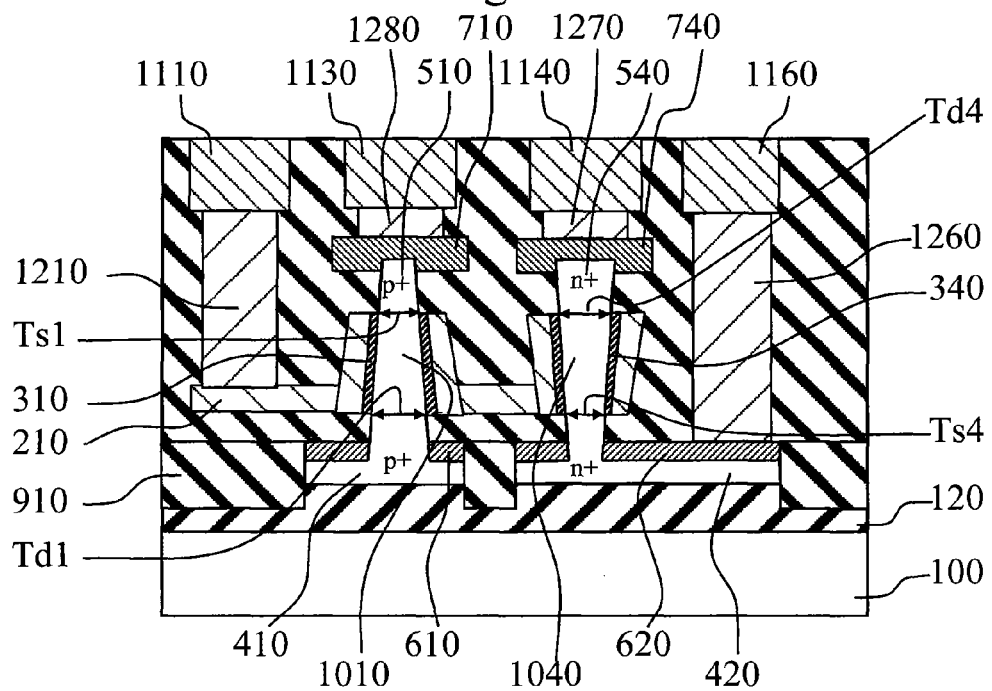
FIG. 25B is a cross-sectional view along line a-a' of the semiconductor device in FIG. 25A showing an example of producing a semiconductor device according to a second embodiment of the present invention.
Figure 25C:
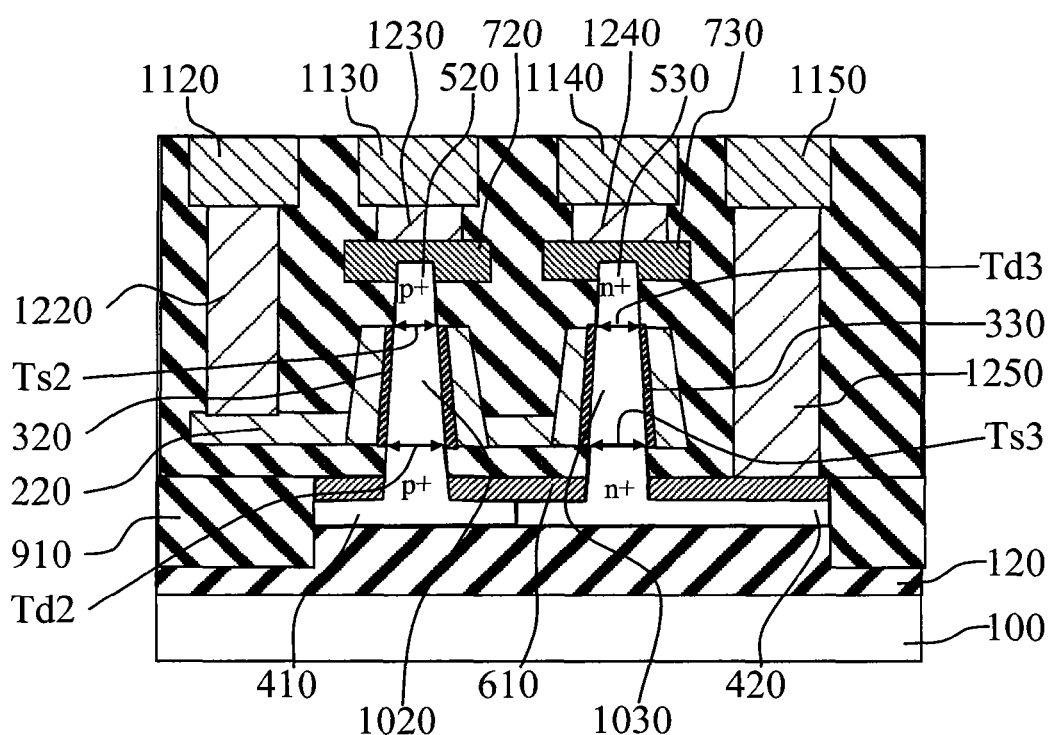
FIG. 25C is a cross-sectional view along line b-b' of the semiconductor device in FIG. 25A showing an example of producing a semiconductor device according to a second embodiment of the present invention.

Next, an explanation is provided of an example of a production method of the semiconductor device relating to the second embodiment of the present invention, with reference to FIG. 14 A-FIG. 25C. Moreover, in these drawings, the same labels are applied relative to the same structural elements. In FIG. 14A-FIG. 25C, A is a planar drawing, B is a cross-sectional view along the line a-a', and C is a cross-sectional view along the line b-b'.

Figure 14B:
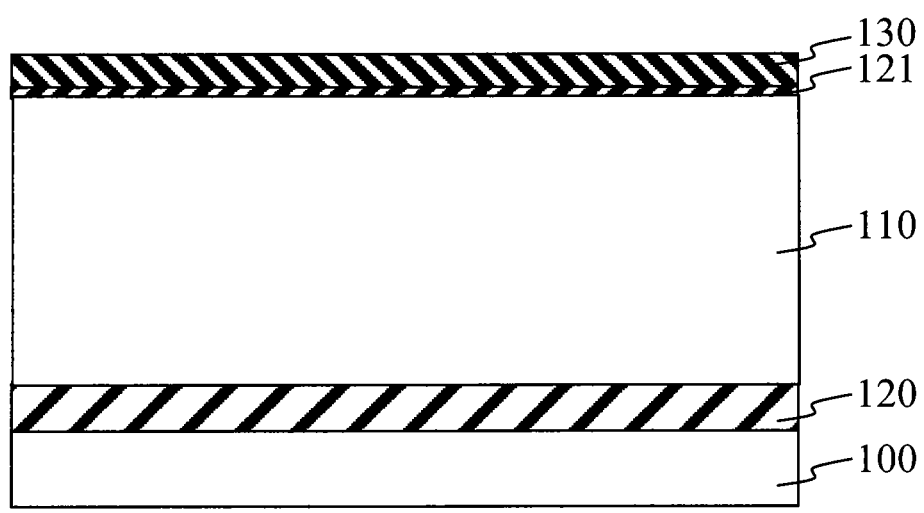
FIG. 14B is a cross-sectional view along line a-a' of the semiconductor device in FIG. 14A showing an example of producing a semiconductor device according to a second embodiment of the present invention.
Figure 14C:
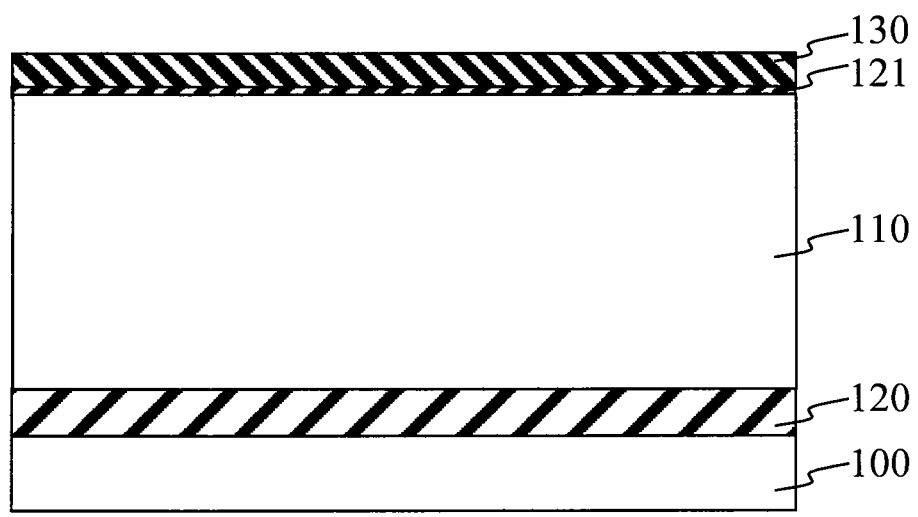
FIG. 14C is a cross-sectional view along line b-b' of the semiconductor device in FIG. 14A showing an example of producing a semiconductor device according to a second embodiment of the present invention.

As shown in FIG. 14A-FIG. 14C, on the Si substrate 100 is chronologically formed a BOX layer 120, an SOI layer 110, pad oxide film 121 and nitride film 130.

Figure 15A:
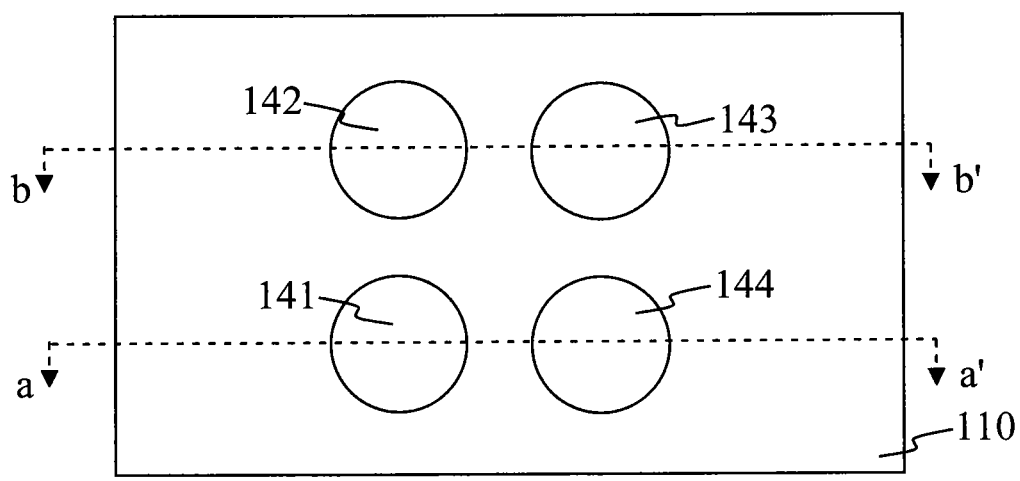
FIG. 15A is a top view showing an example of producing a semiconductor device according to a second embodiment of the present invention.
Figure 15B:
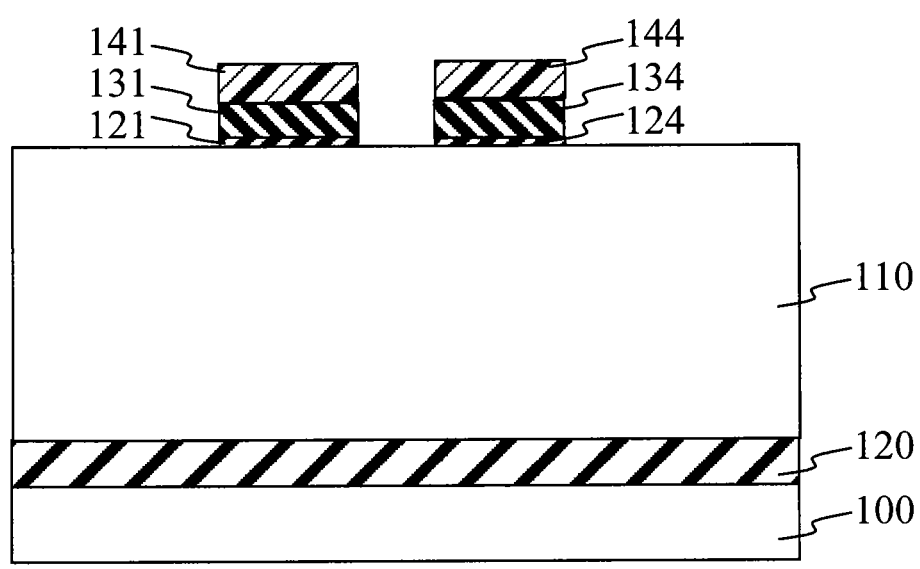
FIG. 15B is a cross-sectional view along line a-a' of the semiconductor device in FIG. 15A showing an example of producing a semiconductor device according to a second embodiment of the present invention.
Figure 15C:
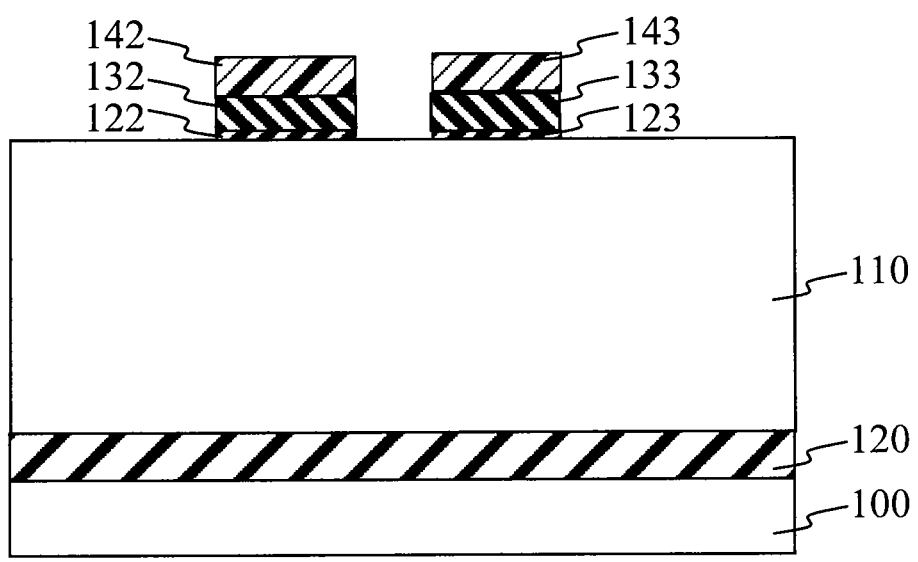
FIG. 15C is a cross-sectional view along line b-b' of the semiconductor device in FIG. 15A showing an example of producing a semiconductor device according to a second embodiment of the present invention.

The resist pattern numbers 141, 142, 143 and 144 of the cylindrical shape are formed on the scheduled location for forming column silicon. Continuing, by means of dry etching, formation is accomplished of nitride films 131, 132, 133 and 134 and oxide films 121, 122, 123, and 124 in respective cylindrical shapes. The semiconductor device involving these steps is shown in FIG. 15A-FIG. 15C. Continuing, resist patterns 141, 142, 143 and 144 are removed.

Figure 16A:
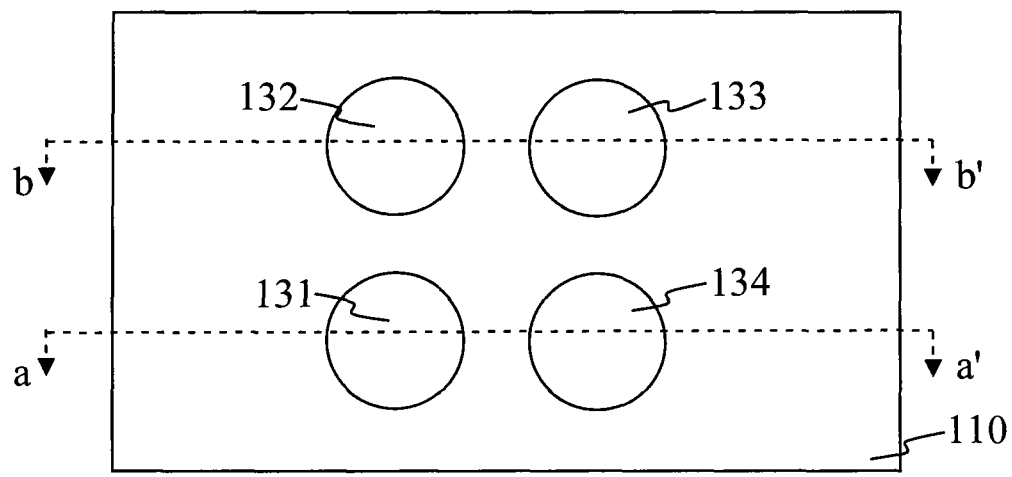
FIG. 16A is a top view showing an example of producing a semiconductor device according to a second embodiment of the present invention.
Figure 16B:
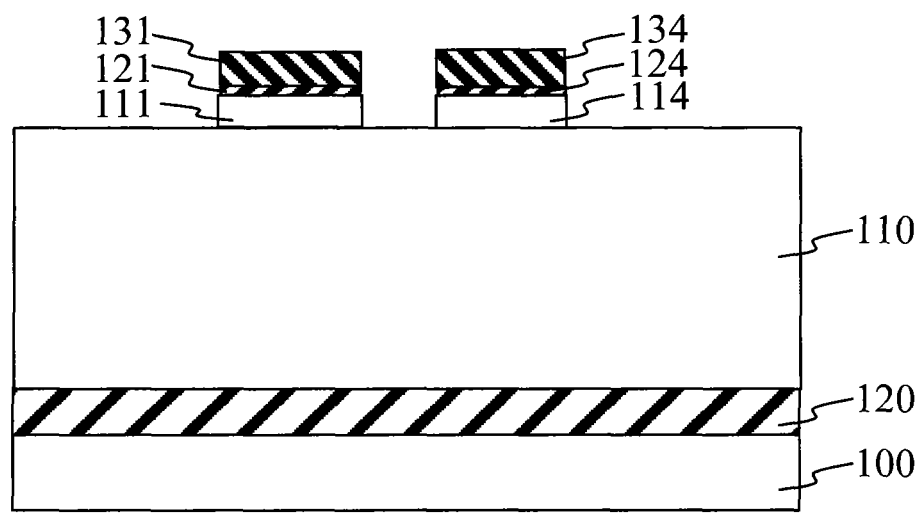
FIG. 16B is a cross-sectional view along line a-a' of the semiconductor device in FIG. 16A showing an example of producing a semiconductor device according to a second embodiment of the present invention.
Figure 16C:
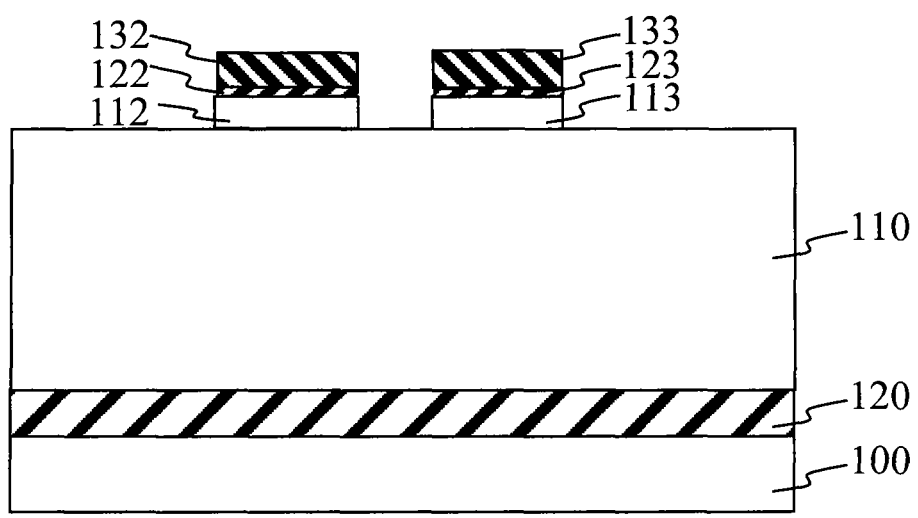
FIG. 16C is a cross-sectional view along line b-b' of the semiconductor device in FIG. 16A showing an example of producing a semiconductor device according to a second embodiment of the present invention.

By means of etching, silicon columns 111, 112, 113, and 114 are respectively formed below nitride films 131, 132, 133 and 134. These steps are shown in FIG. 16A-FIG. 16C.

Figure 17A:
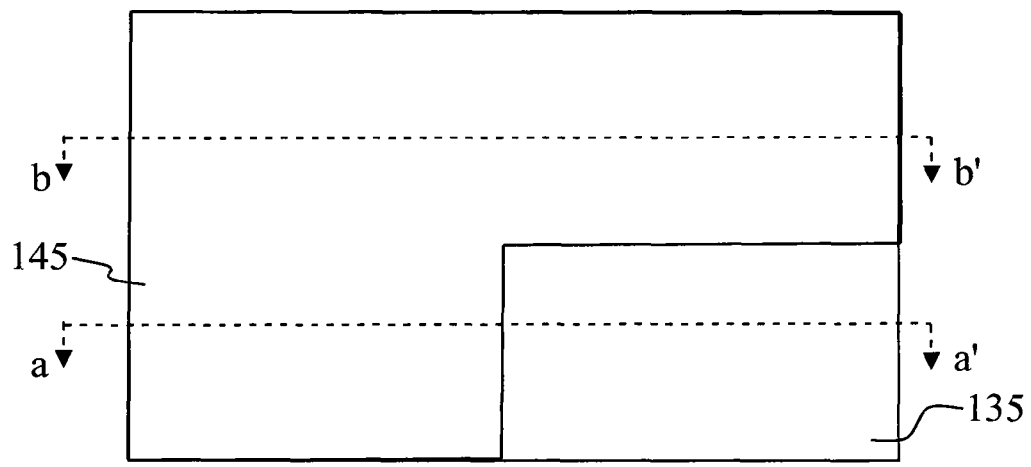
FIG. 17A is a top view showing an example of producing a semiconductor device according to a second embodiment of the present invention.
Figure 17B:
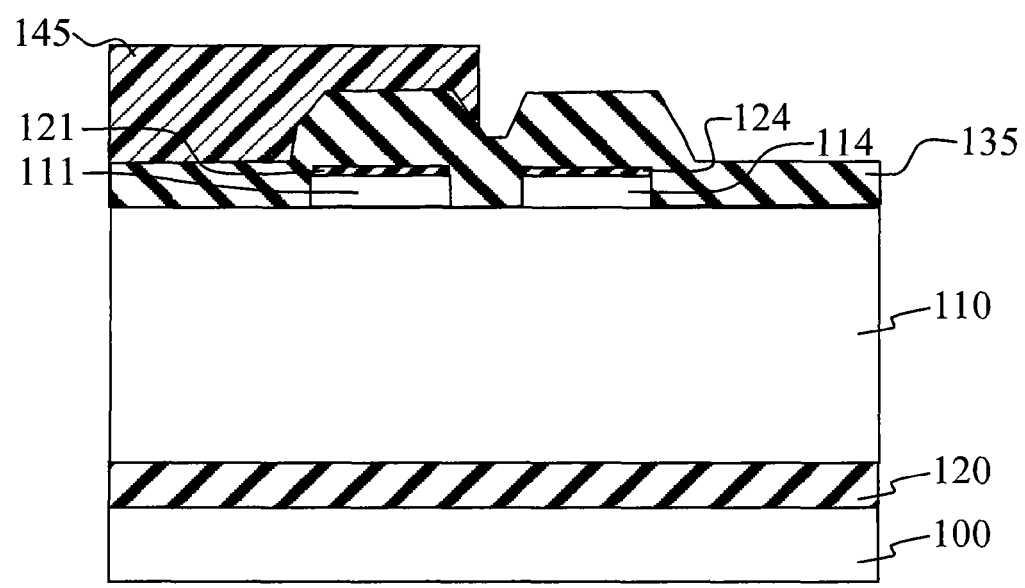
FIG. 17B is a cross-sectional view along line a-a' of the semiconductor device in FIG. 17A showing an example of producing a semiconductor device according to a second embodiment of the present invention.
Figure 17C:
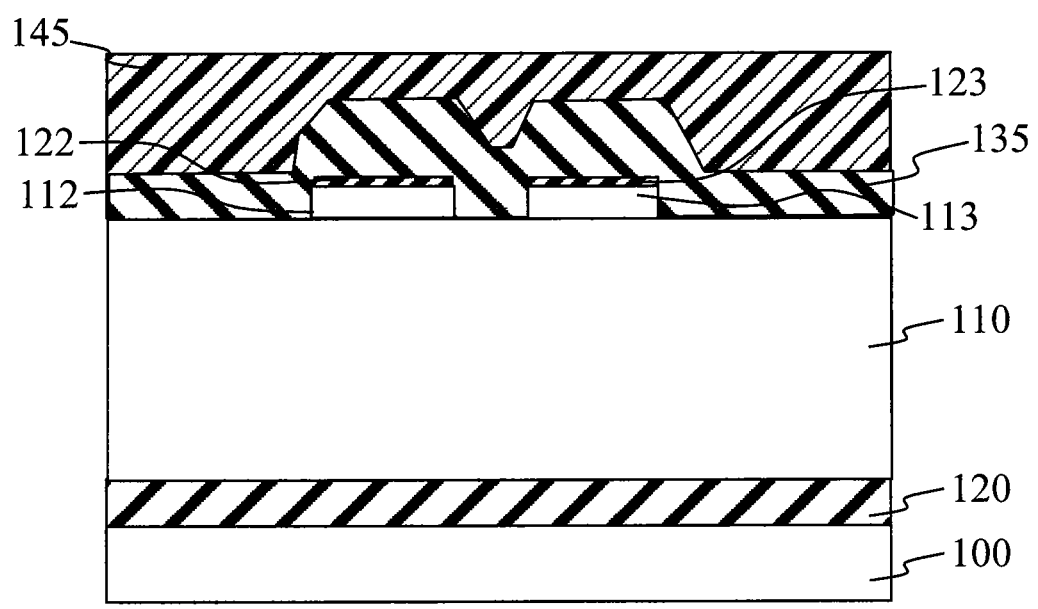
FIG. 17C is a cross-sectional view along line b-b' of the semiconductor device in FIG. 17A showing an example of producing a semiconductor device according to a second embodiment of the present invention.

Nitride film 135 is formed on the results and substance of the process. Continuing, resist pattern number 145 is formed on the nitride film 135. The semiconductor device involved in the steps is shown in FIG. 17A-FIG. 17C. Moreover, since nitride films 131, 132, 133 and 134 are pressed into the nitride film 135, the nitride film number 135 is viewed as a unit.

Figure 18A:
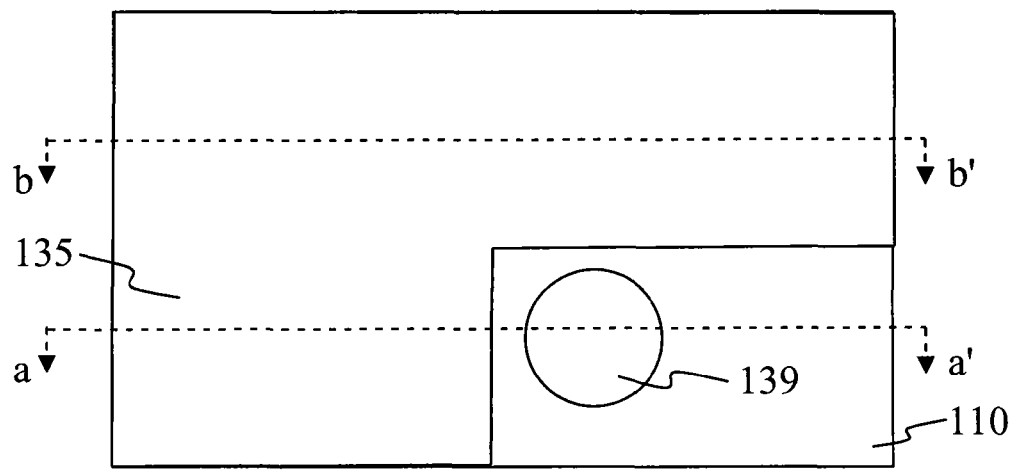
FIG. 18A is a top view showing an example of producing a semiconductor device according to a second embodiment of the present invention.
Figure 18B:
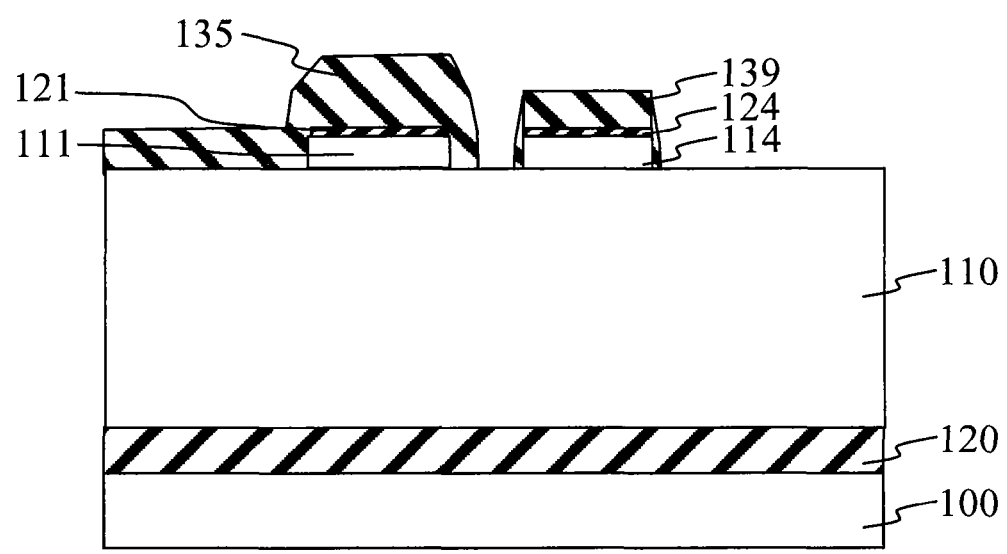
FIG. 18B is a cross-sectional view along line a-a' of the semiconductor device in FIG. 18A showing an example of producing a semiconductor device according to a second embodiment of the present invention.
Figure 18C:
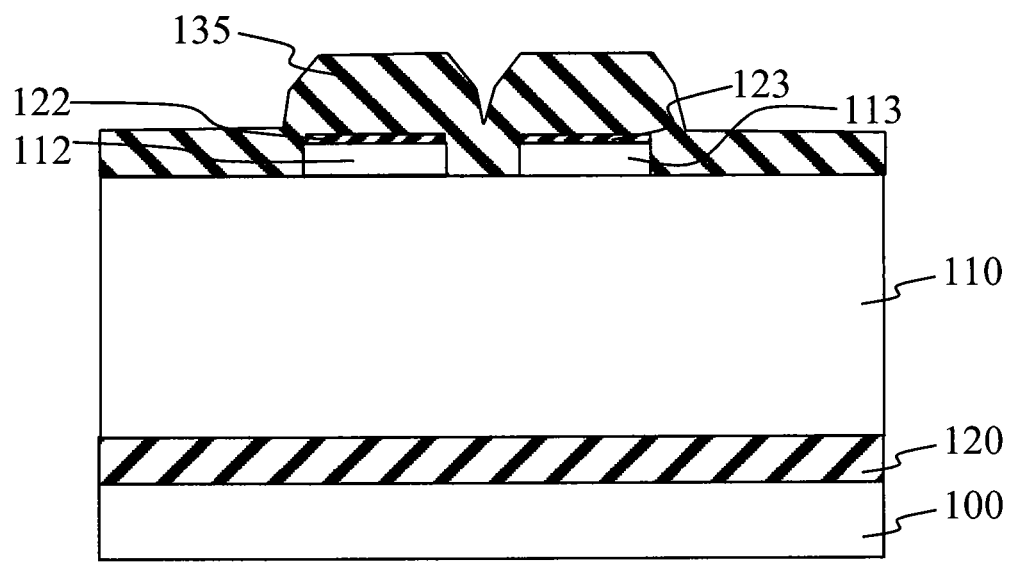
FIG. 18C is a cross-sectional view along line b-b' of the semiconductor device in FIG. 18A showing an example of producing a semiconductor device according to a second embodiment of the present invention.

Using the resist pattern 145, nitride film 139 is formed by etching. At this time, the nitride film 139 is formed by means of a side well of the nitride film 135 formed from nitride film 134 and etching. Continuing, the resist pattern 145 is removed. The semiconductor device involved in these steps is shown in FIG. 18-FIG. 18C.

Figure 19A:
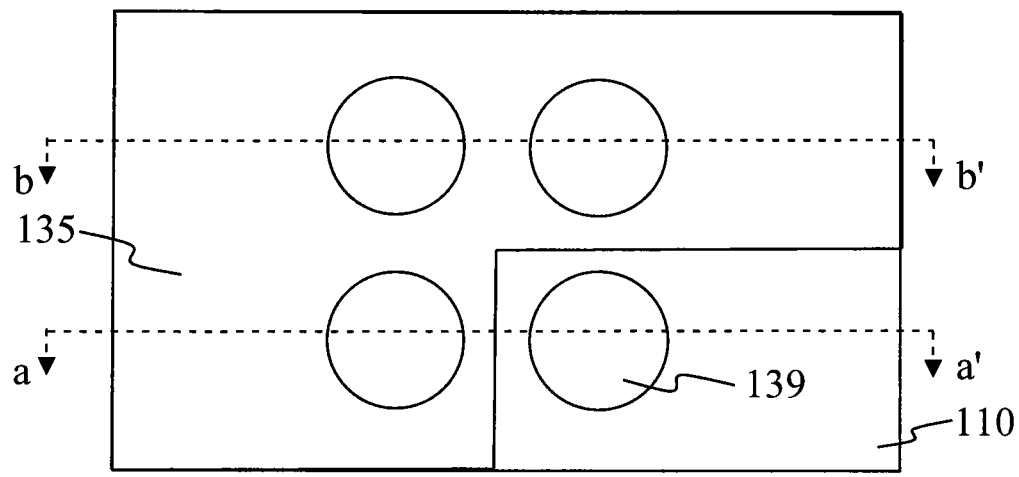
FIG. 19A is a top view showing an example of producing a semiconductor device according to a second embodiment of the present invention.
Figure 19B:
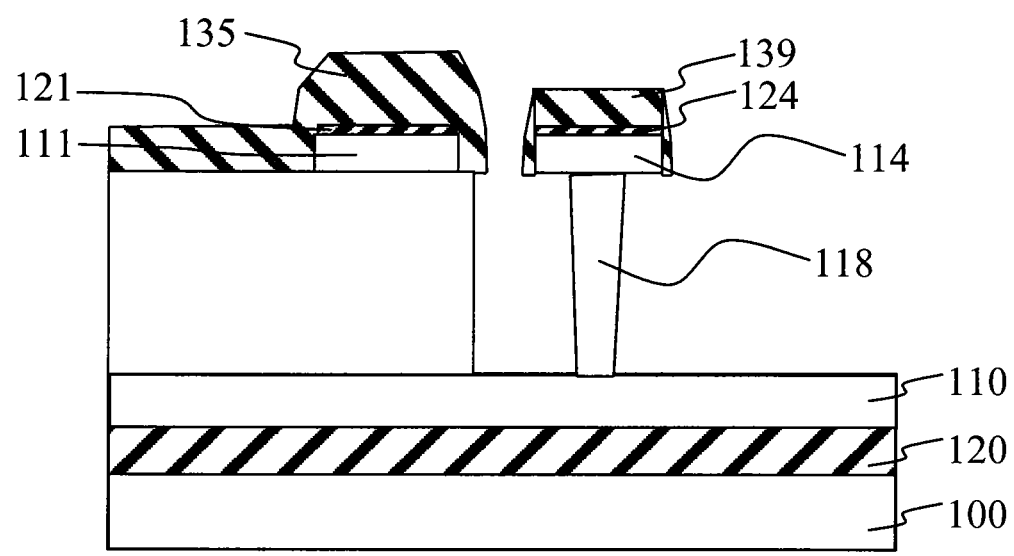
FIG. 19B is a cross-sectional view along line a-a' of the semiconductor device in FIG. 19A showing an example of producing a semiconductor device according to a second embodiment of the present invention.
Figure 19C:
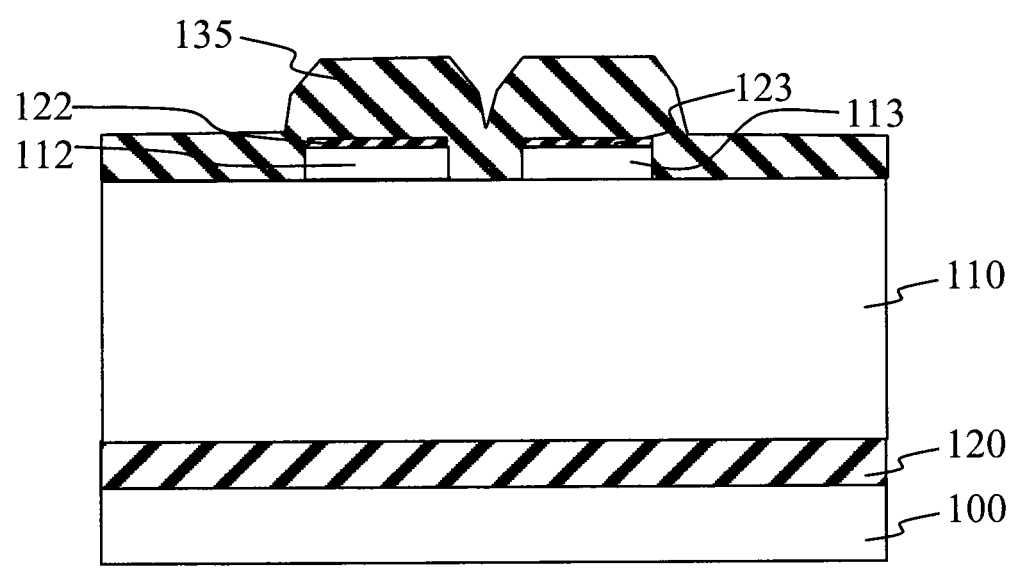
FIG. 19C is a cross-sectional view along line b-b' of the semiconductor device in FIG. 19A showing an example of producing a semiconductor device according to a second embodiment of the present invention.

Using nitride films 135 and 139, as shown in FIG. 19A-19C, a reverse taper silicon column 118 is formed by means of dry etching.

Figure 20A:
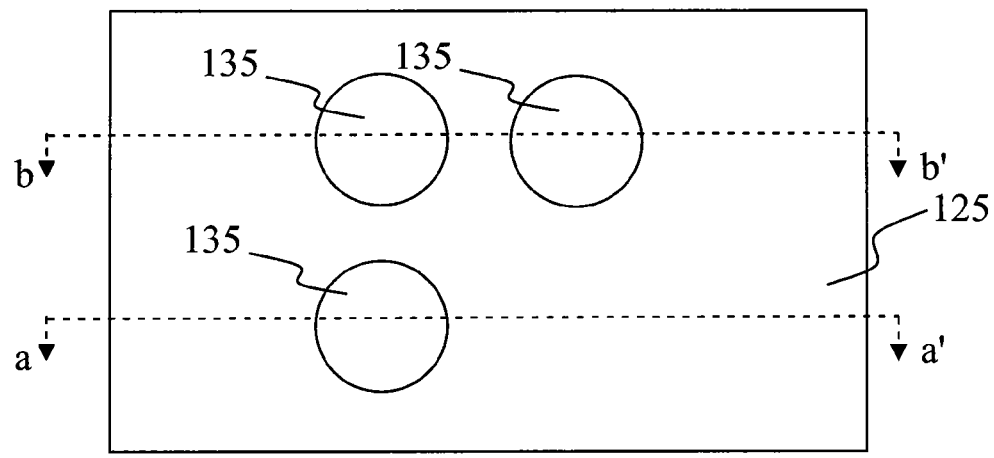
FIG. 20A is a top view showing an example of producing a semiconductor device according to a second embodiment of the present invention.
Figure 20B:
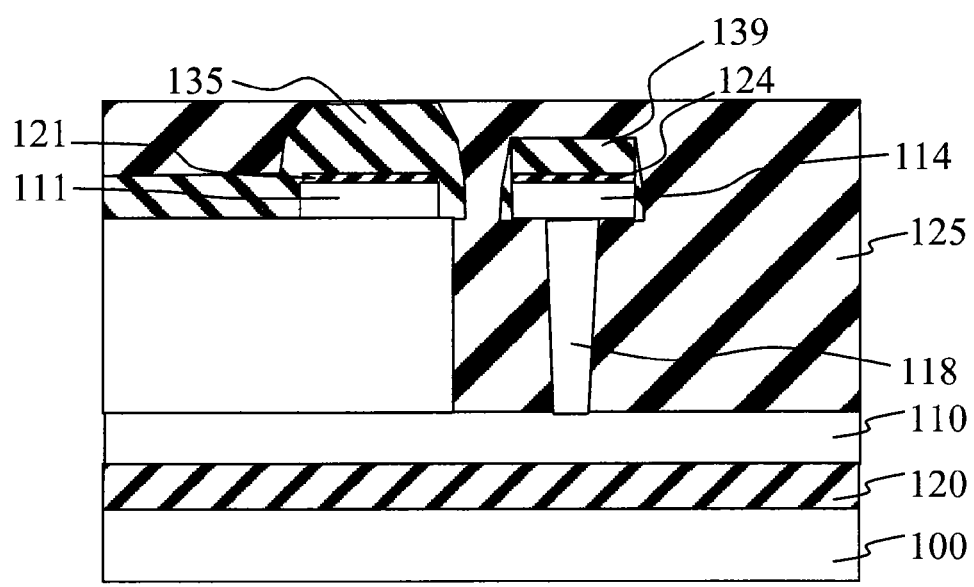
FIG. 20B is a cross-sectional view along line a-a' of the semiconductor device in FIG. 20A showing an example of producing a semiconductor device according to a second embodiment of the present invention.
Figure 20C:
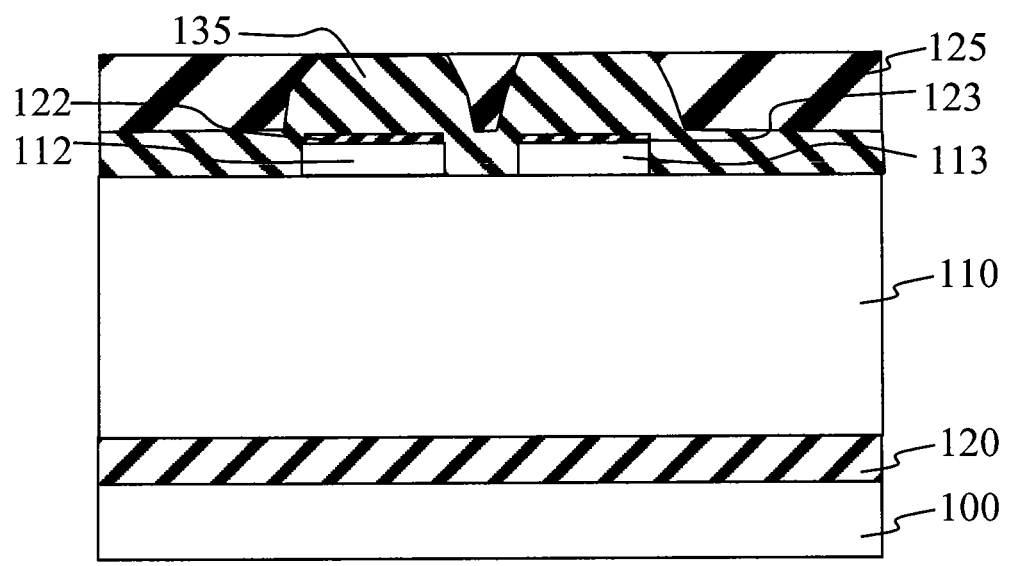
FIG. 20C is a cross-sectional view along line b-b' of the semiconductor device in FIG. 20A showing an example of producing a semiconductor device according to a second embodiment of the present invention.

As shown in FIG. 20A-FIG. 20C, an oxide film is formed on the resultant substance, and a flattened oxide film 125 is formed using CMP (Chemical Mechanical Polishing).

Figure 21A:
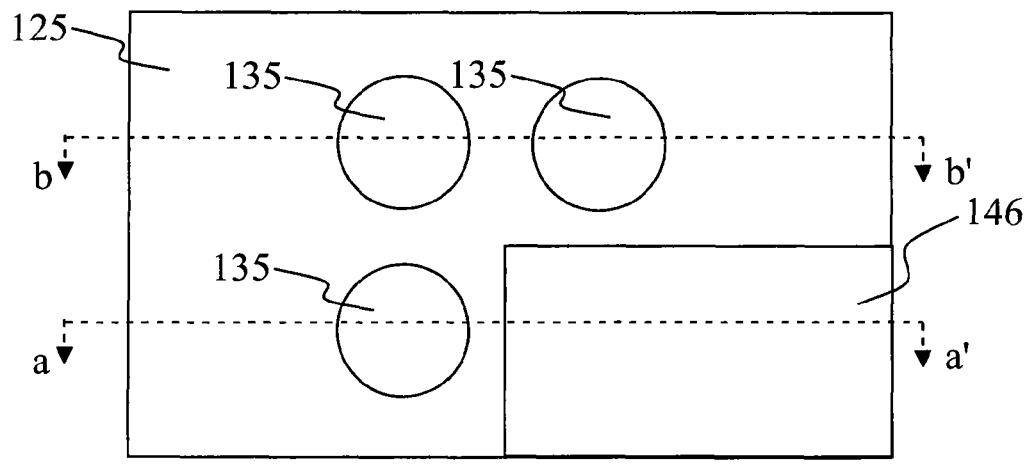
FIG. 21A is a top view showing an example of producing a semiconductor device according to a second embodiment of the present invention.
Figure 21B:
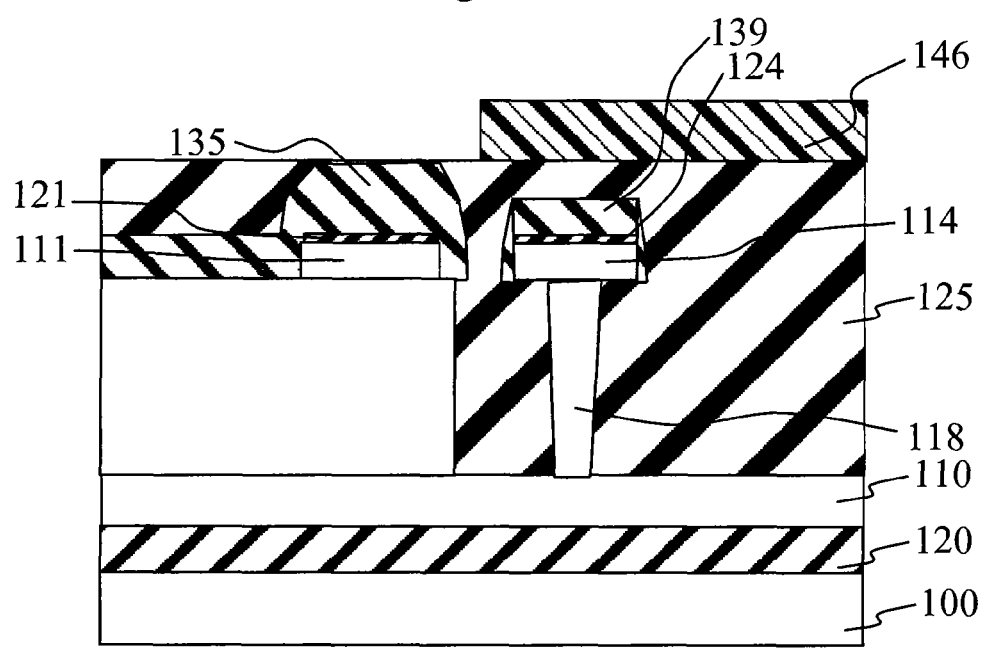
FIG. 21B is a cross-sectional view along line a-a' of the semiconductor device in FIG. 21A showing an example of producing a semiconductor device according to a second embodiment of the present invention.
Figure 21C:
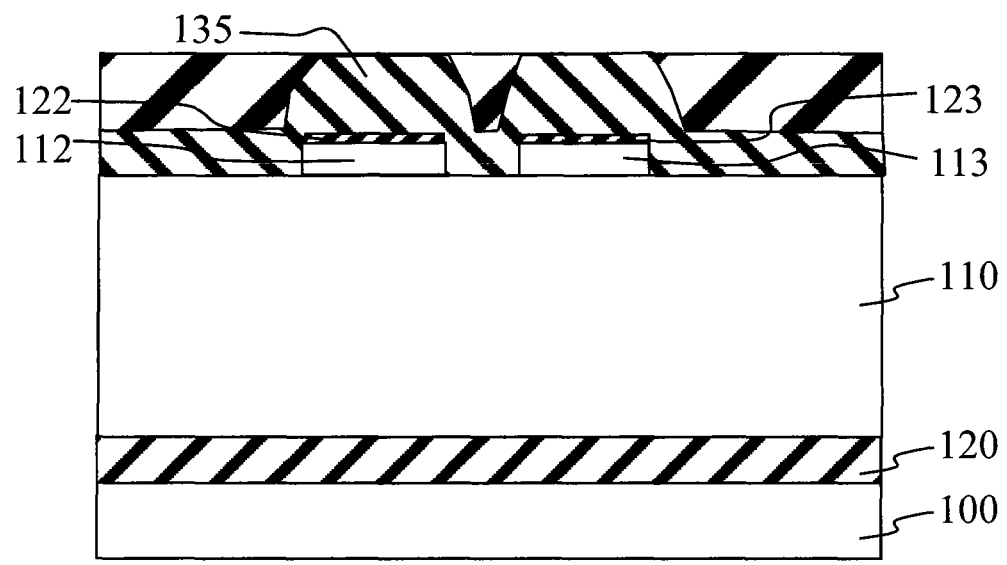
FIG. 21C is a cross-sectional view along line b-b' of the semiconductor device in FIG. 21A showing an example of producing a semiconductor device according to a second embodiment of the present invention.

As shown in FIG. 21A-FIG. 21C, a resist pattern 146 is formed on the resultant substance.

Figure 22A:
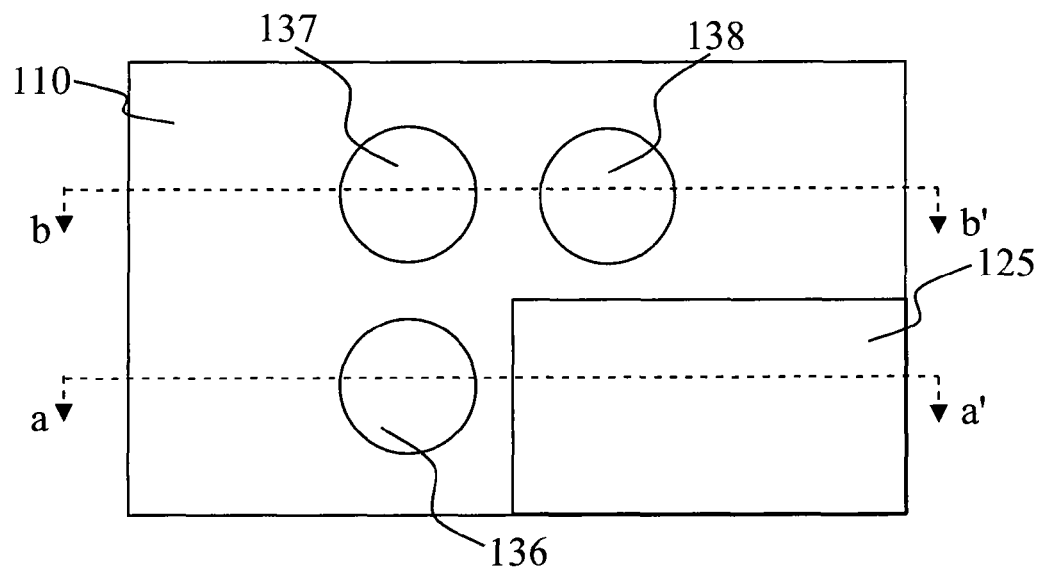
FIG. 22A is a top view showing an example of producing a semiconductor device according to a second embodiment of the present invention.
Figure 22B:
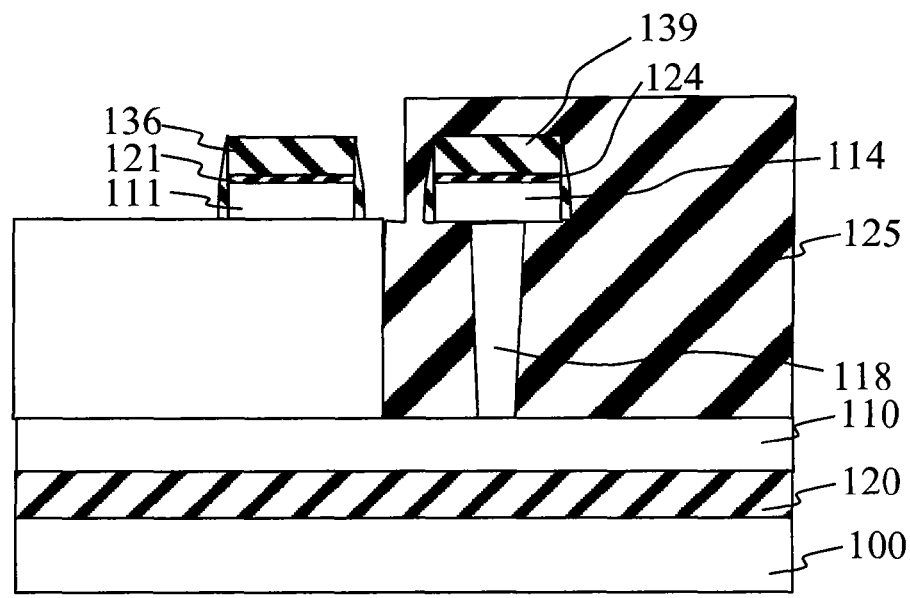
FIG. 22B is a cross-sectional view along line a-a' of the semiconductor device in FIG. 22A showing an example of producing a semiconductor device according to a second embodiment of the present invention.
Figure 22C:
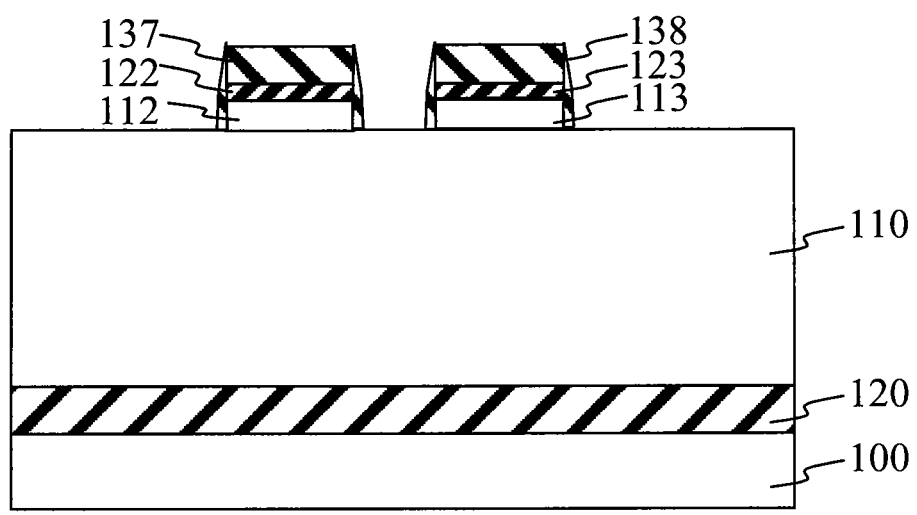
FIG. 22C is a cross-sectional view along line b-b' of the semiconductor device in FIG. 22A showing an example of producing a semiconductor device according to a second embodiment of the present invention.

Using a resist pattern number 146, nitride films 136, 137 and 138 are formed by etching of the oxide film 125 and the nitride film 135. At this time, the nitride film 136 is formed by the side well of the nitride film 135 formed by nitride film 131 and etching. The nitride film 137 is formed by the side well of the nitride film 135 formed by nitride film 132 and etching. Nitride film number 138 is formed by the side well out nitride film 135 formed by the nitride film 133 and etching. Continuing, the transistor pattern 146 is removed. The semiconductor device involved in the steps is shown in FIG. 22A-FIG. 22C.

Figure 23A:
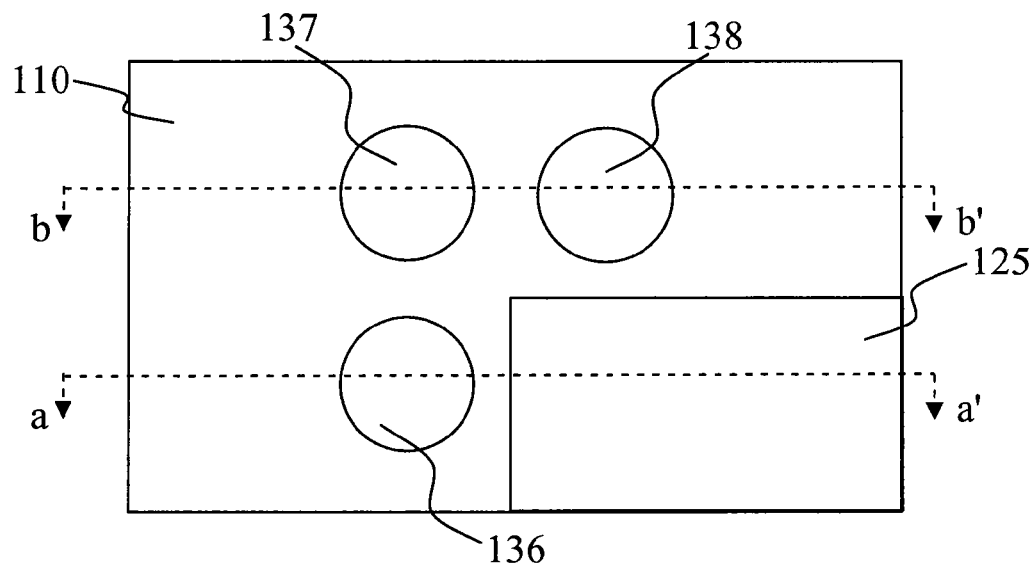
FIG. 23A is a top view showing an example of producing a semiconductor device according to a second embodiment of the present invention.
Figure 23B:
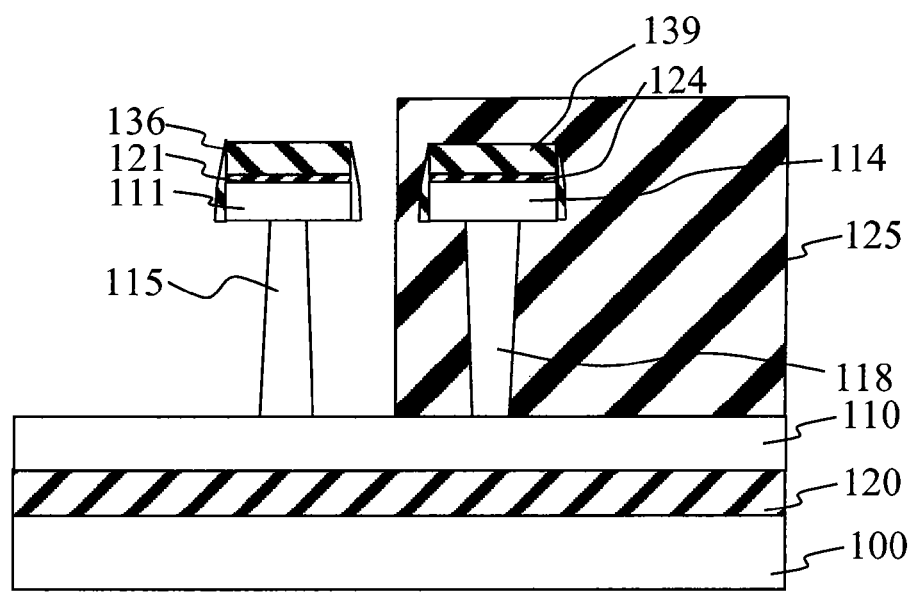
FIG. 23B is a cross-sectional view along line a-a' of the semiconductor device in FIG. 23A showing an example of producing a semiconductor device according to a second embodiment of the present invention.
Figure 23C:
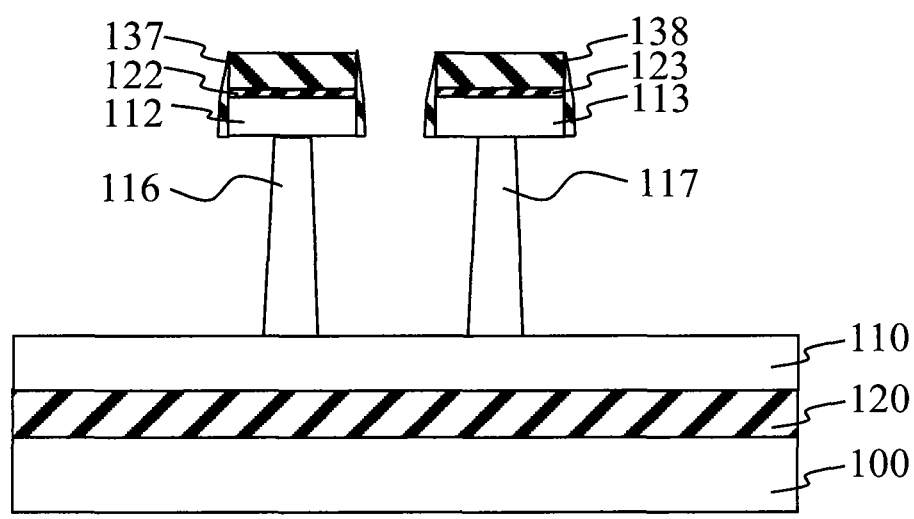
FIG. 23C is a cross-sectional view along line b-b' of the semiconductor device in FIG. 23A showing an example of producing a semiconductor device according to a second embodiment of the present invention.

As shown in FIG. 23A-FIG. 23C, using nitride films 136, 137 and 138, ordered taper silicon columns 115, 116 and 117 are respectively formed by dry etching.

As shown in FIG. 24A-FIG. 24C, nitride films 136, 137, 138 and 139 and oxide films 121, 122, 123 and 124 are removed.

As shown in FIG. 25A-FIG. 25C, element separating insulation film 910, gate electrodes 210 and 220, contacts 1210, 1220, 1230, 1240, 1250, 1260, 1270 and 1280, and metal wiring 1110, 1120, 1130, 1140, 1150 and 1160 are formed.

Third Embodiment

Semiconductor Device

The semiconductor device relating to the second embodiment is composed of an SCT which has an ordered taper silicon column and an SGT which has a reverse taper silicon column. Owing to this, at the time of producing a semiconductor device, there was a need for formation to be separately accomplished by an SGT which had an ordered taper silicon column and an SGT which has a reverse taper silicon column. Therefore, a semiconductor device is shown in which all of the SGT silicon columns all have an ordered taper.

Figure 26:
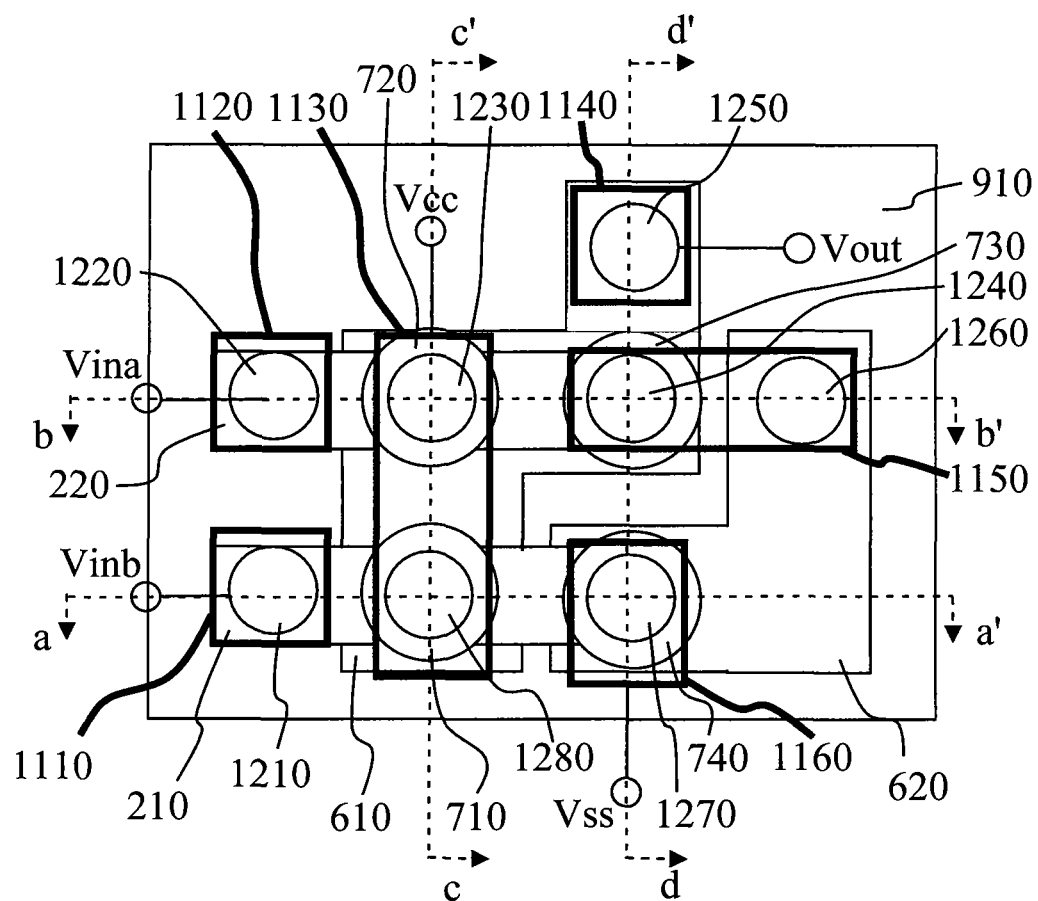
FIG. 26 is a summary top view of a semiconductor device relating to a third embodiment of the present invention functioning as a NAND circuit.
Figure 27:
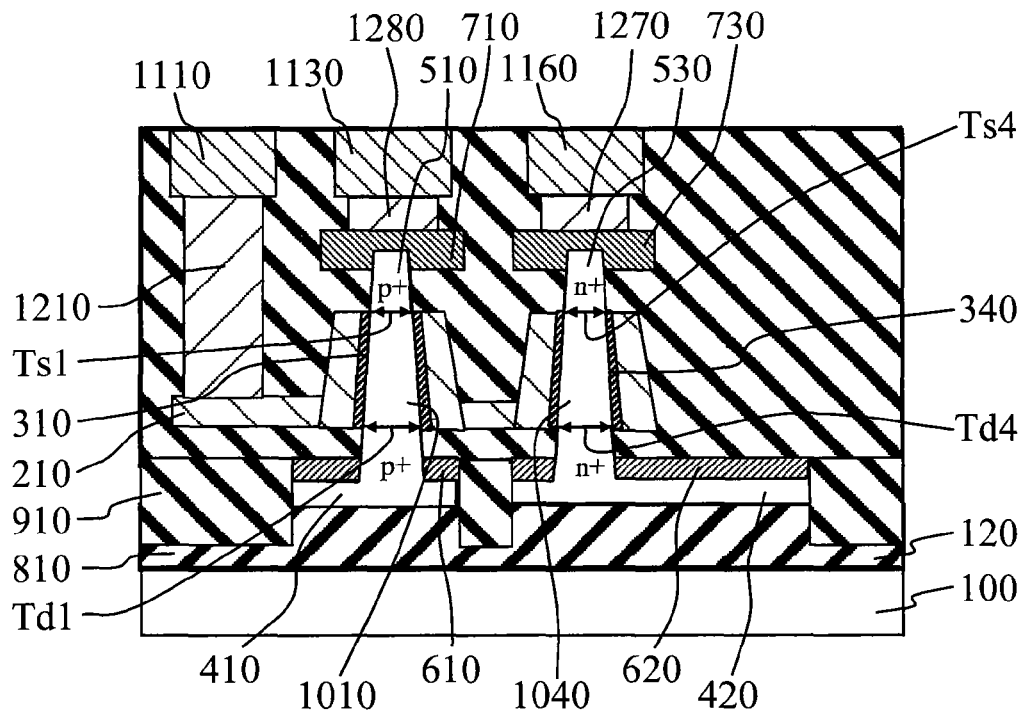
FIG. 27 is the line a-a' of the semiconductor device in FIG. 26.
Figure 28:
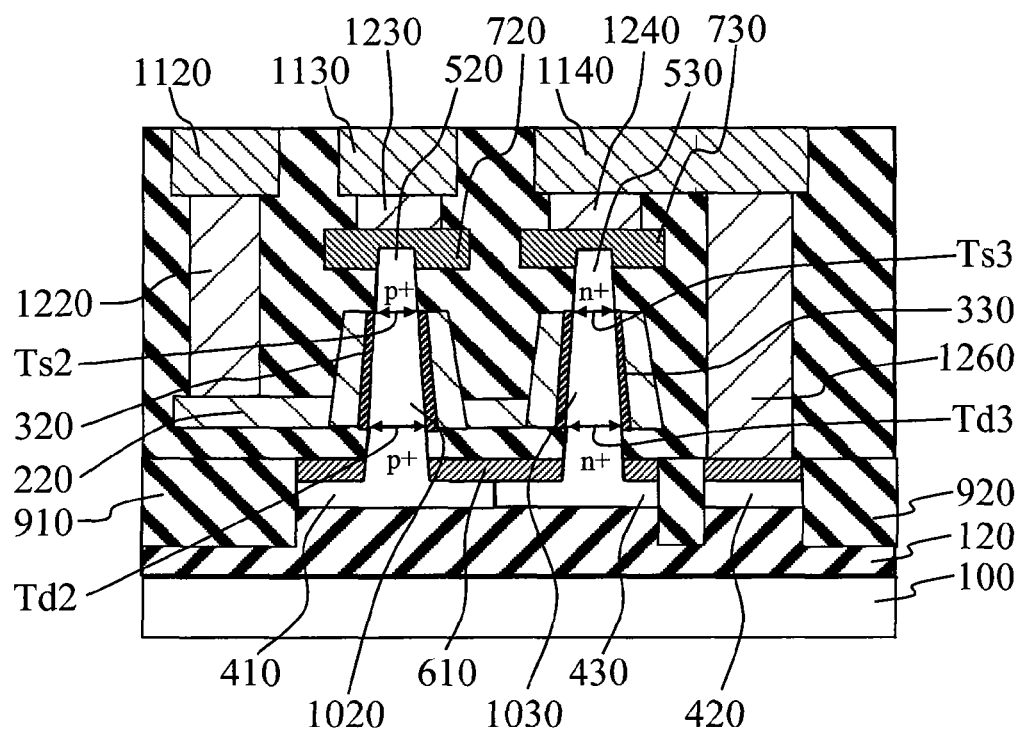
FIG. 28 is the line b-b' of the semiconductor device in FIG. 26.
Figure 29:
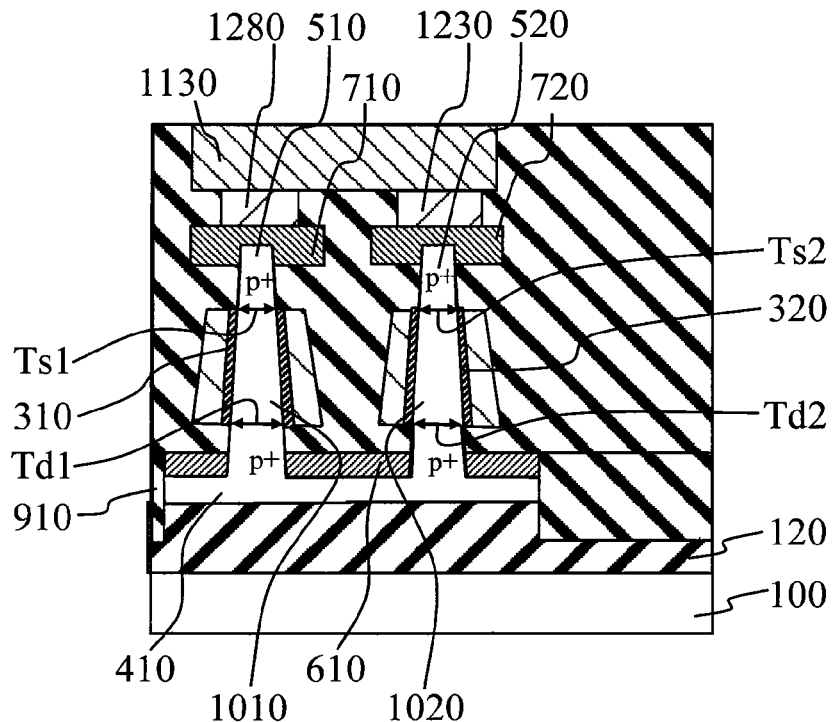
FIG. 29 is the line c-c' of the semiconductor device in FIG. 26.
Figure 30:
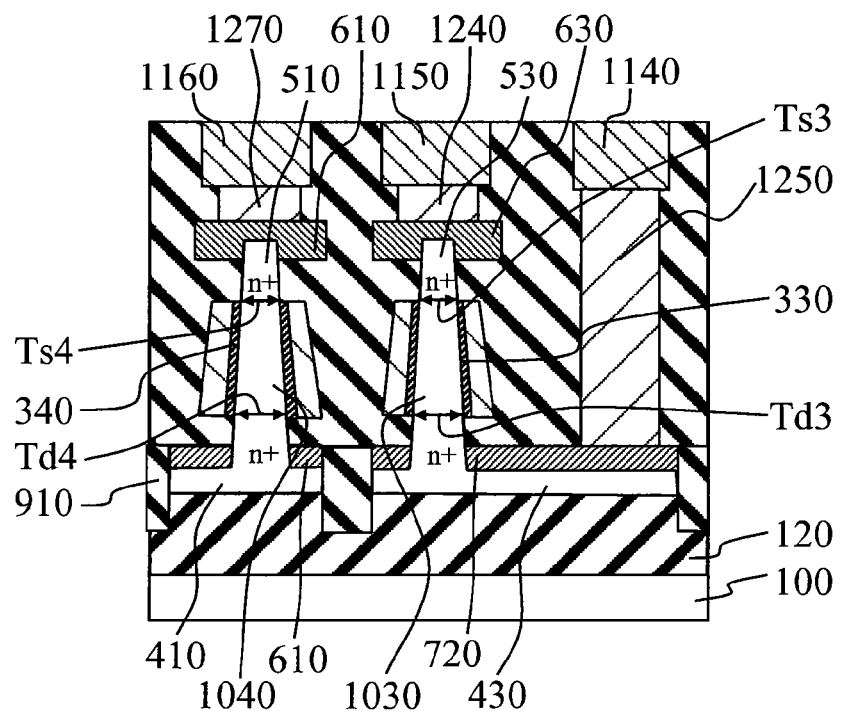
FIG. 30 is the line d-d' of the semiconductor device in FIG. 26.

FIG. 26 is a summary top view of the semiconductor device relating to a third embodiment of the present invention. FIG. 27 is a simplified cross-sectional view along the cut line a-a' of FIG. 26. FIG. 28 is a simplified cross-sectional view along the cut line b-b' of FIG. 26. FIG. 29 is a simplified cross-sectional view along the cut line c-c' of FIG. 26. FIG. 30 is a simplified cross-sectional view along the cut line d-d' of FIG. 26.

The semiconductor device relating to the present embodiment is composed from an SGT relating to 4 first embodiments arrange in a 2nd row 2nd column. The channel width of each SGT is equal to the peripheral length of the silicon column. With the present embodiment, since the size of the silicon column of each SGT is equal, the channel width of each SGT is also equal.

The first SGT arranged in the 1st row 1st column is provided with a silicon column 1010 comprising a high resistance region. The silicon column 1010 has an ordered tapered circular truncated cone. In order to encompass the silicon column 1010, a first insulating body 310 is arranged on a side surface of the silicon column 1010. In order to encompass the first insulating body 310, a gate electrode 210 is arranged on the side surface of the first insulating body 310. On the lower part of the silicon column 1010 is arranged a p+ high-density impurity region 410 (drain region), and on the upper part is arranged a p+ high-density impurity region 510 (source region), respectively. The p+ high-density impurity region 410 (drain region) is arranged on the oxide film 120 formed on the semiconductor substrate 100. On the upper part of the p+ high-density impurity region 410 is formed a silicide region 610, and on the upper part of the p+ high-density impurity region 510, is formed a silicide region 710, respectively. On the silicide region 710 is arranged a contact 1280.

With the first SGT, the diameter Ts1 of the contact cross-sectional surface between the silicon column 1010 and the p+ high-density impurity region 510 is smaller than the diameter Td1 of the contact cross-sectional surface between the silicon column 1010 and the p+ high-density impurity region 410.

The second SGT arranged in the 2nd row 1st column is provided with a silicon column 1020 comprising a high resistance region. The silicon column 1020 has an ordered tapered circular truncated cone. In order to encompass the silicon column 1020, a first insulating body 320 is arranged on a side surface of the silicon column 1020. In order to encompass the first insulating body 320, a gate electrode 220 is arranged on the side surface of the first insulating body 330. On the lower part of the silicon column 1020 is arranged a p+ high-density impurity region 410 (drain region), and on the upper part is arranged a p+ high-density impurity region 520 (source region), respectively.

The p+ high-density impurity region 410 (drain region) is arranged on the oxide film 120 formed on the semiconductor substrate 100. On the upper part of the p+ high-density impurity region 410 is formed a silicide region 610, and on the upper part of the p+ high-density impurity region 520, is formed a silicide region 720, respectively. On the silicide region 720 is arranged a contact 1230. On the contact 1230 is arranged metal wiring 1130. The metal wiring 1130 is connected to the contact 1280 of the first SGT and the electricity source and electric potential Vcc.

With the second SGT, the diameter Ts2 of the contact cross-sectional surface between the silicon column 1020 and the p+ high-density impurity region 520 is smaller than the diameter Td2 of the contact cross-sectional surface between the silicon column 1020 and the p+ high-density impurity region 410.

The third SGT arranged in the 2nd row 2nd column is provided with a silicon column 1030 comprising a high resistance region. The silicon column 1030 has an overall ordered tapered circular truncated cone. In order to encompass the silicon column 1030, a first insulating body 330 is arranged on a side surface of the silicon column 1030. In order to encompass the first insulating body 330, a gate electrode 220 is arranged on the side surface of the first insulating body 330.

On the lower part of the silicon column 1030 is arranged an n+ high-density impurity region 430 (drain region), and on the upper part is arranged an n+ high-density impurity region 530 (source region), respectively. The n+ high-density impurity region 430 (drain region) is arranged on the oxide film 120 formed on the semiconductor substrate 100. On the upper part of the n+ high-density impurity region 430 is formed a silicide region 610, and on the upper part of the n+ high-density impurity region 530, is formed a silicide region 730, respectively. On the silicide region 730 is arranged a contact 1240.

With the third SGT, the diameter Ts3 of the contact cross-sectional surface between the silicon column 1030 and the n+ high-density impurity region 530 is smaller than the diameter Td3 of the contact cross-sectional surface between the silicon column 1030 and the n+ high-density impurity region 430.

The fourth SGT arranged in the 1st row 2nd column is provided with a silicon column 1040 comprising a high resistance region. The silicon column 1040 has an overall reverse taper circular truncated cone. In order to encompass the silicon column 1040, a first insulating body 340 is arranged on a side surface of the silicon column 1040. In order to encompass the first insulating body 340, a gate electrode 210 is arranged on the side surface of the first insulating body 340. On the lower part of the silicon column 1040 is arranged an n+ high-density impurity region 420 (drain region), and on the upper part is arranged an n+ high-density impurity region 540 (source region), respectively.

The n+ high-density impurity region 420 (drain region) is arranged on the oxide film 120 formed on the semiconductor substrate 100. On the upper part of the n+ high-density impurity region 420 is formed a silicide region 620, and on the upper part of the n+ high-density impurity region 540, is formed a silicide region 740, respectively. On the silicide region 740 is arranged a contact 1270.

With the fourth SGT, the diameter Ts4 of the contact cross-sectional surface between the silicon column 1040 and the n+ high-density impurity region 540 is smaller than the diameter Td4 of the contact cross-sectional surface between the silicon column 1040 and the n+ high-density impurity region 420.

In addition, on the gate electrode 210 of the first SGT is arranged a contact 1210. On contact 1210 is arranged metal wiring 1110. Metal wiring 1110 is connected to a second input electric potential Vinb. On the gate electrode 220 of the second SGT is arranged the contact 1220. On the contact 1220, is arranged metal wiring 1120. Metal wiring 1120 is connected to the first input electric potential Vina. The silicide region 610 formed on the third SGT n+ high-density impurity region 430 is connected to the contact 1250. On the contact 1250 is arranged metal wiring 1140. Metal wiring 1140 is connected to the output potential Vout. The silicide region 624 formed on the upper part of the fourth SGT n+ high-density impurity region 420 is connected to contact 1260. On contact 1260 is arranged wiring 1150. Metal wiring 1150 is connected to the third SGT contact 1240. Silicide 610 connected to the first SGT p+ high-density impurity region is connected to the second SGT p+ high-density impurity region and to the third SGT n+ high-density impurity region. In addition, an element separating insulating film 910 is formed on the side surface of the p+ high-density impurity region 410 and on the n+ high-density impurity region 420.

With the present embodiment, all of the transistors compose electronic circuits, but are the same structure as the transistors of the first embodiment. Since it is capable of high speed operation, the semiconductor device relating to the present embodiment is also capable of high-speed operation. In addition, since the silicon columns are all ordered circular truncated cones, the production of the silicon columns can be accomplished in a single step. Therefore, the production of the semiconductor device relating to the present invention is simplified.

Next, an example of a production method of the semiconductor device relating to the second embodiment of the present invention is explained with reference to FIG. 31A-FIG. 37C. Moreover, these drawings have the same labels applied relative to the same structural elements. In FIG. 31A-FIG. 37C, A is a planar view, B is a cross-sectional view along the line a-a', and C is a cross-sectional view along the line b-b'.

Figure 31A:
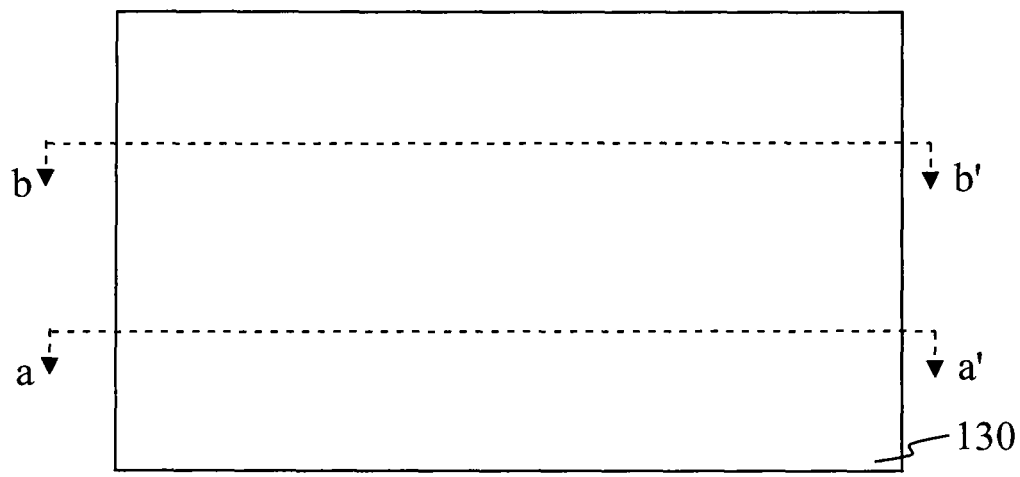
FIG. 31A is a top view showing an example of producing a semiconductor device according to a third embodiment of the present invention.
Figure 31B:
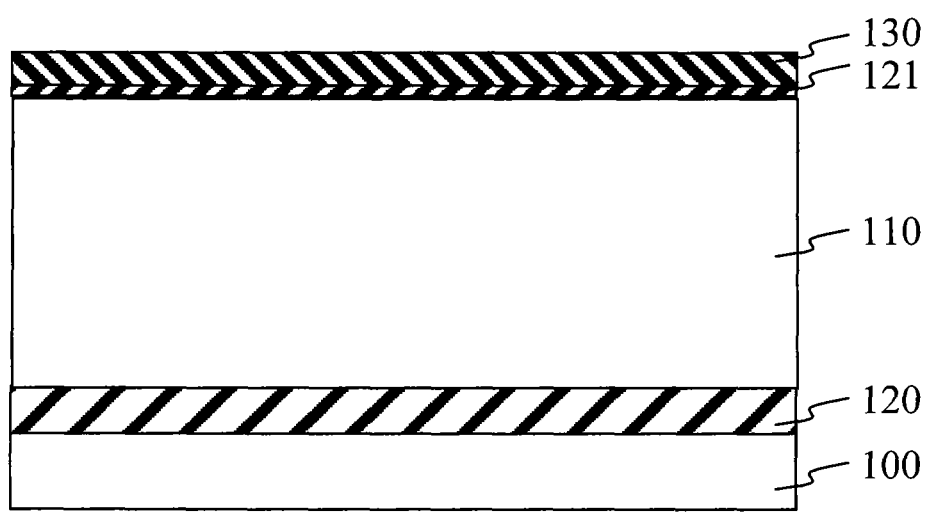
FIG. 31B is a cross-sectional view along line a-a' of the semiconductor device in FIG. 31A showing an example of producing a semiconductor device according to a third embodiment of the present invention.
Figure 31C:
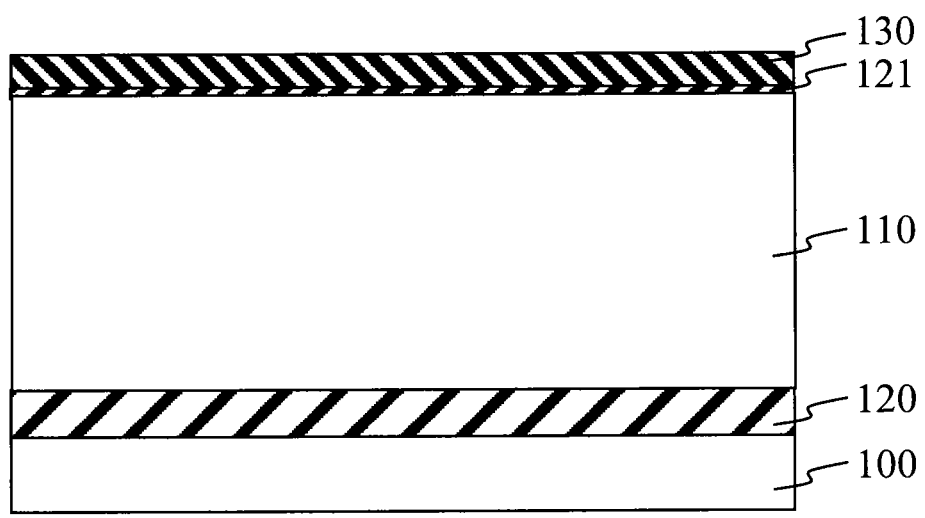
FIG. 31C is a cross-sectional view along line b-b' of the semiconductor device in FIG. 31A showing an example of producing a semiconductor device according to a third embodiment of the present invention.

As shown in FIG. 31A-FIG. 31C, on a Si substrate 100, a BOX layer 120, an SOI layer 110, a pad oxide film 121, and a nitride film 130 are chronologically formed.

Figure 32C:
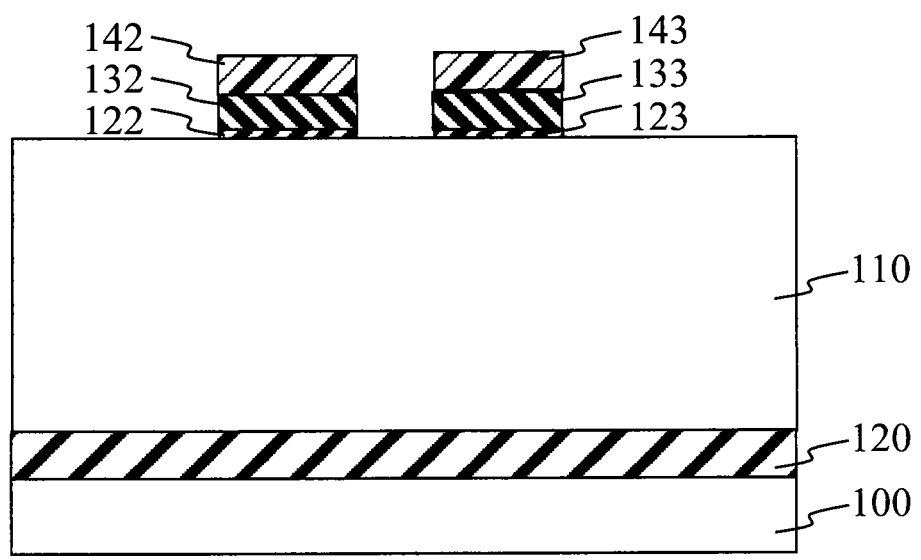
FIG. 32C is a cross-sectional view along line b-b' of the semiconductor device in FIG. 32A showing an example of producing a semiconductor device according to a third embodiment of the present invention.
Figure 32A:
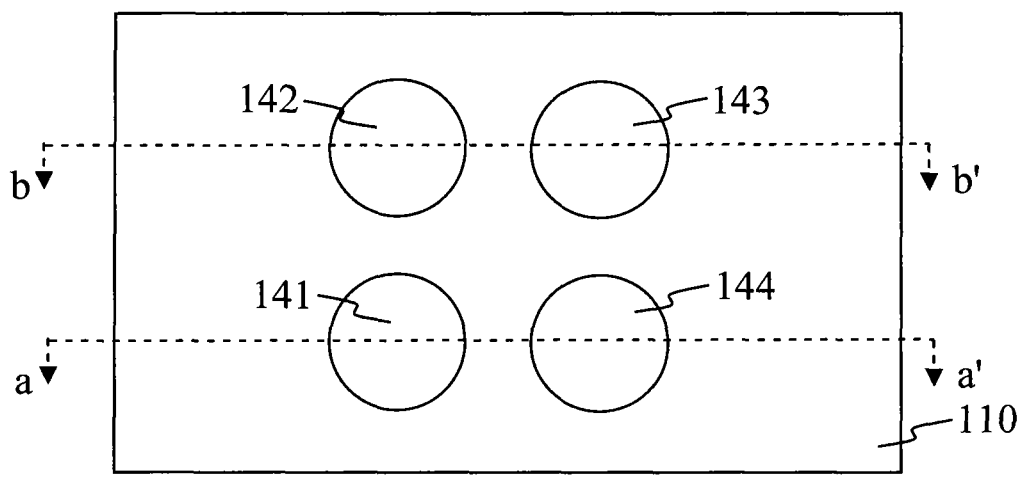
FIG. 32A is a top view showing an example of producing a semiconductor device according to a third embodiment of the present invention.
Figure 32B:
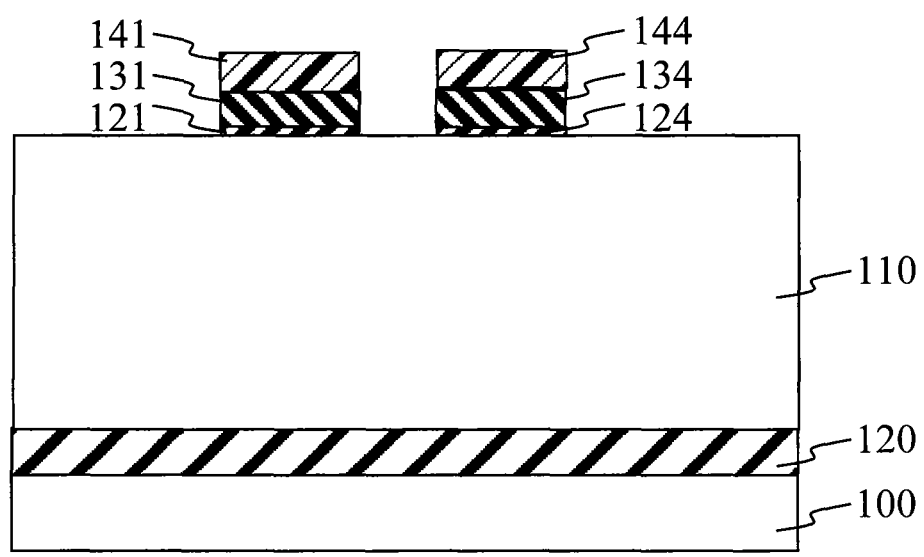
FIG. 32B is a cross-sectional view along line a-a' of the semiconductor device in FIG. 32A showing an example of producing a semiconductor device according to a third embodiment of the present invention.

In the scheduled location on which is formed a silicon column, are formed cylindrical resist patterns 141, 142, 143, and 144. Continuing, by means of dry etching, nitride films 131, 132, 133 and 134, and oxide films 121, 122, 123, and 124 are respectively formed into cylindrical shapes. The semiconductor devices involved in these steps are shown in FIGS. 32A-32C. Continuing, the resists omit patterns 141, 142, 143 and 144.

Figure 33A:
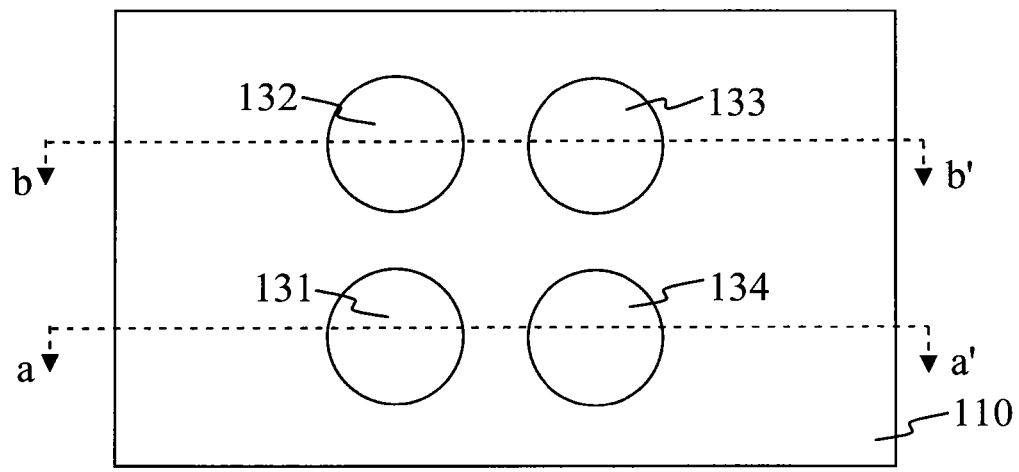
FIG. 33A is a top view showing an example of producing a semiconductor device according to a third embodiment of the present invention.
Figure 33B:
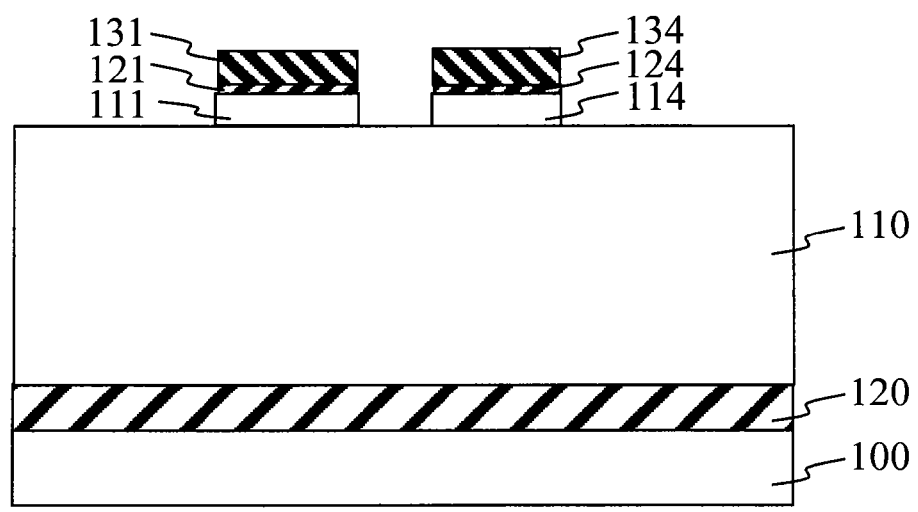
FIG. 33B is a cross-sectional view along line a-a' of the semiconductor device in FIG. 33A showing an example of producing a semiconductor device according to a third embodiment of the present invention.
Figure 33C:
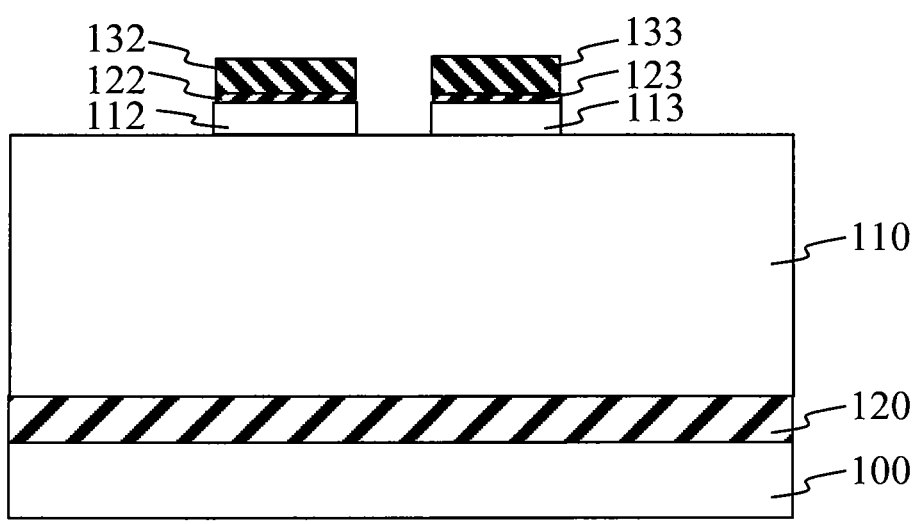
FIG. 33C is a cross-sectional view along line b-b' of the semiconductor device in FIG. 33A showing an example of producing a semiconductor device according to a third embodiment of the present invention.

By means of etching, silicon columns 111, 112, 113 and 114 are respectively formed below nitride films 131, 132, 133 and 134. The semiconductor device involved in these steps is shown in FIG. 33A-FIG. 33C.

Figure 34A:
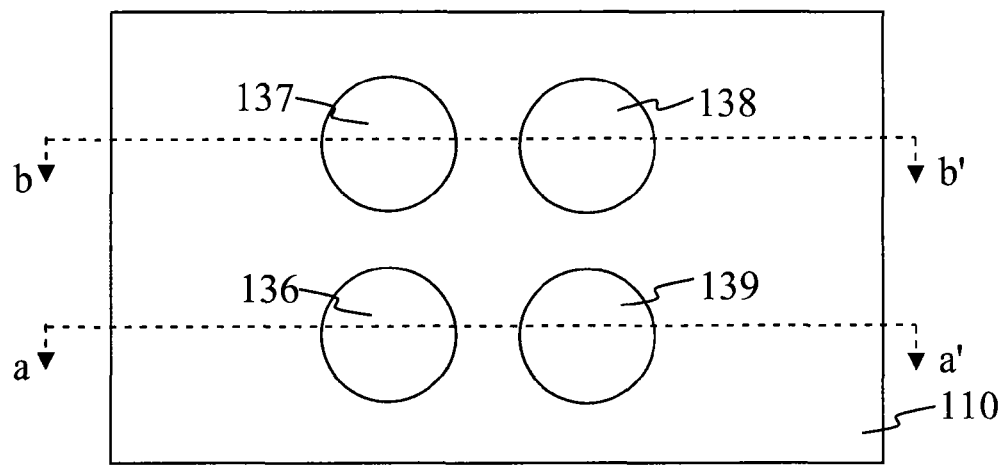
FIG. 34A is a top view showing an example of producing a semiconductor device according to a third embodiment of the present invention.
Figure 34B:
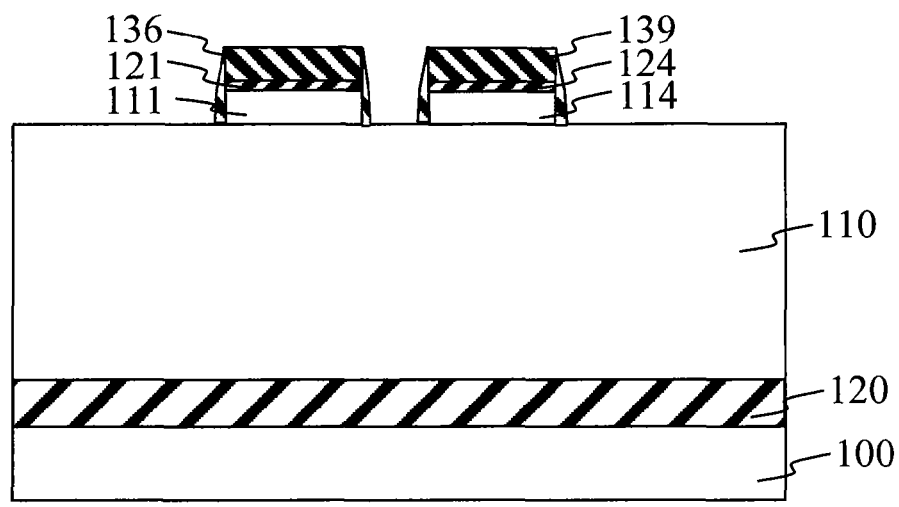
FIG. 34B is a cross-sectional view along line a-a' of the semiconductor device in FIG. 34A showing an example of producing a semiconductor device according to a third embodiment of the present invention.
Figure 34C:
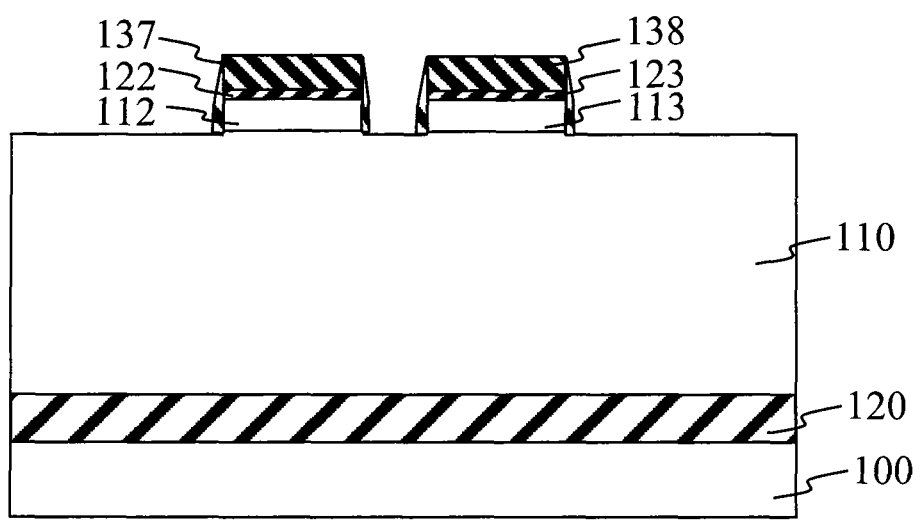
FIG. 34C is a cross-sectional view along line b-b' of the semiconductor device in FIG. 34A showing an example of producing a semiconductor device according to a third embodiment of the present invention.

Nitride film 135 is formed in the process results, and etching is performed. As a result, as shown in FIGS. 34A-34C, formation is accomplished of nitride film 136 in which the sidewall of the nitride film 135 is formed on the side surface of the nitride film 131, and nitride film 137 in which the nitride film 135 sidewall is formed on the side surface of nitride film 132, and nitride film 138 in which the nitride film 135 sidewall is formed on the side surface of the nitride film 133 and nitride film 139 in which the nitride film 135 side wall is formed on the side surface of the nitride film 134.

Figure 35A:
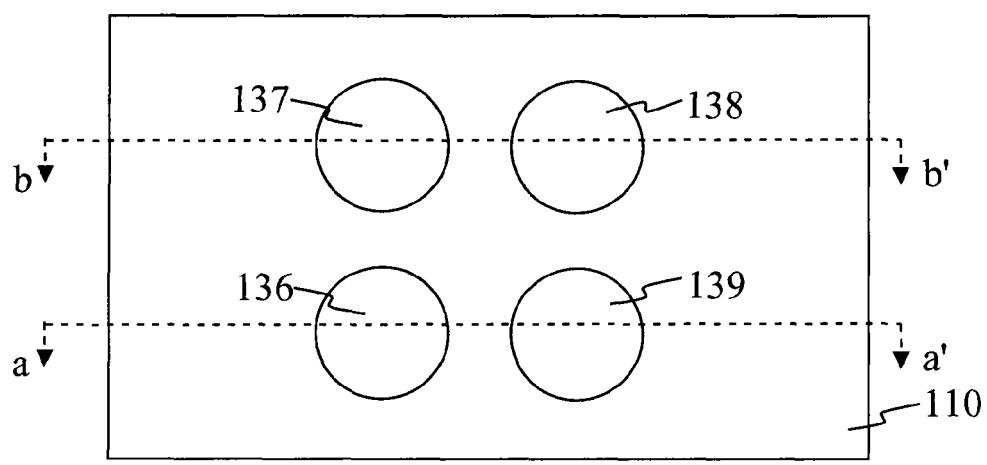
FIG. 35A is a top view showing an example of producing a semiconductor device according to a third embodiment of the present invention.
Figure 35B:
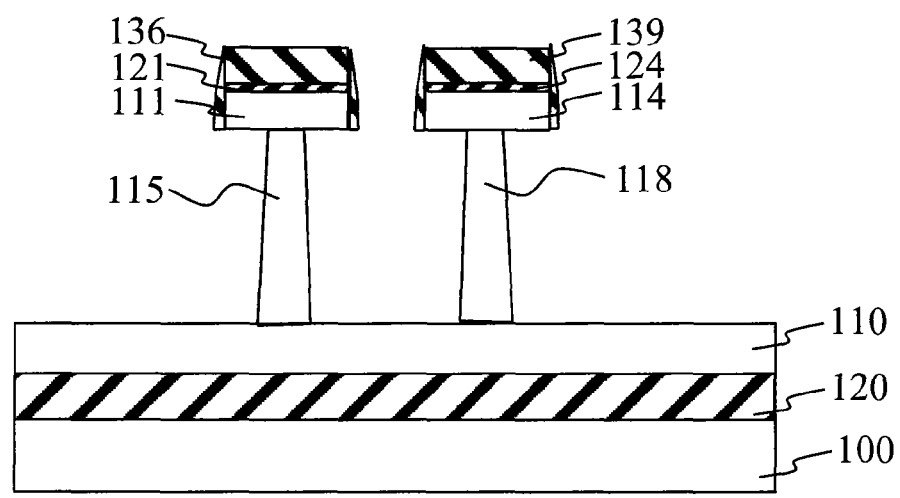
FIG. 35B is a cross-sectional view along line a-a' of the semiconductor device in FIG. 35A showing an example of producing a semiconductor device according to a third embodiment of the present invention.
Figure 35C:
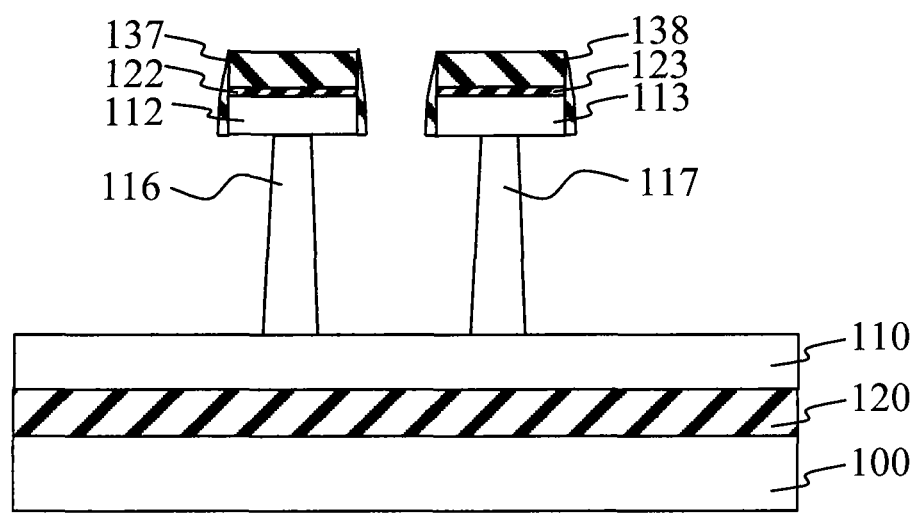
FIG. 35C is a cross-sectional view along line b-b' of the semiconductor device in FIG. 35A showing an example of producing a semiconductor device according to a third embodiment of the present invention.

Using nitride films 136, 137, 138 and 139, as shown in FIGS. 35A-35C, ordered tapered type silicon columns 115, 116, 117 and 118 are respectively formed by dry etching.

Figure 36A:
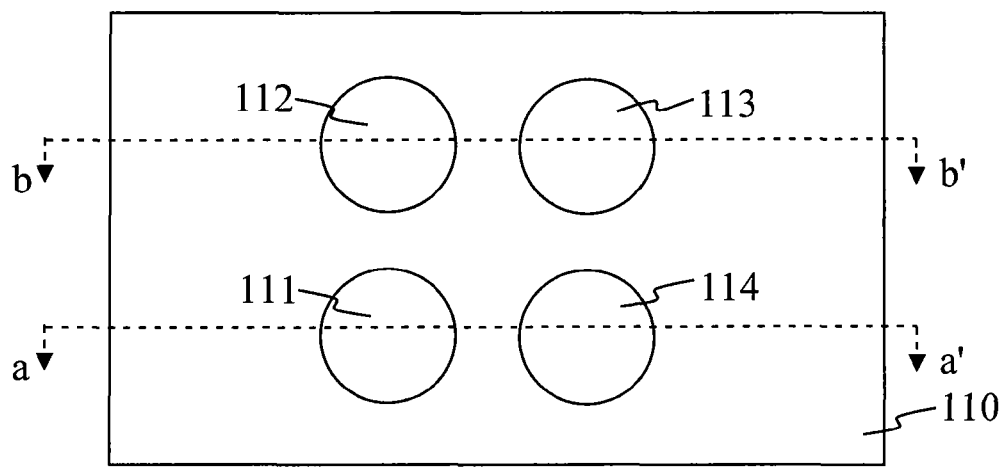
FIG. 36A is a top view showing an example of producing a semiconductor device according to a third embodiment of the present invention.
Figure 36B:
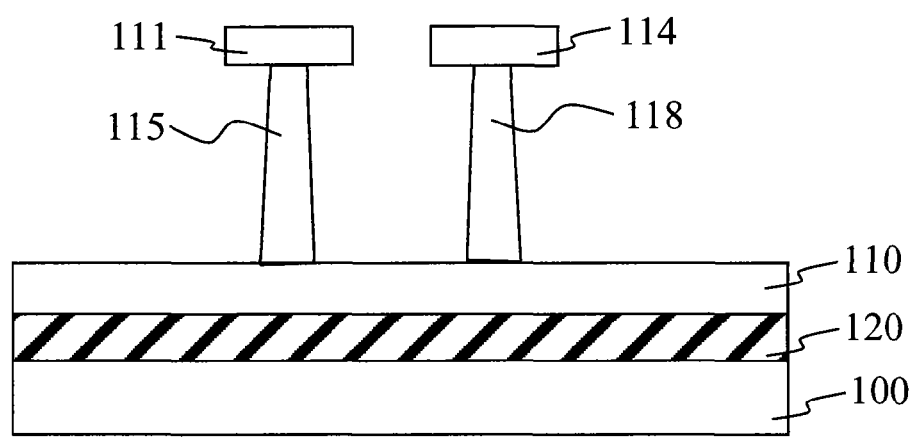
FIG. 36B is a cross-sectional view along line a-a' of the semiconductor device in FIG. 36A showing an example of producing a semiconductor device according to a third embodiment of the present invention.
Figure 36C:
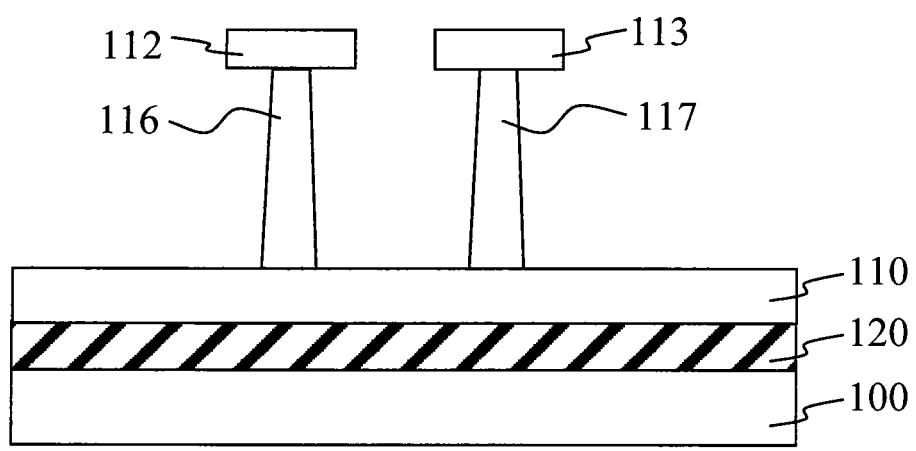
FIG. 36C is a cross-sectional view along line b-b' of the semiconductor device in FIG. 36A showing an example of producing a semiconductor device according to a third embodiment of the present invention.

As shown in FIG. 36A-FIG. 36C, nitride films 136, 137, 138 and 139, and oxide films 121, 122, 123 and 124 are removed.

Figure 37A:
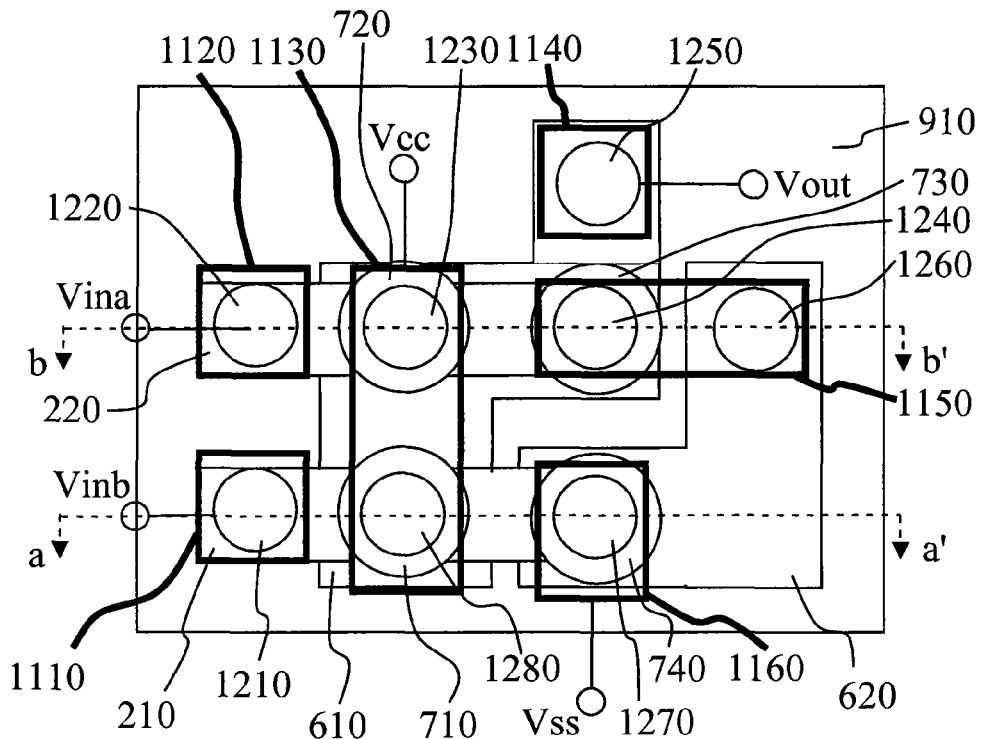
FIG. 37A is a top view showing an example of producing a semiconductor device according to a third embodiment of the present invention.
Figure 37B:
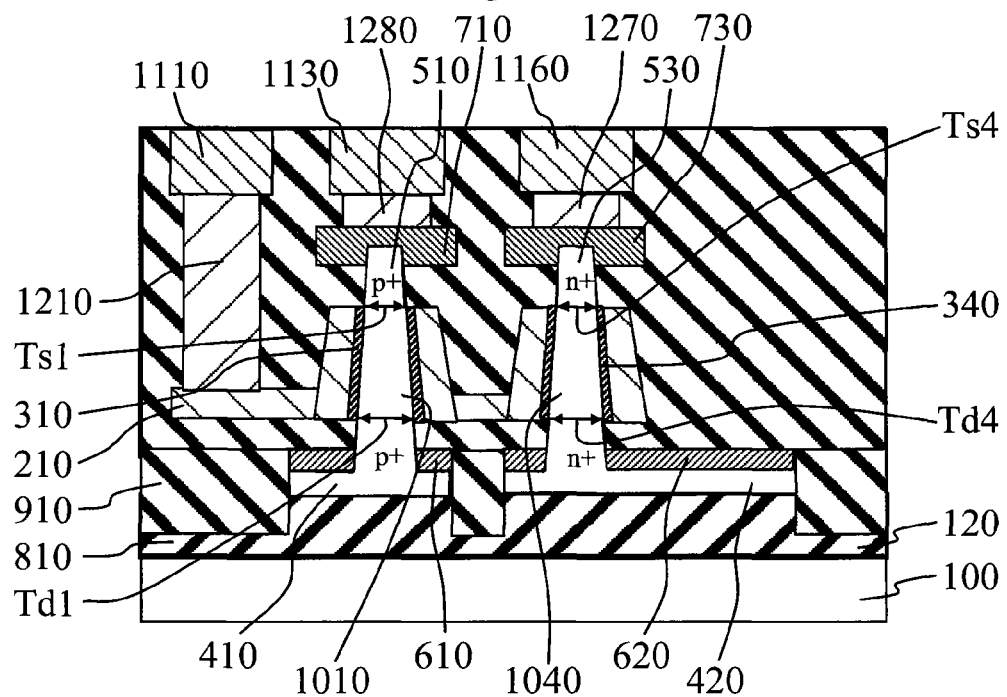
FIG. 37B is a cross-sectional view along line a-a' of the semiconductor device in FIG. 37A showing an example of producing a semiconductor device according to a third embodiment of the present invention.
Figure 37C:
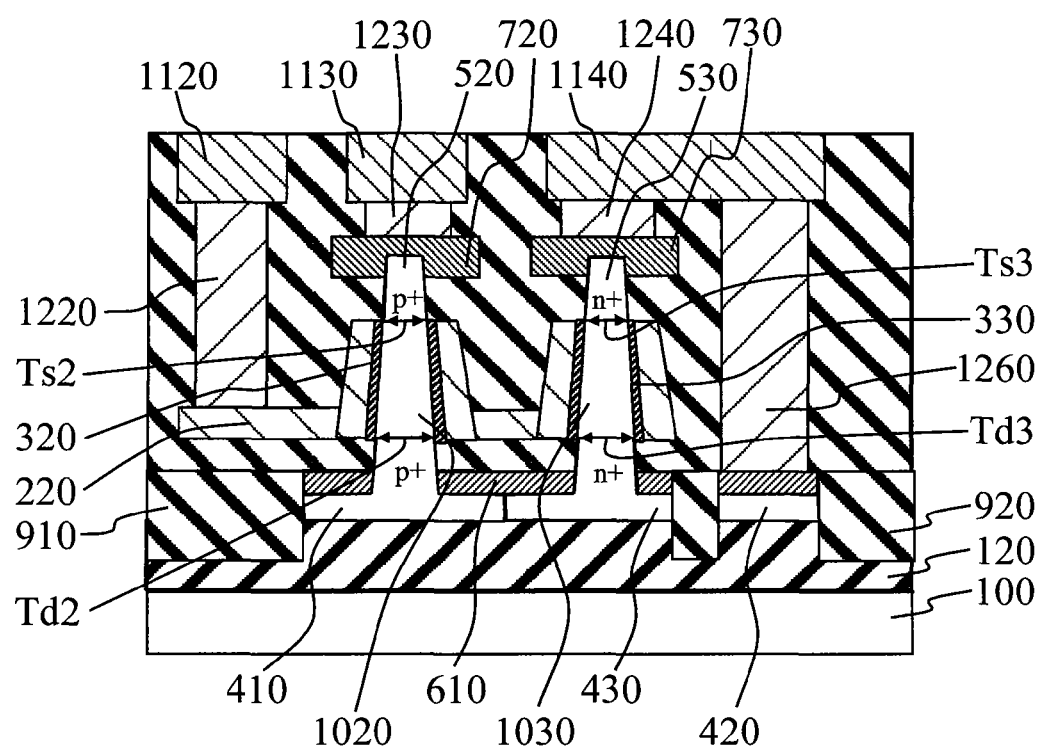
FIG. 37C is a cross-sectional view along line b-b' of the semiconductor device in FIG. 37A showing an example of producing a semiconductor device according to a third embodiment of the present invention.

As shown in FIG. 37A-FIG. 37C element separation insulating film 910, gate electrodes 210 and 220, contacts 1210, 1220, 1230, 1240, 1250, 1260, 1270 and 1280, and wiring 1110, 1120, 1130, 1140, 1150 and 1160 are formed.

Fourth Embodiment

Semiconductor Device

With the semiconductor device relating to the second embodiment, an SOI substrate is used as the substrate. The fourth embodiment shows a semiconductor device in which use is made of a bulk substrate as the substrate.

Figure 38:
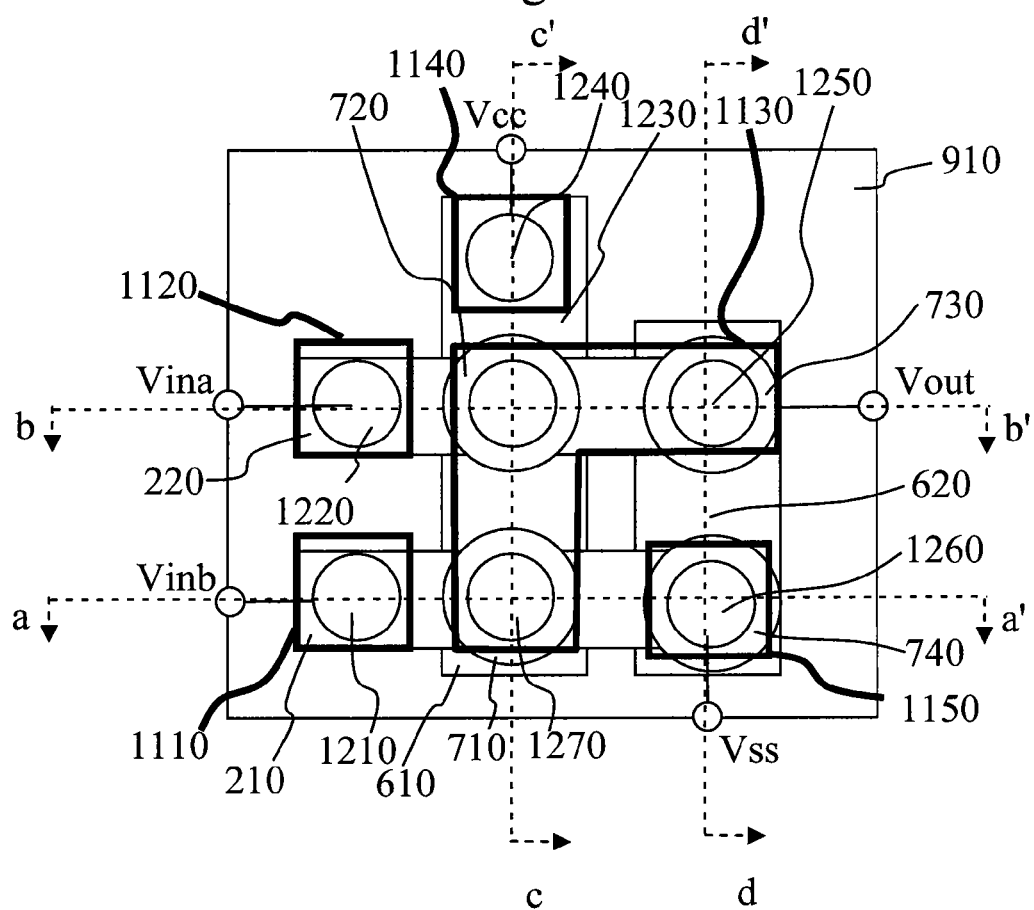
FIG. 38 is a summary top view of the semiconductor device relating to a fourth embodiment of the present invention functioning as a NAND circuit.
Figure 39:
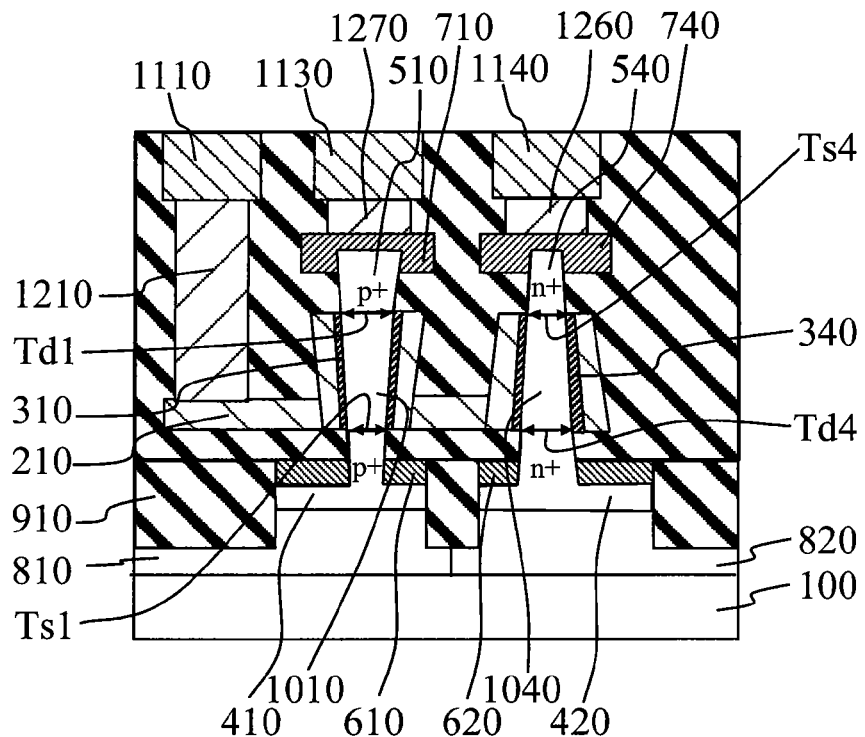
FIG. 39 is the line a-a' of the semiconductor device in FIG. 38.
Figure 40:
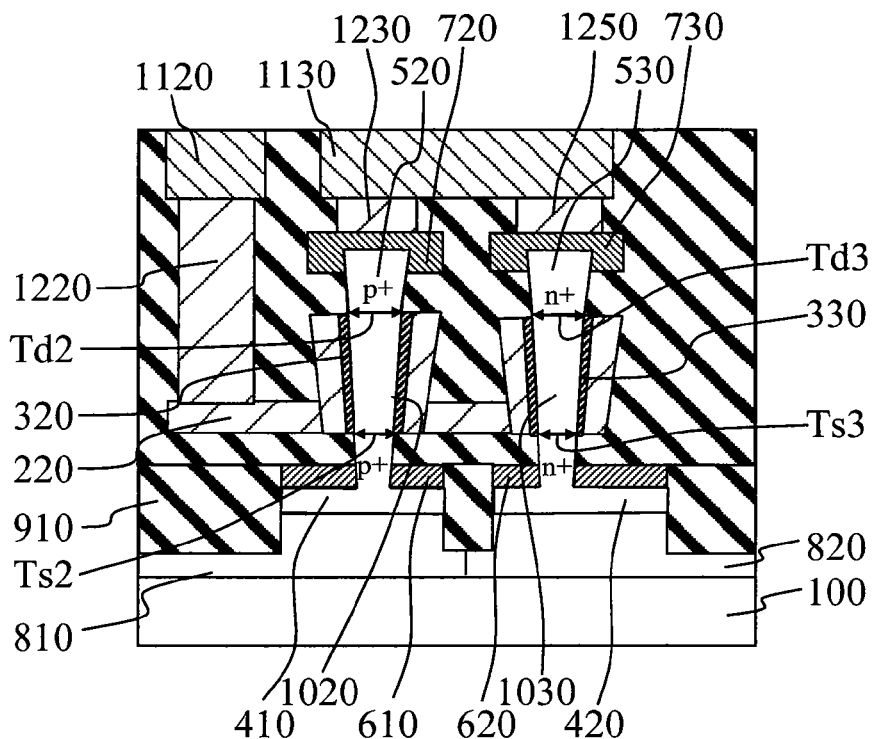
FIG. 40 is the line b-b' on a semi-conductor device in FIG. 38.
Figure 41:
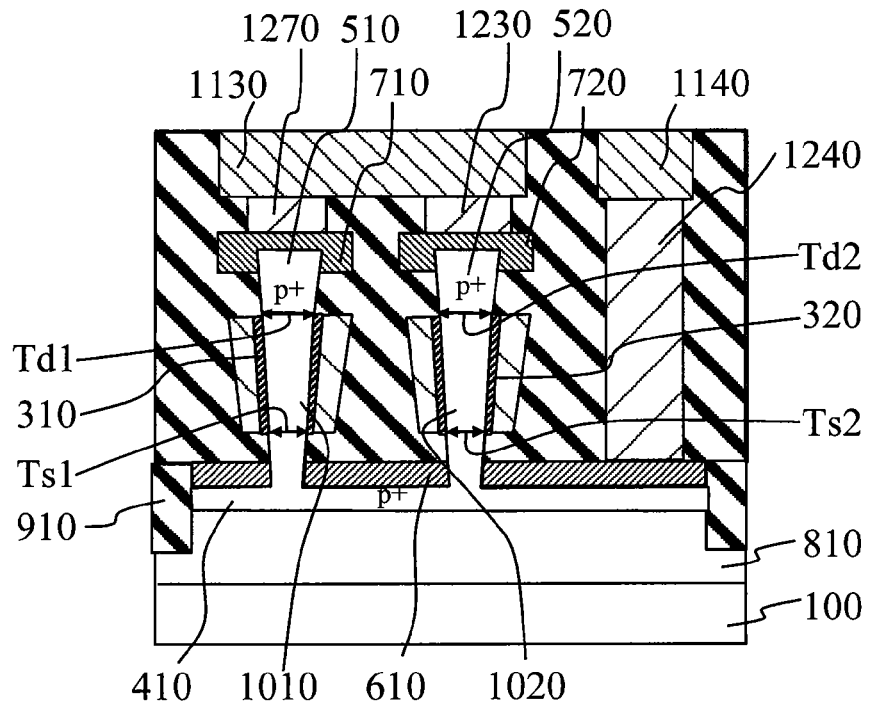
FIG. 41 is the line c-c' of the semiconductor device in FIG. 38.
Figure 42:
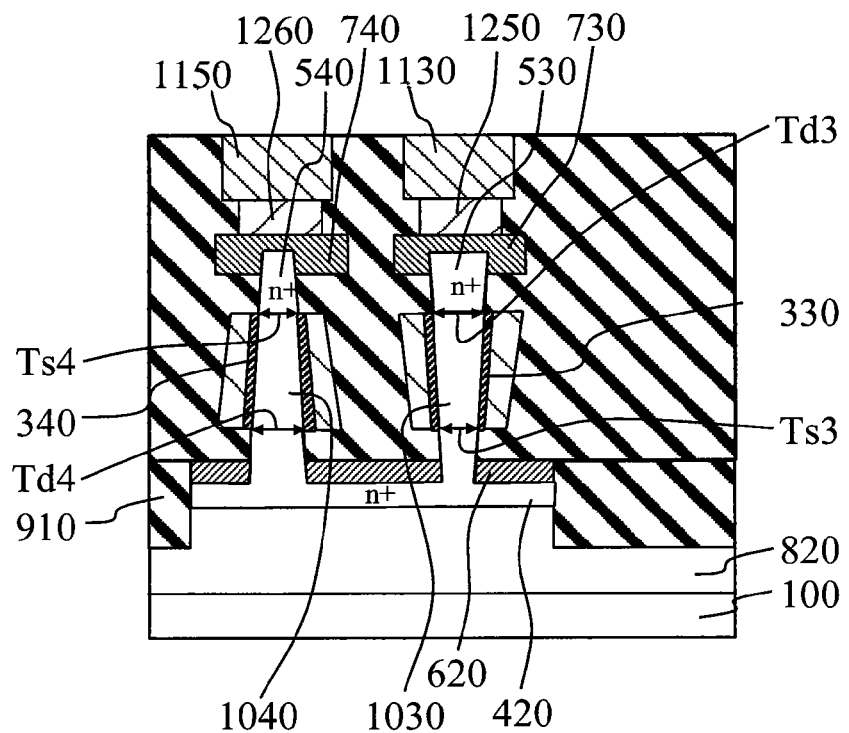
FIG. 42 is the line d-d' of the semiconductor device in FIG. 38.

FIG. 38 is a summary top view of a semiconductor device relating to the fourth embodiment of the present invention. FIG. 39 is a simplified cross-sectional view along the cut line a-a' of FIG. 38. FIG. 40 is a simplified cross-sectional view along the cut line b-b' of FIG. 38. FIG. 41 is a simplified cross-sectional view along the cut line c-c' of FIG. 38. FIG. 42 is a simplified cross-sectional view on the cut line d-d' of FIG. 38.

The semiconductor device relating to the present embodiment is composed from an SGT relating to 4 of the first embodiments arranged in the 2nd row 2nd column. Each SGT channel width is equal in terms of the length of the peripheral length of the silicon column. In the present embodiment, since the size of each SGT silicon column is equal, the width of each SGT channel is also equal.

The first SGT arranged in the 1st row 1st column is provided with a silicon column comprising a high resistance region. The silicon column 1010 forms a reverse taper circular truncated cone. In order to encompass the silicon column 1010, the first insulating body 310 is arranged on the side surface of the silicon column 1010. In order to encompass the first insulating body 310, gate electrode 210 is arranged on the side surface the first insulating body 310. On the lower part of the silicon column 1010 is arranged a p+ high-density impurity region 410 (source region), and on the upper part is arranged a p+ high-density impurity region 510 (drain region), respectively. The p+ high-density impurity region 410 is arranged on the N well 810. On the upper part of the p+ high-density impurity region 410 is arranged a silicide region 610, and on the upper part of the p+ high-density impurity region 510 is arranged a silicide region 710. On the silicide region 710 is arranged a contact 1270.

The diameter Ts1 of the contact cross-sectional surface between the silicon column 1010 and the p+ high-density impurity region 410 is smaller than the diameter Td1 of the contact cross-sectional surface between the silicon column 1010 and the p+ high-density impurity region 510.

The second SGT arranged in the 2nd row 1st column is provided with a silicon column comprising a high resistance region. The silicon column 1020 forms a reverse taper circular truncated cone. In order to encompass the silicon column 1020, the first insulating body 320 is arranged on the side surface of the silicon column 1020. In order to encompass the first insulating body 320, gate electrode 220 is arranged on the side surface the first insulating body 320. On the lower part of the silicon column 1020 is arranged a p+ high-density impurity region 410 (source region), and on the upper part is arranged a p+ high-density impurity region 520 (drain region), respectively.

The p+ high-density impurity region 410 is arranged on the N well 810. On the upper part of the p+ high-density impurity region 410 is formed a silicide region 610, and on the upper part of the p+ high-density impurity region 520 is formed a silicide region 720, respectively. On the silicide region 720 is arranged a contact 1230.

The diameter Ts2 of the contact cross-sectional surface between the silicon column 1020 and the p+ high-density impurity region 410 is smaller than the diameter Td2 of the contact cross-sectional surface between the silicon column 1020 and the p+ high-density impurity region 520.

The third SGT arranged in the 2nd row 2nd column is provided with a silicon column 1030 comprising a high resistance region. The silicon column 1030 forms an overall reverse taper circular truncated cone. In order to encompass the silicon column 1030, the first insulating body 330 is arranged on the side surface of the silicon column 1030. In order to encompass the first insulating body 330, gate electrode 220 is arranged on the side surface the first insulating body 330. On the lower part of the silicon column 1030 is arranged an n+ high-density impurity region 420 (source region), and on the upper part is arranged an n+ high-density impurity region 530 (drain region), respectively.

The n+ high-density impurity region 420 is arranged on the N well 810. On the upper part of the n+ high-density impurity region 420 is formed a silicide region 620, and on the upper part of the n+ high-density impurity region 530 is formed a silicide region 730, respectively.

On the silicide region 730 is arranged a contact 1250. On the contact 1250 is arranged metal wiring 1130. The metal wiring 1130 is connected to the first SGT contact 1270 and to the second SGT contact 1230 and to the Output Electric Potential Vout. With the third SGT, the diameter Ts3 of the contact cross-sectional surface between the silicon column 1030 and the n+ high density impurity region 410 is smaller than the diameter Td3 of the contact cross-sectional surface between the silicon column 1030 and the n+ high density impurity region 530.

The fourth SGT arranged in the 1st row 2nd column is provided with a silicon column 1040 comprising a high resistance region. The silicon column 1040, as an entirety, forms an ordered tapered circular truncated cone. In order to encompass the silicon column 1040, the first insulating body 340 is arranged on the side surface of the silicon column 1040. In order to encompass the first insulating body 340, gate electrode 210 is arranged on the side surface the first insulating body 340. On the lower part of the silicon column 1040 is arranged an n+ high-density impurity region 420 (drain region), and on the upper part is arranged an n+ high-density impurity region 540 (source region), respectively. The n+ high-density impurity region 420 is arranged on the P well 820. On the upper part of the n+ high-density impurity region 420 is formed a silicide region 620, and on the upper part of the n+ high-density impurity region 540 is formed a silicide region 740, respectively. On the silicide region 740 is arranged a contact 1260. On the contact 1260 is arranged metal wiring 1150. The metal wiring 1150 is connected to the Electric Ground Potential Vss.

With the fourth SGT, the diameter Ts4 of the contact cross-sectional surface between the silicon column 1040 and the n+ high density impurity region 540 is smaller than the diameter Td4 of the contact cross-sectional surface between the silicon column 1040 and the n+ high density impurity region 420.

In addition, on the first SGT gate electrode 210 is arranged a contact 1210. On contact 1210 is arranged metal wiring 1110. Metal wiring 1110 is connected to the second output electric potential Vinb. On the second SGT gate electrode 220 is arranged a contact 1220. On the contact 1220 is arranged metal wiring 1120.

Metal wiring 1120 is connected to the first output electric potential Vina. A silicide region 610 formed on the upper part of the second SGT n+ high-density impurity region 410 is connected to the electricity source potential Vcc through contact 1240 and metal wiring 1140. The silicide region 610 connected to the first SGT p+ high-density impurity region 410 is also connected to the second SGT p+ high-density impurity region.

The silicide region 620 connected to the third SGT n+ high-density impurity region 420 is also connected to the fourth SGT n+ high-density impurity region. In addition, an element separation insulating film 910 is formed on the side surface of the p+ high-density impurity region 410 and the n+ high-density impurity region 420.

With the present embodiment, all of the transistors composing the electronic circuits have the same structure as transistors relating to the first embodiment. Since it is capable of high speed operation, the semiconductor device relating to the present embodiment also is capable of high speed operation. In addition, since utilization is made of a bulk substrate as the substrate, in comparison with the use of an SOI substrate, the production costs can be maintained at low cost.

Next, an example of a production method of the semiconductor device related to the fourth embodiment of the present invention is explained, with reference to FIG. 43A-FIG. 54C. Moreover, with these drawings, the same labels are applied to the same structural elements. In FIG. 43A-FIG. 54, A is a planar view, B is a cross-sectional view along the line a-a', and C is a cross-sectional view along the line b-b'.

Figure 43A:
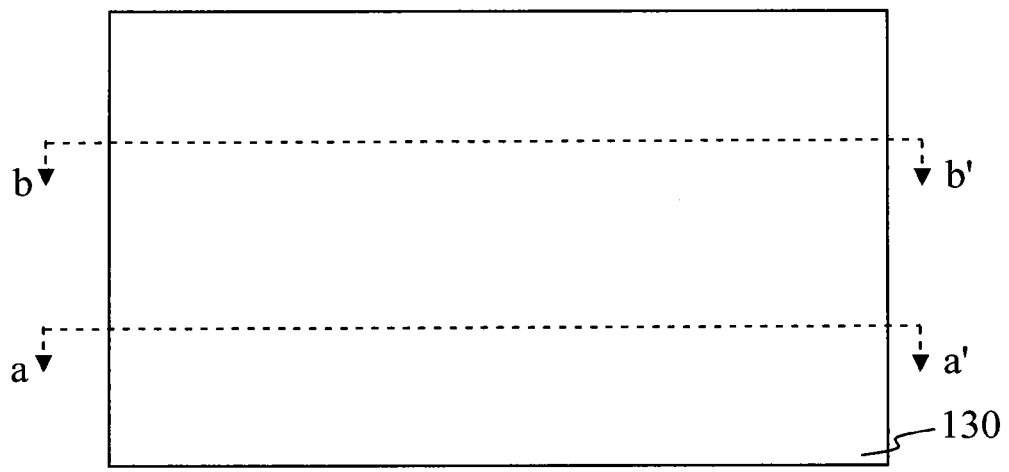
FIG. 43A is a top view showing an example of producing a semiconductor device according to a fourth embodiment of the present invention.
Figure 43B:
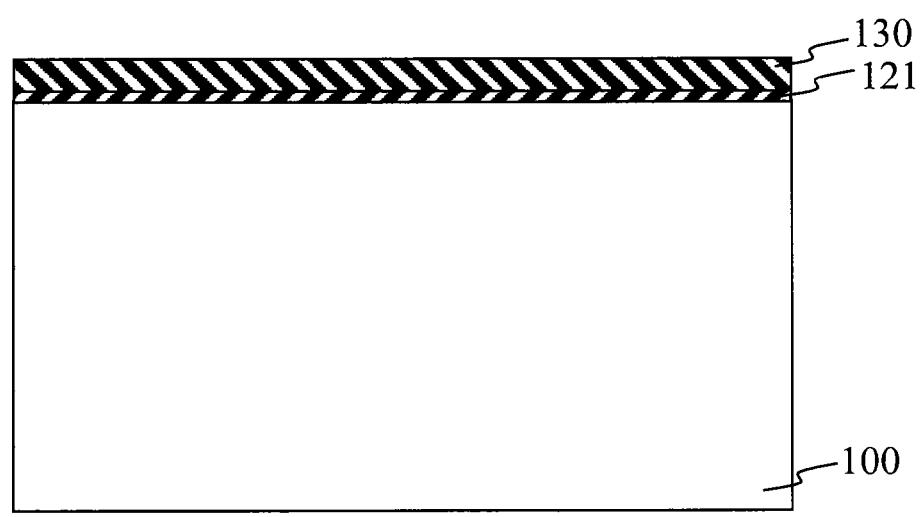
FIG. 43B is a cross-sectional view along line a-a' of the semiconductor device in FIG. 43A showing an example of producing a semiconductor device according to a fourth embodiment of the present invention.
Figure 43C:
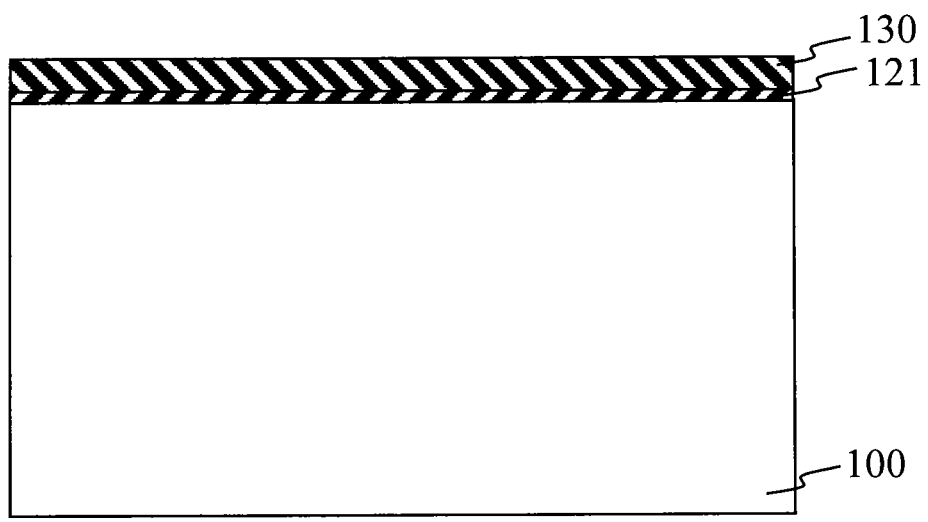
FIG. 43C is a cross-sectional view along line b-b' of the semiconductor device in FIG. 43A showing an example of producing a semiconductor device according to a fourth embodiment of the present invention.

As shown in FIG. 43A-FIG. 43C, a pad oxide file 121 and nitride film 130 are chronologically formed on the Si substrate 100.

Figure 44A:
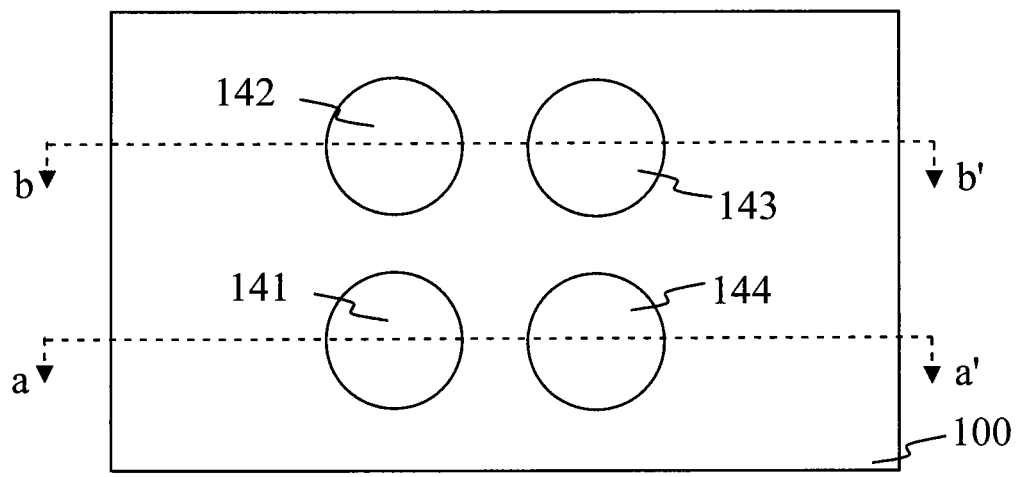
FIG. 44A is a top view showing an example of producing a semiconductor device according to a fourth embodiment of the present invention.
Figure 44B:
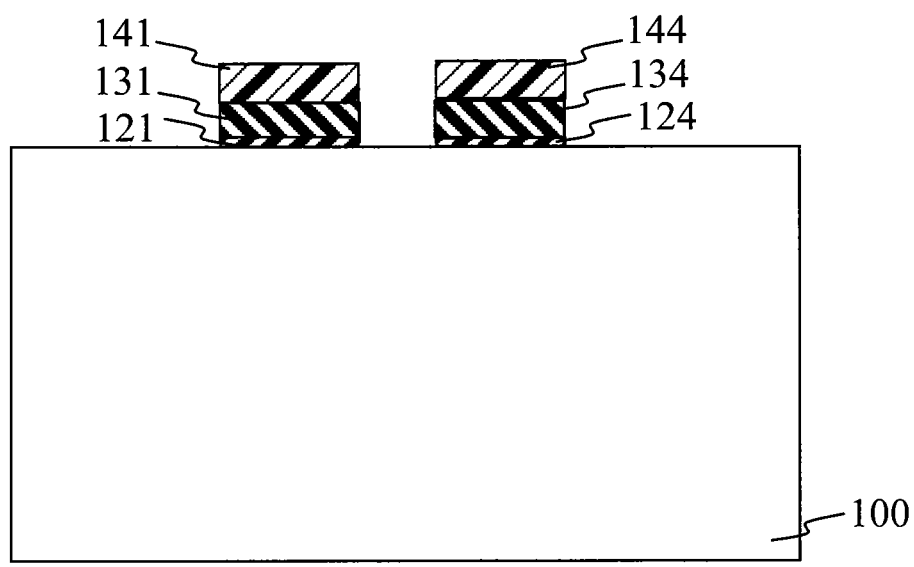
FIG. 44B is a cross-sectional view along line a-a' of the semiconductor device in FIG. 44A showing an example of producing a semiconductor device according to a fourth embodiment of the present invention.
Figure 44C:
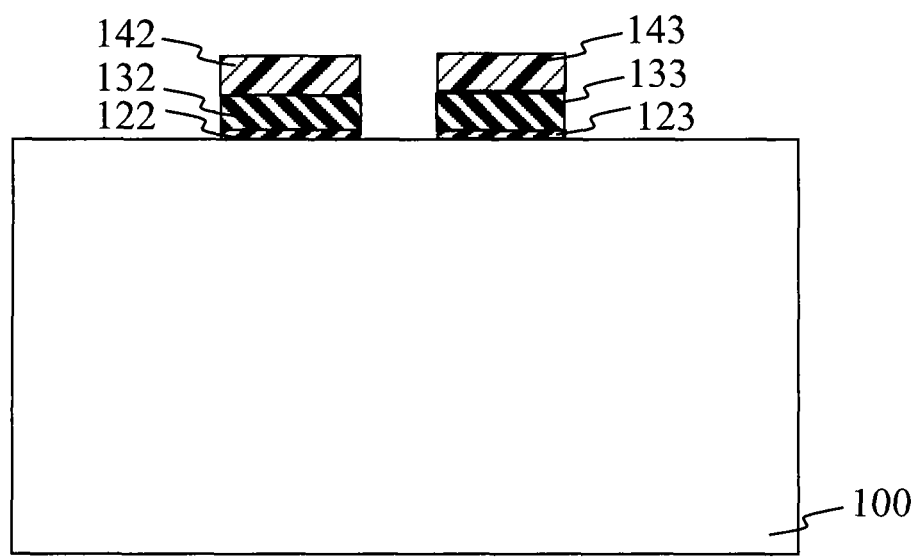
FIG. 44C is a cross-sectional view along line b-b' of the semiconductor device in FIG. 44A showing an example of producing a semiconductor device according to a fourth embodiment of the present invention.
Figure 45A:
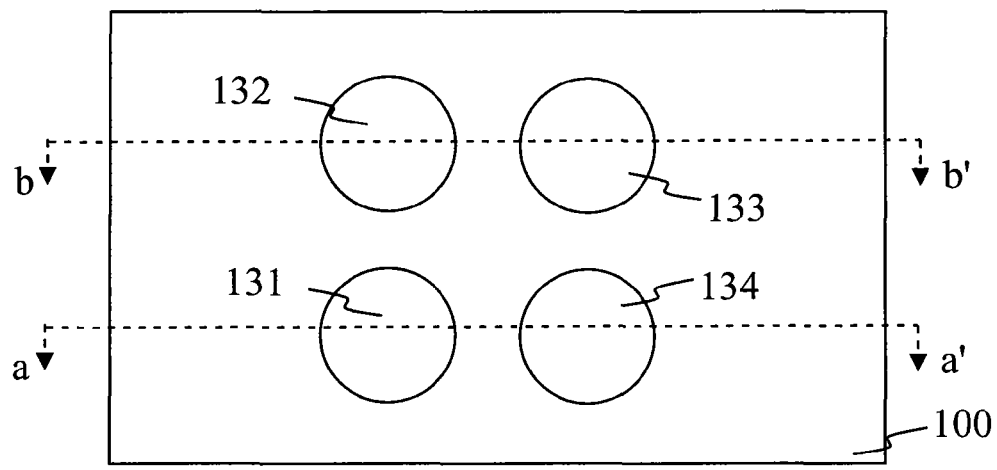
FIG. 45A is a top view showing an example of producing a semiconductor device according to a fourth embodiment of the present invention.
Figure 45B:
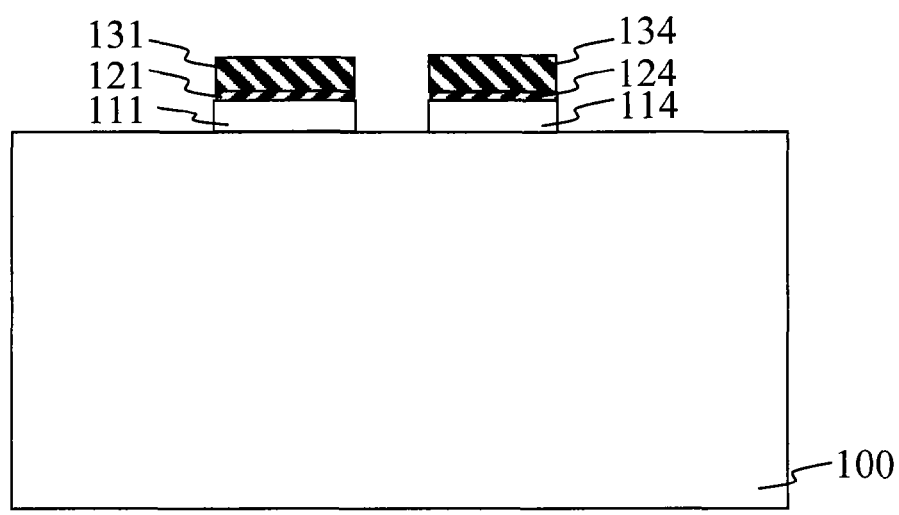
FIG. 45B is a cross-sectional view along line a-a' of the semiconductor device in FIG. 45A showing an example of producing a semiconductor device according to a fourth embodiment of the present invention.
Figure 45C:
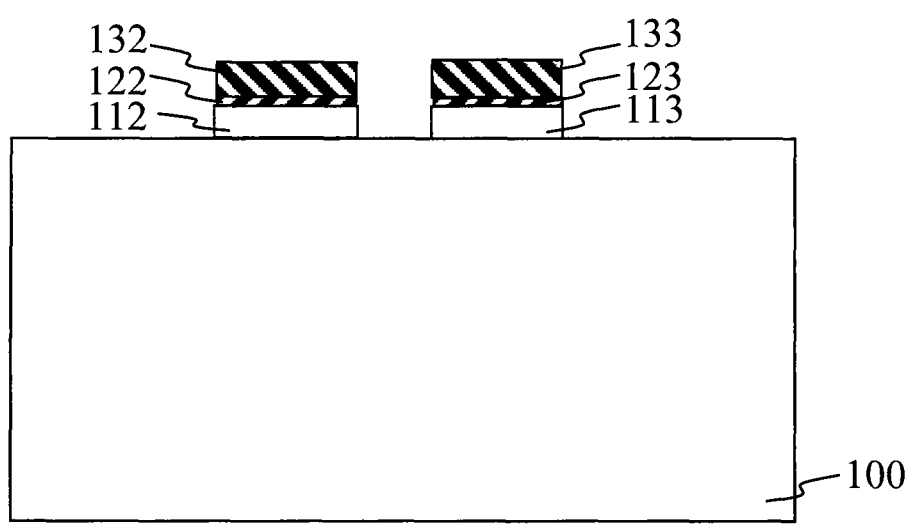
FIG. 45C is a cross-sectional view along line b-b' of the semiconductor device in FIG. 45A showing an example of producing a semiconductor device according to a fourth embodiment of the present invention.

Resist patterns 141, 142, 143 and 144 are formed in a scheduled location which forms the silicon column. Continuing, by means of dry etching, using the resists patterns 141, 142, 143 and 144, nitride films 131, 132, 133 and 134, and oxide films 121, 122, 123 and 124 are respectively formed in a cylindrical shape. The semiconductor device involved in these steps is shown in FIG. 44A-FIG. 44C. Continuing, resist patterns 141, 142, 143 and 144 are removed.

By means of etching, silicon columns 111, 112, 113 and 114 are respectively formed below the cylindrical nitride films 131, 132, 133 and 134. The semiconductor device involved in these steps in explained in FIG. 45A-FIG. 45C.

Figure 46A:
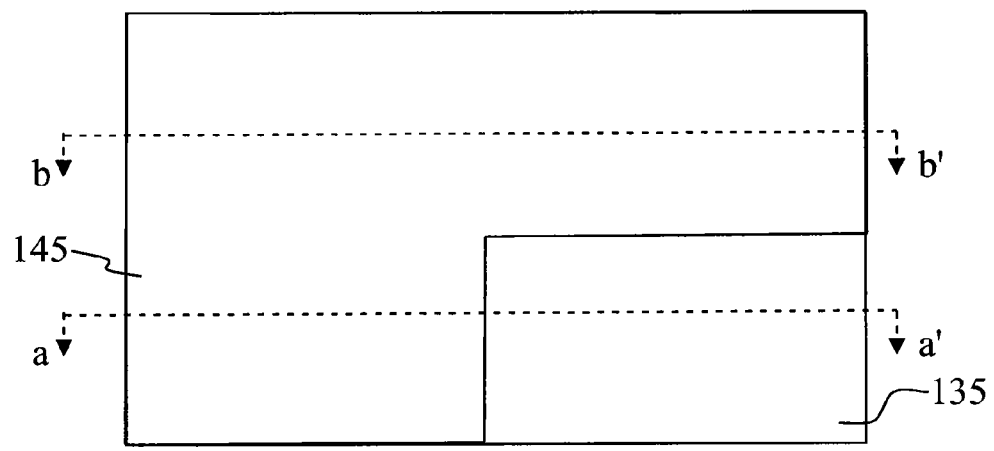
FIG. 46A is a top view showing an example of producing a semiconductor device according to a fourth embodiment of the present invention.
Figure 46B:
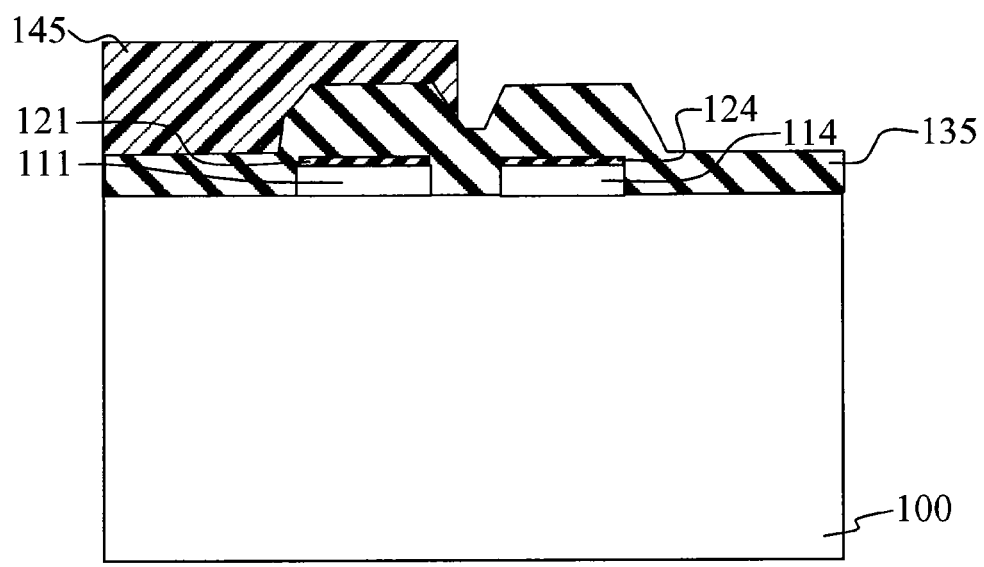
FIG. 46B is a cross-sectional view along line a-a' of the semiconductor device in FIG. 46A showing an example of producing a semiconductor device according to a fourth embodiment of the present invention.
Figure 46C:
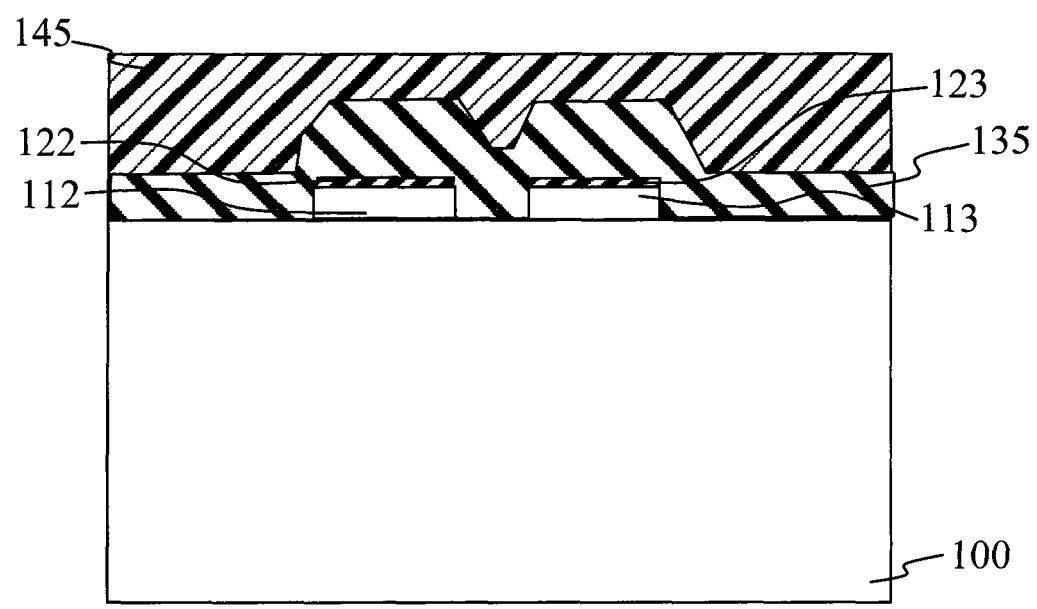
FIG. 46C is a cross-sectional view along line b-b' of the semiconductor device in FIG. 46A showing an example of producing a semiconductor device according to a fourth embodiment of the present invention.

A nitride film 135 is formed on the process results substance. Continuing, a resist pattern 145 is formed on the nitride film 135. The semiconductor device involved in these steps is shown in FIG. 46A-FIG. 46C. Moreover, nitride films 131, 132, 133 and 134 are embedded in the nitride film 135, and shown in the drawings as the unitized nitride film 135.

Figure 47A:
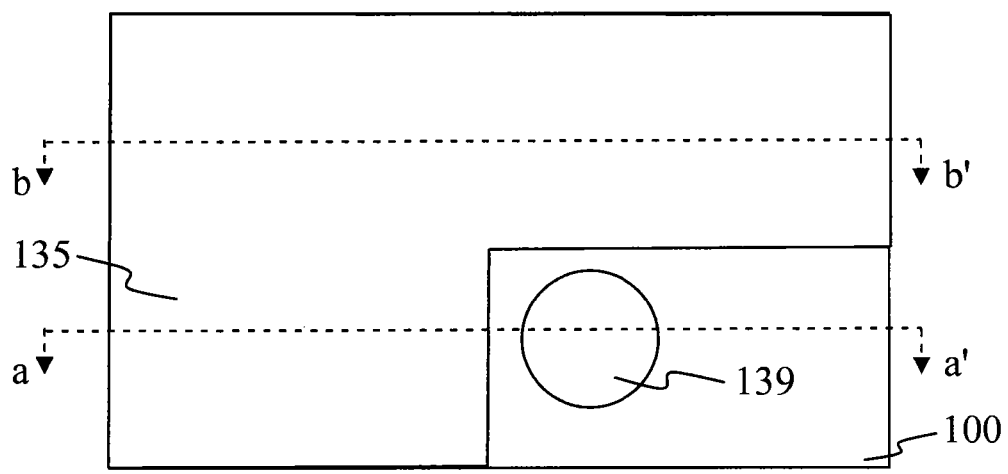
FIG. 47A is a top view showing an example of producing a semiconductor device according to a fourth embodiment of the present invention.
Figure 47B:
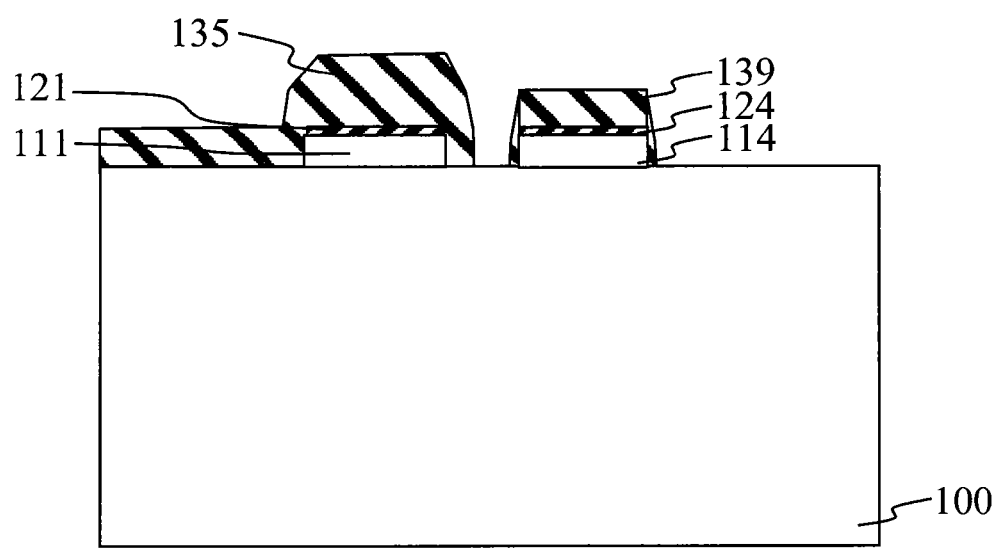
FIG. 47B is a cross-sectional view along line a-a' of the semiconductor device in FIG. 47A showing an example of producing a semiconductor device according to a fourth embodiment of the present invention.
Figure 47C:
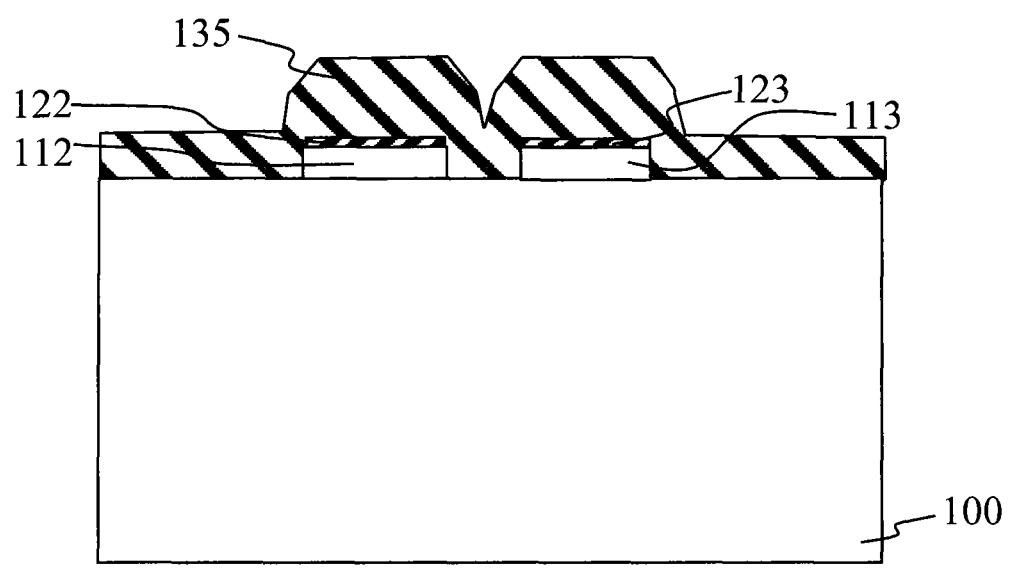
FIG. 47C is a cross-sectional view along line b-b' of the semiconductor device in FIG. 47A showing an example of producing a semiconductor device according to a fourth embodiment of the present invention.

Using resist pattern 145, nitride film 139 is formed by means of etching Continuing, the resist 145 is removed. The transistors involved in these steps are shown in FIGS. 47A-47C.

Figure 48A:
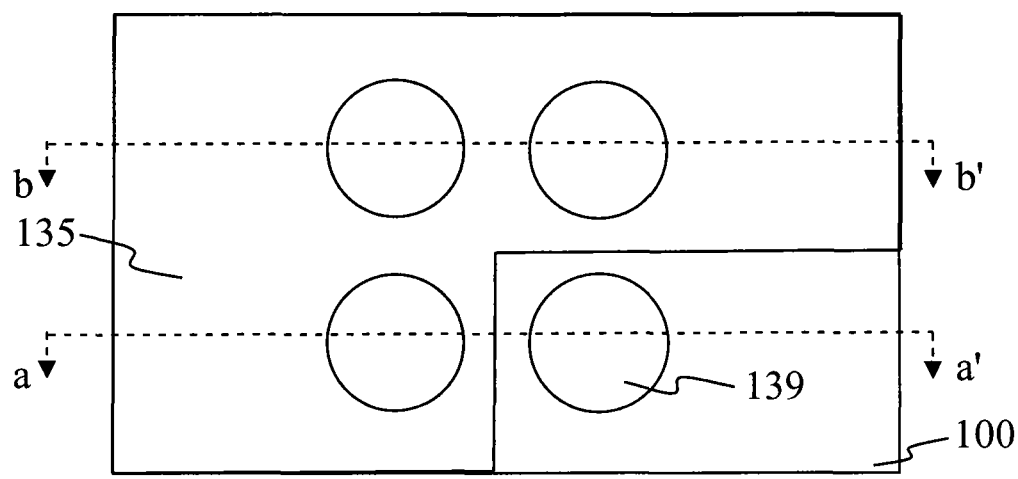
FIG. 48A is a top view showing an example of producing a semiconductor device according to a fourth embodiment of the present invention.
Figure 48B:
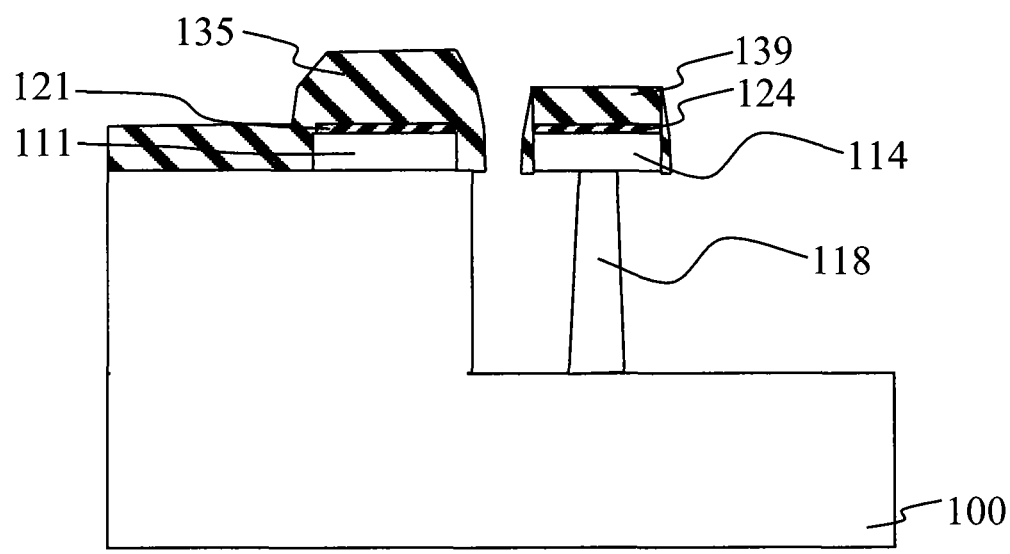
FIG. 48B is a cross-sectional view along line a-a' of the semiconductor device in FIG. 48A showing an example of producing a semiconductor device according to a fourth embodiment of the present invention.
Figure 48C:
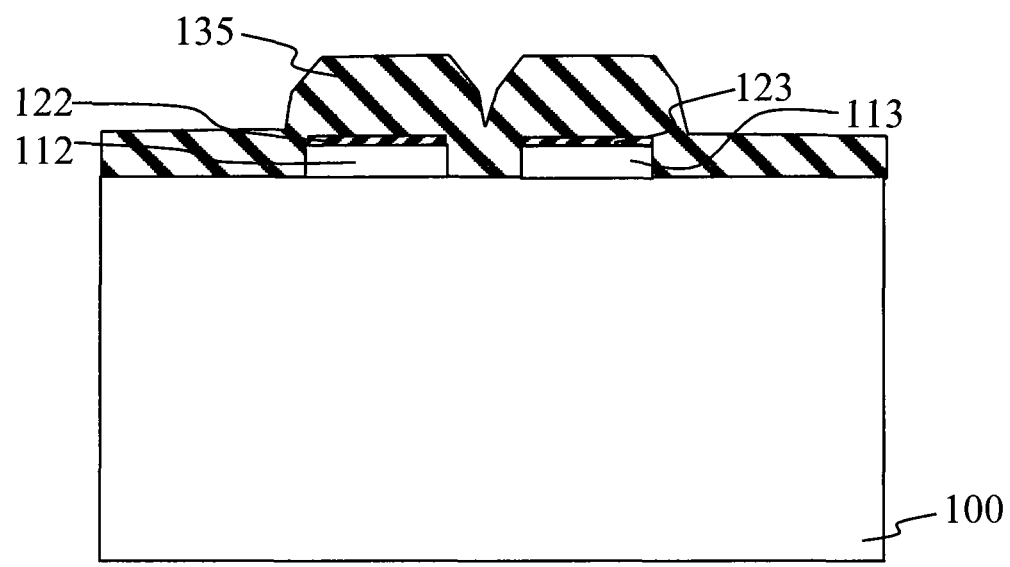
FIG. 48C is a cross-sectional view along line b-b' of the semiconductor device in FIG. 48A showing an example of producing a semiconductor device according to a fourth embodiment of the present invention.

Using nitride films 135 and 139, as shown in FIGS. 48A-48C, formation is accomplished of an ordered taper type silicon column 118, by means of dry etching.

Figure 49A:
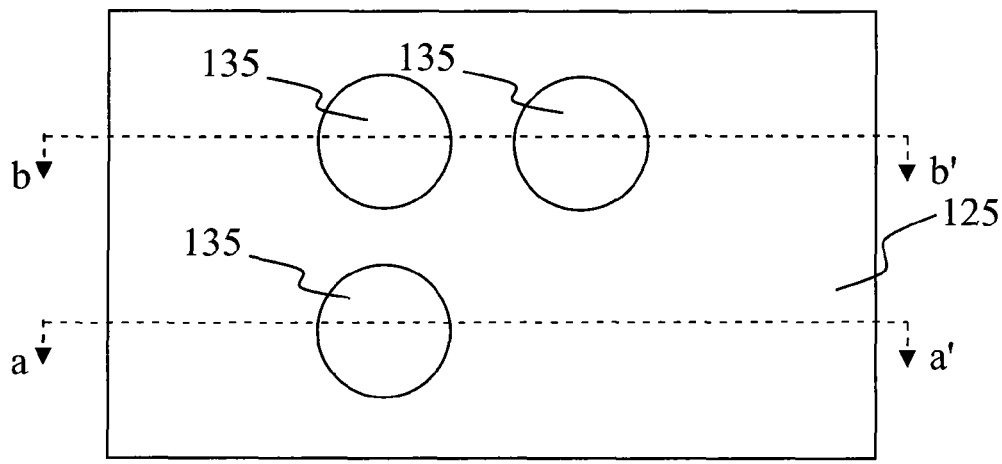
FIG. 49A is a top view showing an example of producing a semiconductor device according to a fourth embodiment of the present invention.
Figure 49B:
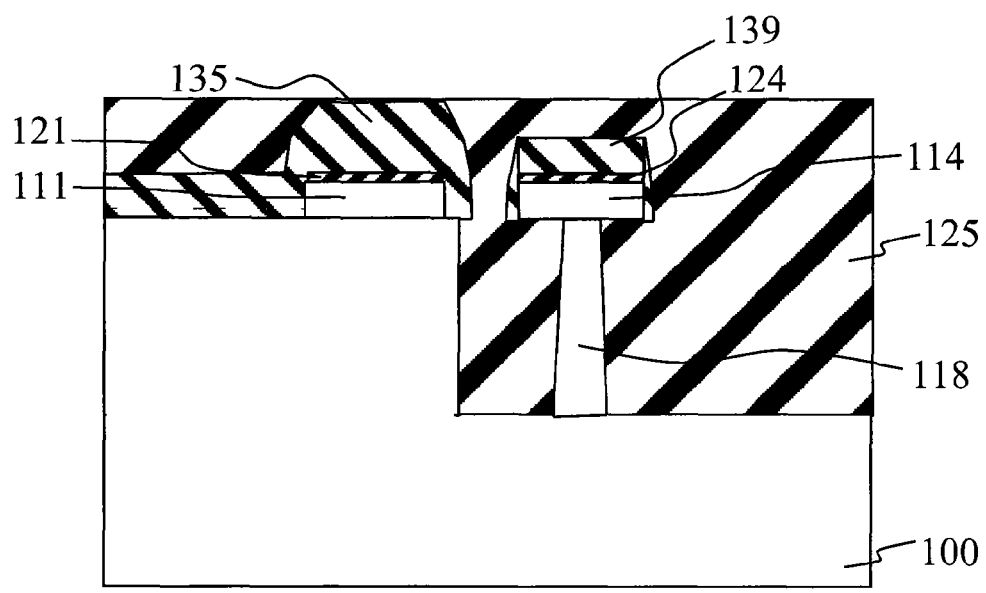
FIG. 49B is a cross-sectional view along line a-a' of the semiconductor device in FIG. 49A showing an example of producing a semiconductor device according to a fourth embodiment of the present invention.
Figure 49C:
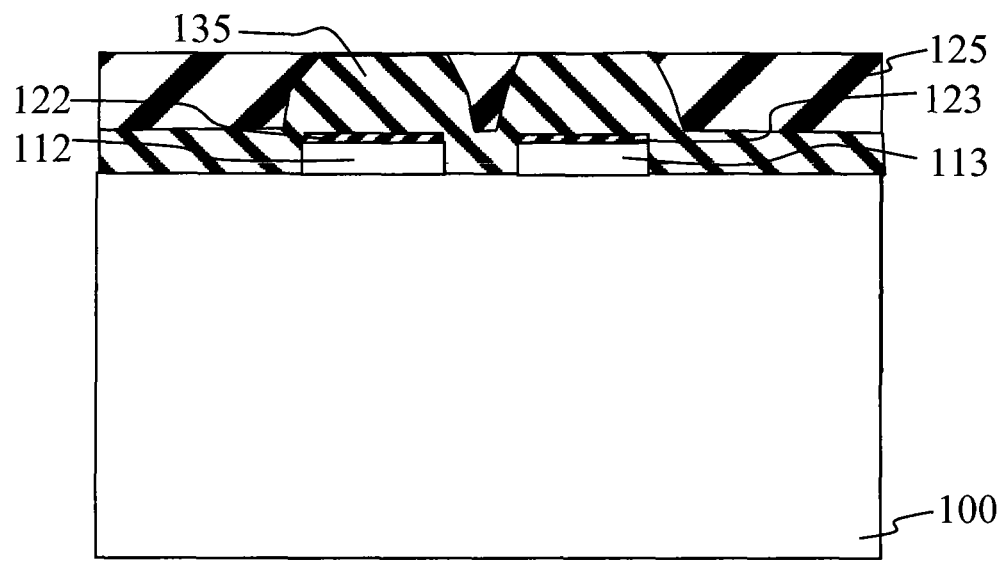
FIG. 49C is a cross-sectional view along line b-b' of the semiconductor device in FIG. 49A showing an example of producing a semiconductor device according to a fourth embodiment of the present invention.

As shown in FIGS. 49A-49C, an oxide film is formed on the results substance forming oxide film 125, which is flattened by using a CMP.

Figure 50A:
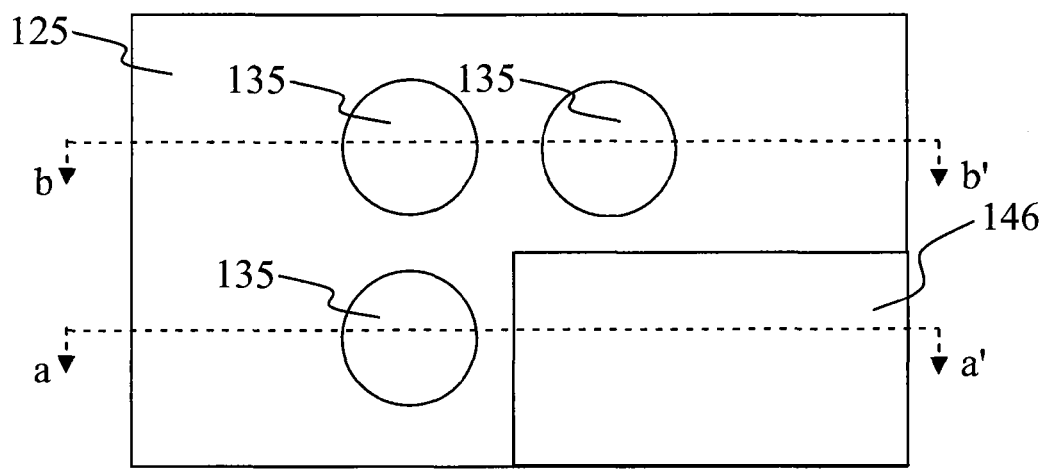
FIG. 50A is a top view showing an example of producing a semiconductor device according to a fourth embodiment of the present invention.
Figure 50B:
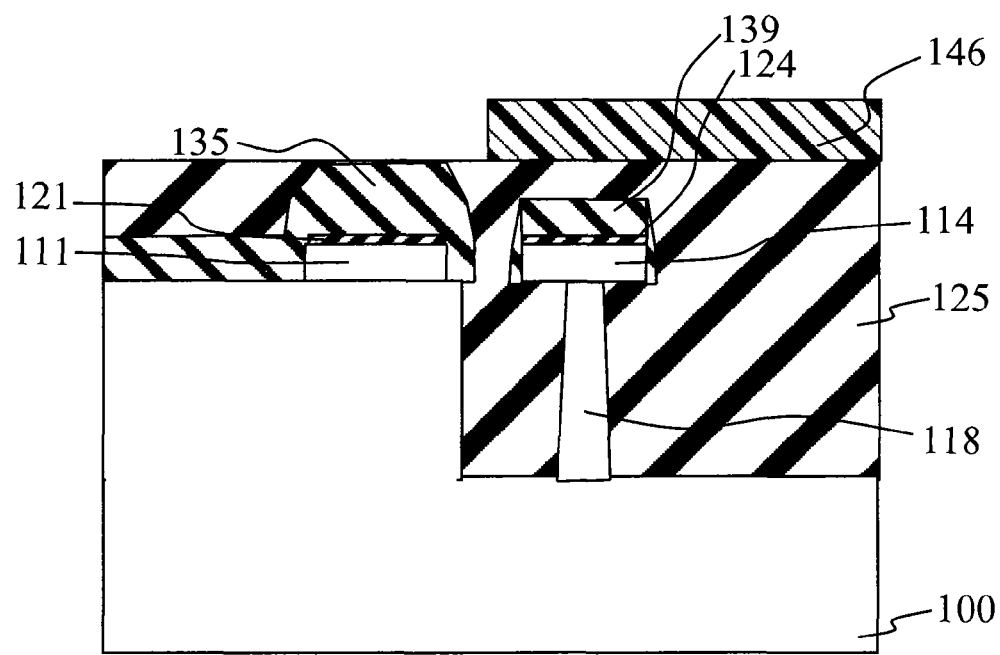
FIG. 50B is a cross-sectional view along line a-a' of the semiconductor device in FIG. 50A showing an example of producing a semiconductor device according to a fourth embodiment of the present invention.
Figure 50C:
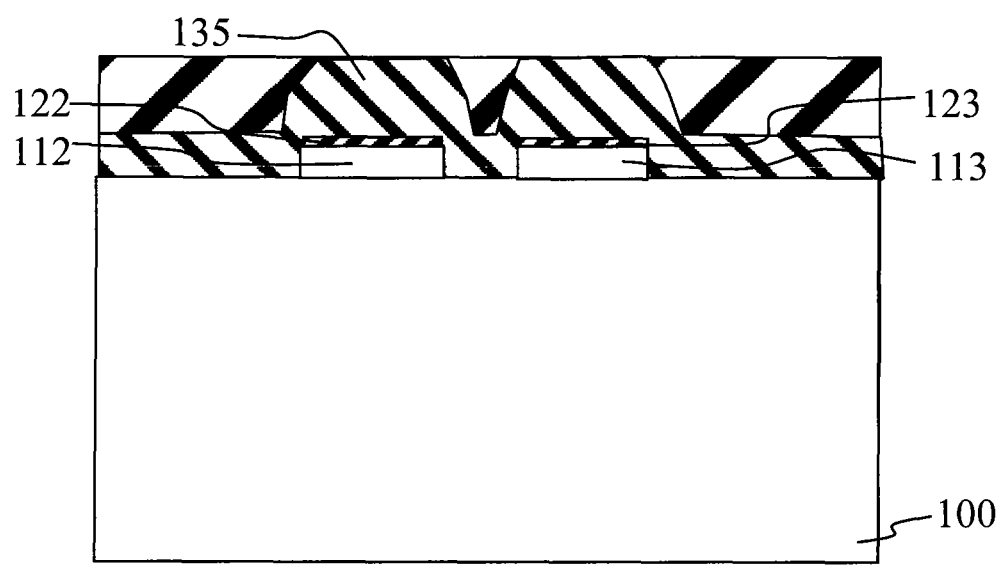
FIG. 50C is a cross-sectional view along line b-b' of the semiconductor device in FIG. 50A showing an example of producing a semiconductor device according to a fourth embodiment of the present invention.

As shown in FIG. 50A-FIG. 50C, on the above results substance is formed a resist pattern 146.

Figure 51A:
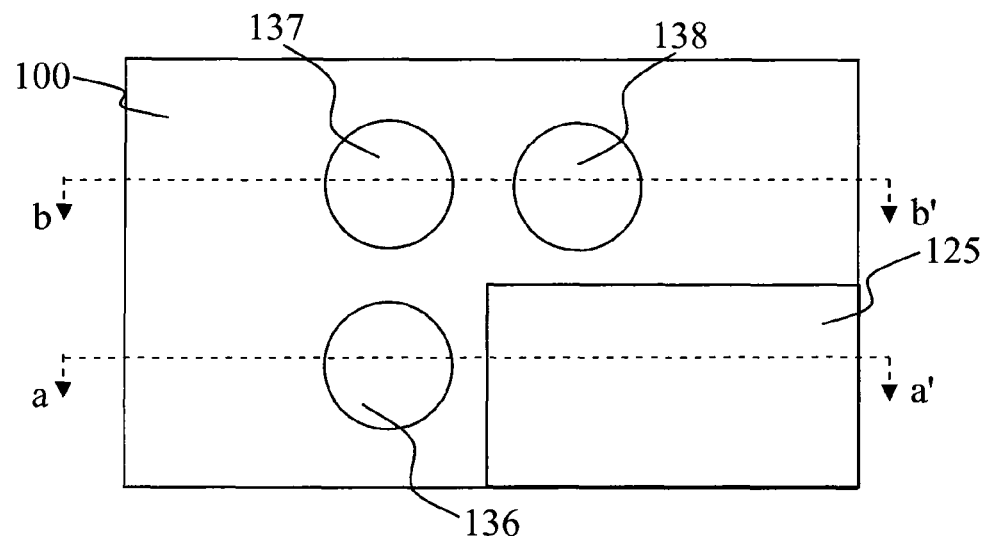
FIG. 51A is a top view showing an example of producing a semiconductor device according to a fourth embodiment of the present invention.
Figure 51B:
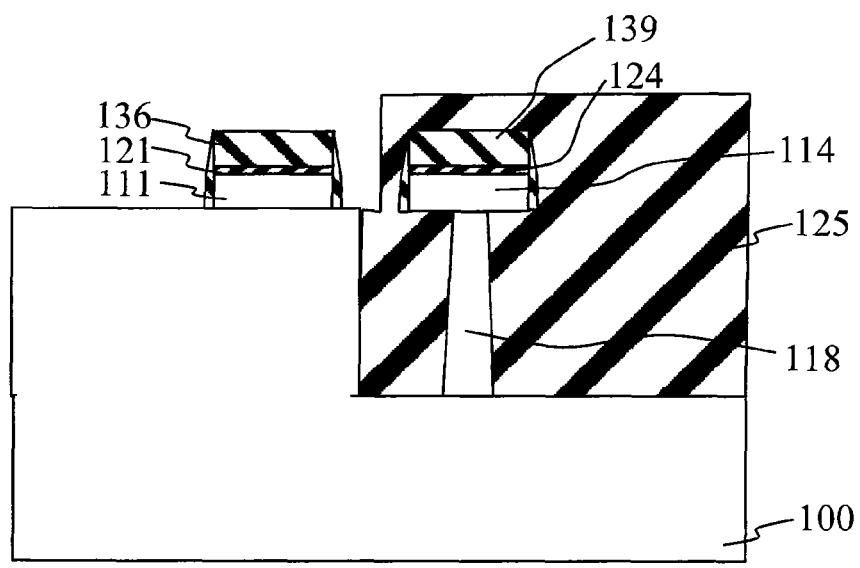
FIG. 51B is a cross-sectional view along line a-a' of the semiconductor device in FIG. 51A showing an example of producing a semiconductor device according to a fourth embodiment of the present invention.
Figure 51C:
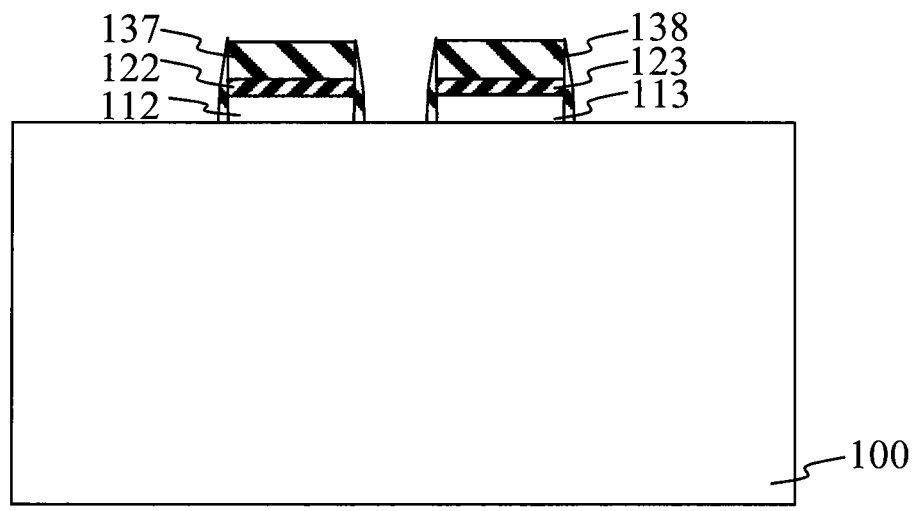
FIG. 51C is a cross-sectional view along line b-b' of the semiconductor device in FIG. 51A showing an example of producing a semiconductor device according to a fourth embodiment of the present invention.

Using the resist pattern 146, nitride films 136, 137 and 138 are formed by etching the oxide film 125 and the nitride film 135. Continuing, the resist pattern 146 is removed. The semiconductor transistor involved in this step is shown in FIG. 51A-FIG. 51C.

Figure 52A:
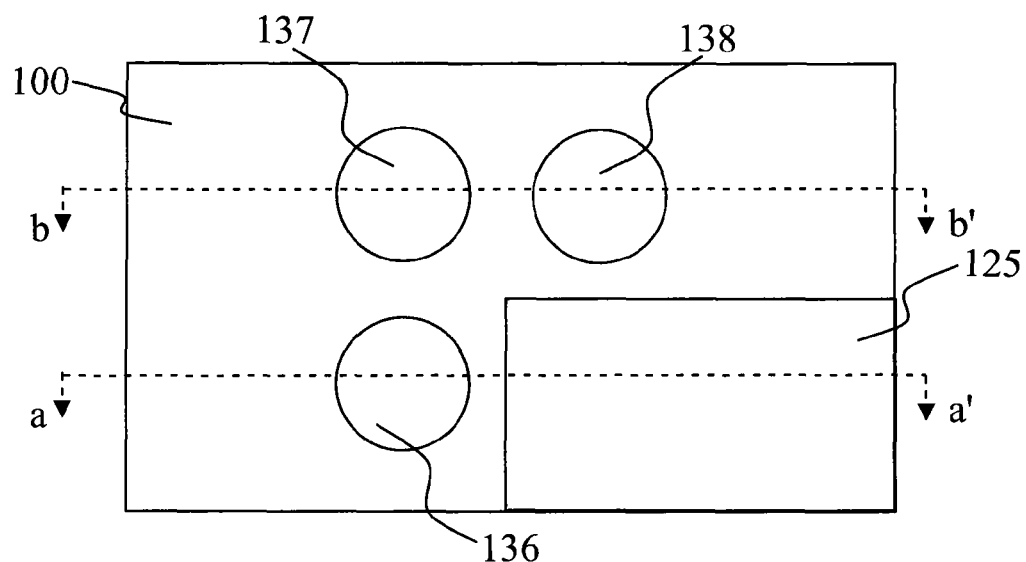
FIG. 52A is a top view showing an example of producing a semiconductor device according to a fourth embodiment of the present invention.
Figure 52B:
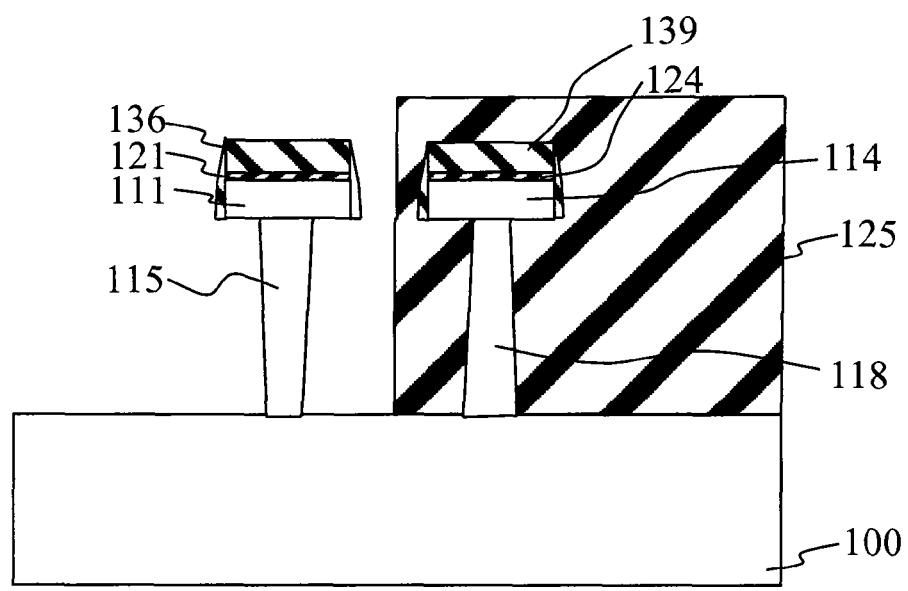
FIG. 52B is a cross-sectional view along line a-a' of the semiconductor device in FIG. 52A showing an example of producing a semiconductor device according to a fourth embodiment of the present invention.
Figure 52C:
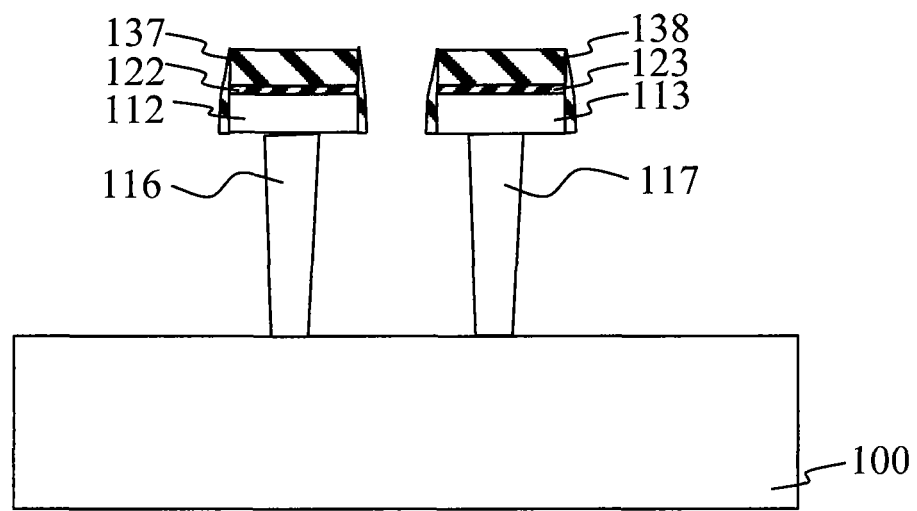
FIG. 52C is a cross-sectional view along line b-b' of the semiconductor device in FIG. 52A showing an example of producing a semiconductor device according to a fourth embodiment of the present invention.

As shown in FIGS. 52A-52C, using nitride films 136, 137 and 138, reversed taper silicon columns 115, 116 and 117 are respectively formed by dry etching.

Figure 53A:
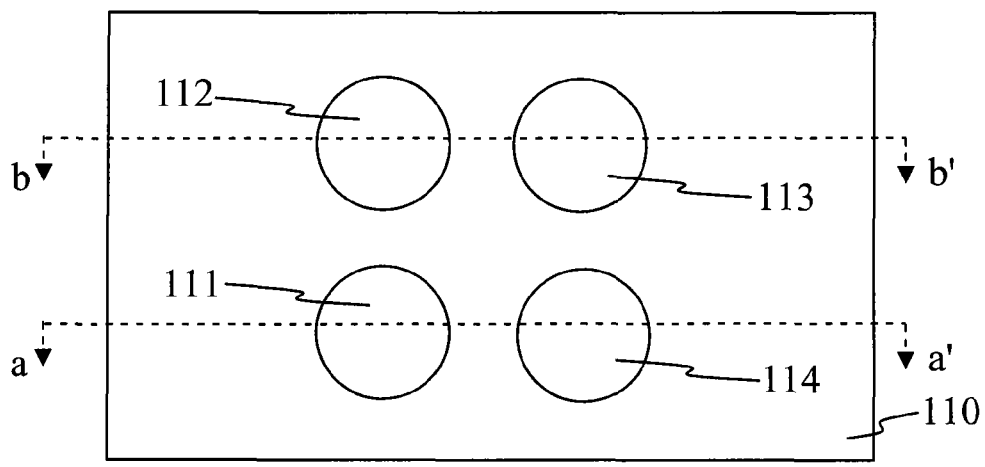
FIG. 53A is a top view showing an example of producing a semiconductor device according to a fourth embodiment of the present invention.
Figure 53B:
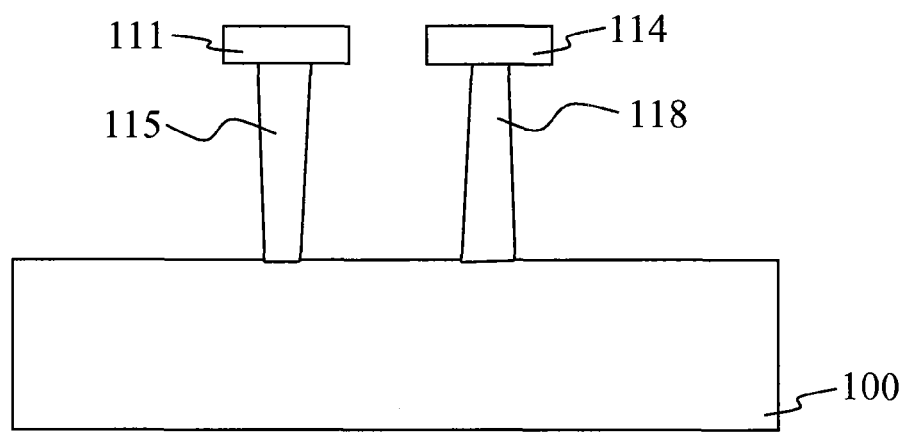
FIG. 53B is a cross-sectional view along line a-a' of the semiconductor device in FIG. 53A showing an example of producing a semiconductor device according to a fourth embodiment of the present invention.
Figure 53C:
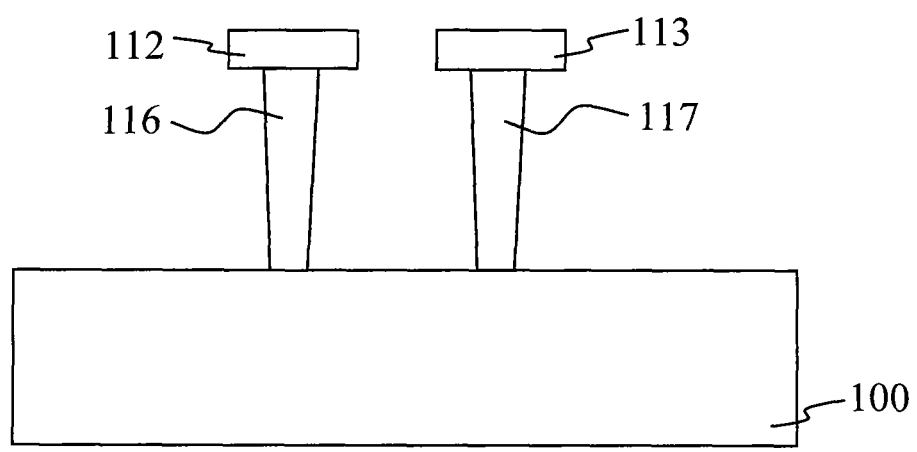
FIG. 53C is a cross-sectional view along line b-b' of the semiconductor device in FIG. 53A showing an example of producing a semiconductor device according to a fourth embodiment of the present invention.

As shown in FIG. 53A-FIG. 53C, the nitride films 136, 137, 138 and 139 and oxide films 121, 122, 123 and 124 are removed.

Figure 54A:
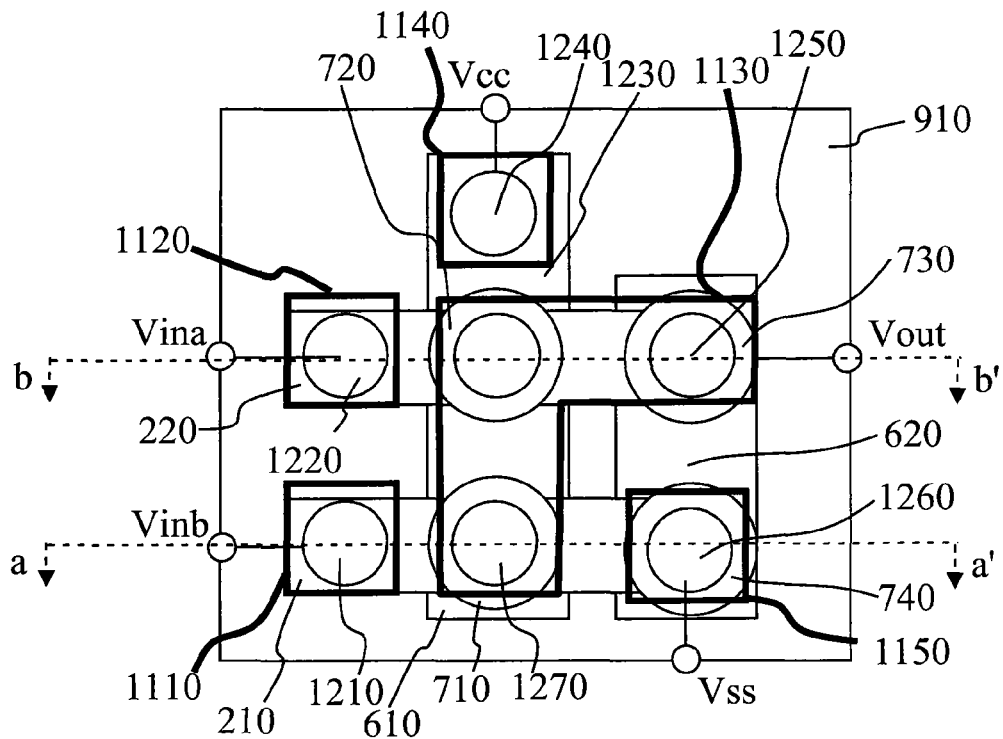
FIG. 54A is a top view showing an example of producing a semiconductor device according to a fourth embodiment of the present invention.
Figure 54B:
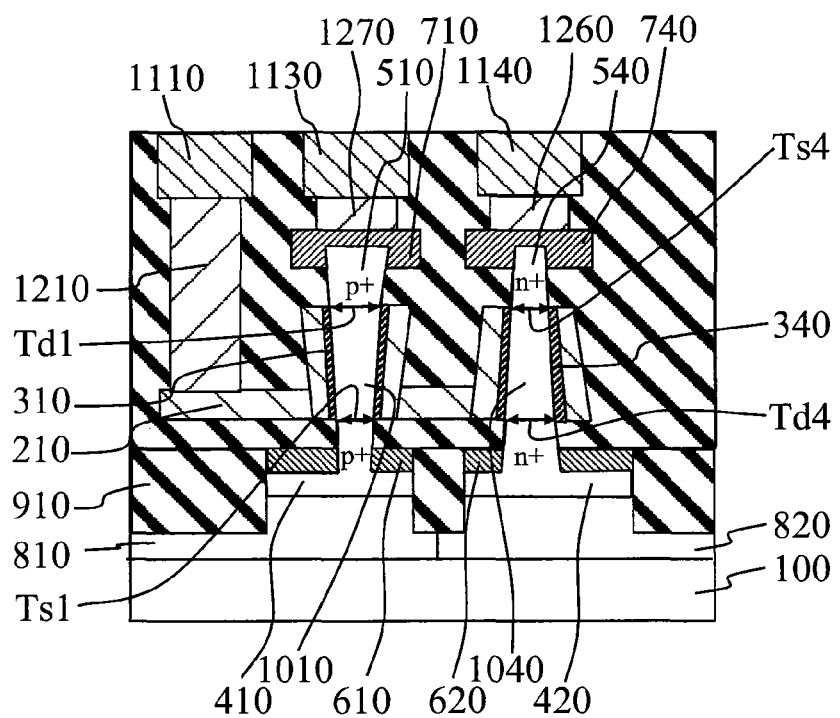
FIG. 54B is a cross-sectional view along line a-a' of the semiconductor device in FIG. 54A showing an example of producing a semiconductor device according to a fourth embodiment of the present invention.
Figure 54C:
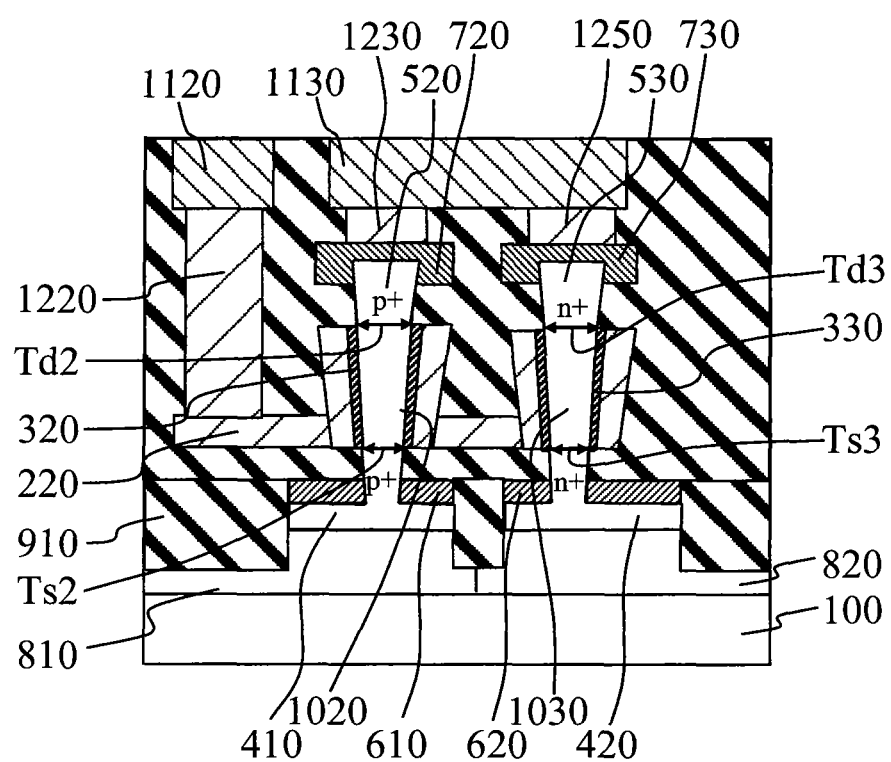
FIG. 54C is a cross-sectional view along line b-b' of the semiconductor device in FIG. 54A showing an example of producing a semiconductor device according to a fourth embodiment of the present invention.

As shown in FIG. 54A-FIG. 54C, element separation insulating film 910, gate electrodes 210, 220, contacts 1210, 1220, 1230, 1240, 1250, 1260 and 1270, and wiring 1110, 1120, 1130, 1140 and 1150 are formed.

Fifth Embodiment

Semiconductor Device

With the semiconductor device relating to the third embodiment, use is made of an SOI substrate as the substrate. With the fifth embodiment, a semiconductor device is explained which uses a bulk substrate as the substrate.

Figure 55:
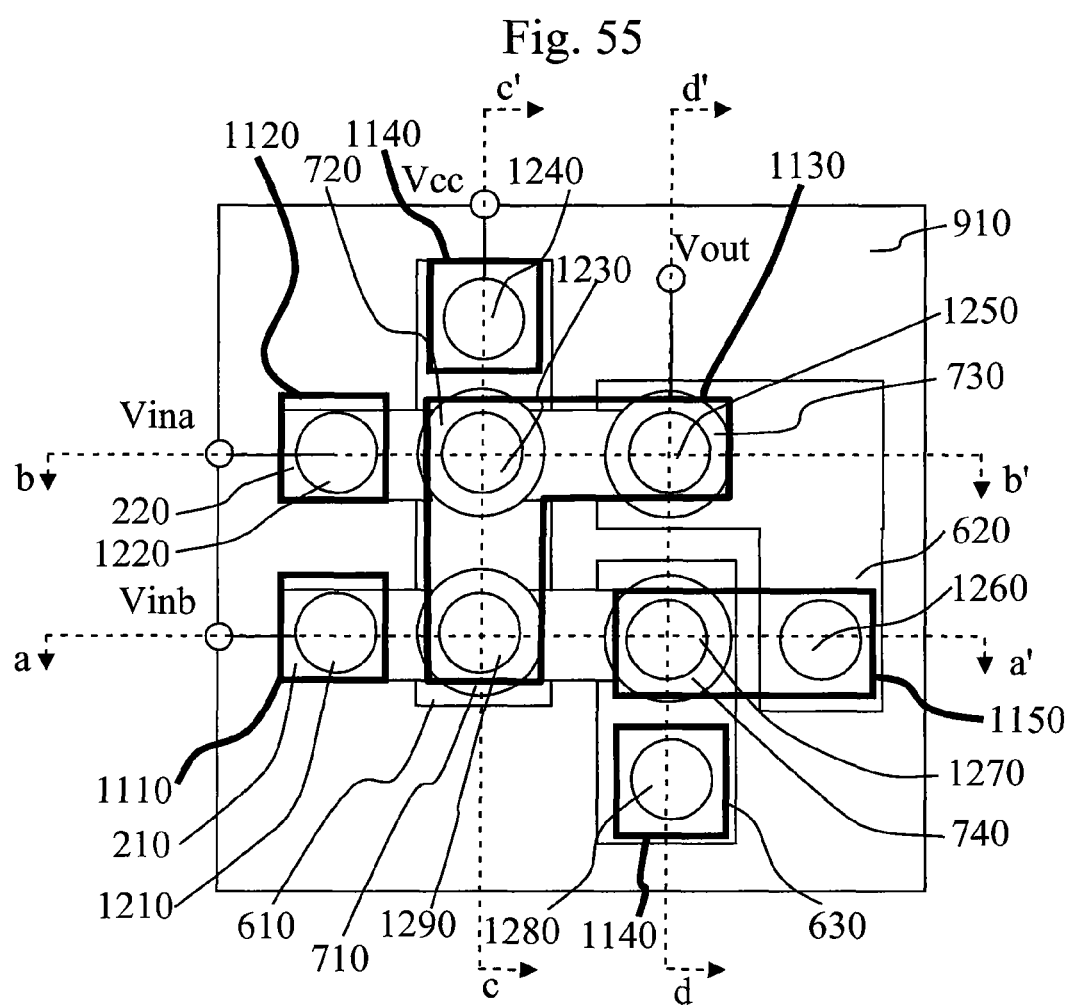
FIG. 55 is a summary top view of a semiconductor device relating to a fifth embodiment of the present invention which functions as a NAND circuit.
Figure 56:
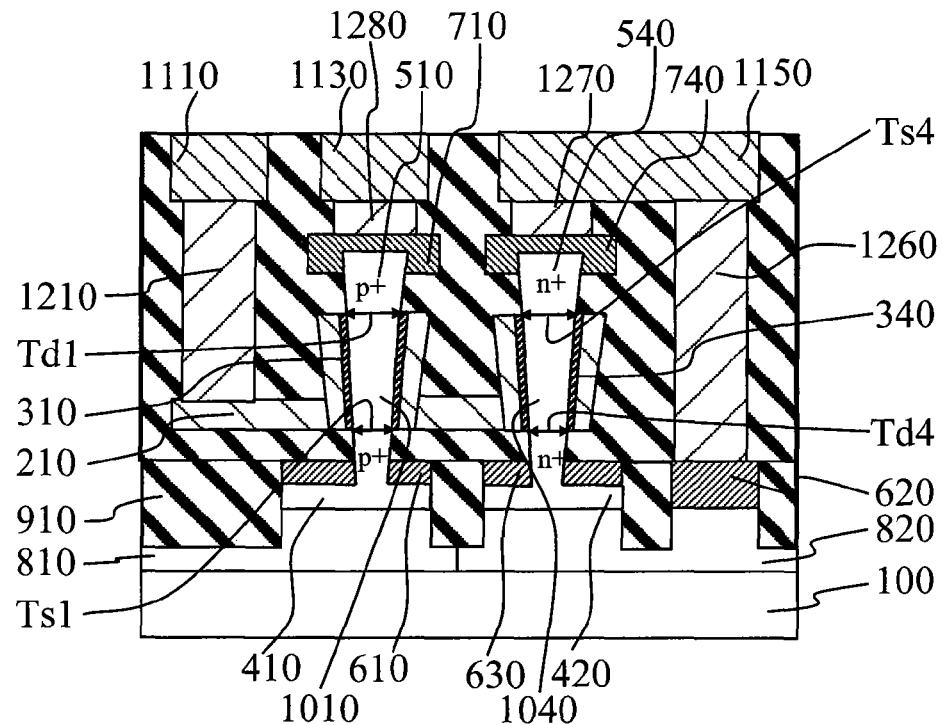
FIG. 56 is the line a-a' of the semiconductor device in FIG. 55.
Figure 57:
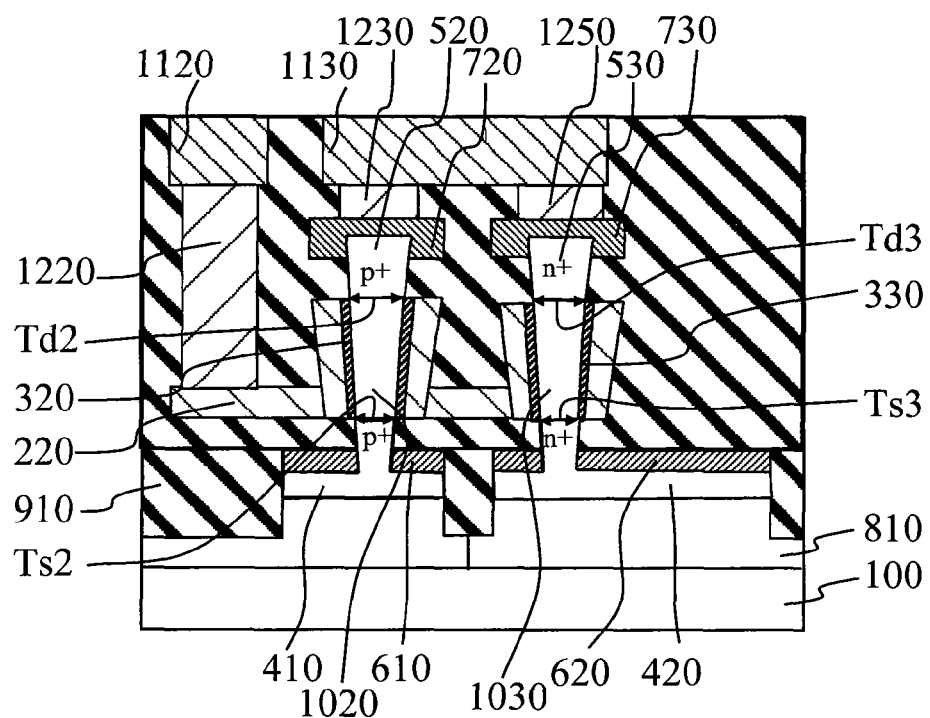
Figure 58:
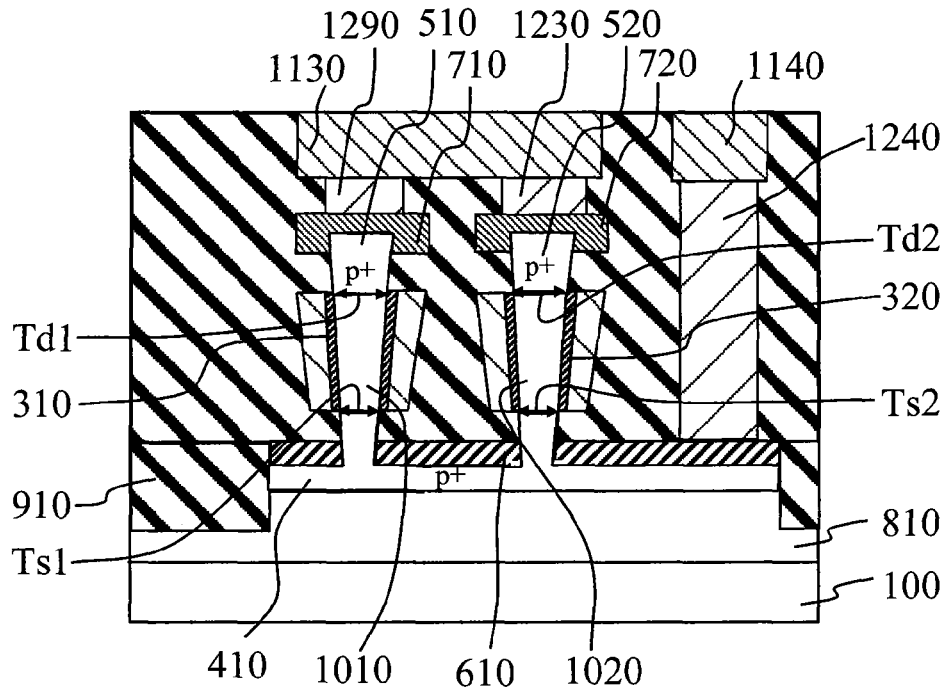
Figure 59:
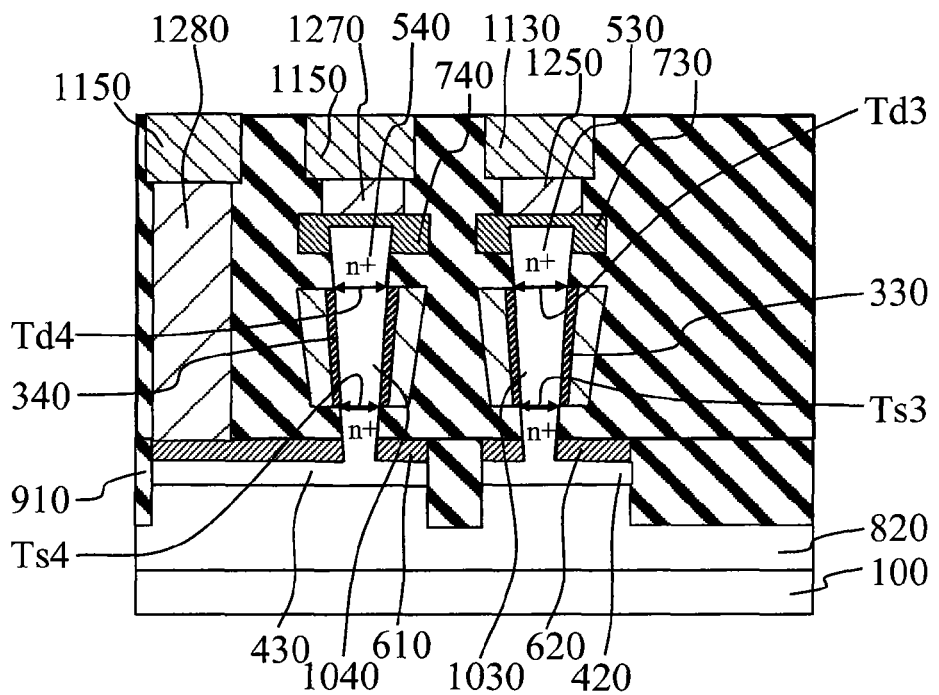

FIG. 55 is a summary top view of the semiconductor device relating to the fifth embodiment of the present invention. FIG. 56 is a simplified cross-sectional view along the cut line a-a' of FIG. 55, and FIG. 57 is a simplified cross-sectional view along the cut line b-b' of FIG. 55. FIG. 58 is a simplified cross-sectional view along the cut line c-c' of FIG. 55. FIG. 59 is a simplified cross-sectional view along the cut line d-d' of FIG. 55.

The first SGT arranged in a 1st row 1st column is provided with a silicon column 1010 comprising a high resistance region. The silicon column 1010 forms a reverse taper circular truncated cone. The first insulating body 310 is arranged on an upper side surface of the silicon column 1010 so as to encompass the silicon column 1010.

A gate electrode 210 is arranged on a side surface of the first insulating body 310 so as to encompass the first insulating body 310. On the lower part of the silicon column 1010 is arranged a p+ high-density impurity region 410 (source region), and on the upper part, is arranged a p+ high density impurity region 510 (drain region), respectively.

The p+ high-density impurity region 410 is arranged on an N well 810. On the upper part of the p+ high-density impurity region 410, is formed a silicide region 610, and on the upper part of the p+ high-density impurity region 510 is formed a silicide region 710, respectively. On the silicide region 710 is arranged a contact 1290. On the contact 1290 is arranged metal wiring 1130.

With the first SGT, the diameter Ts1 of the contact cross-sectional surface between the silicon column 1010 and the p+ high-density impurity region 410 is smaller than the diameter Td1 of the contact cross-sectional surface between the silicon column 1010 and the p+ high-density impurity region 510.

The second SGT arranged in a 2nd row 1st column is provided with a silicon column 1020 comprising a high resistance region. The silicon column 1020 forms a reverse taper circular truncated cone. The first insulating body 320 is arranged on an upper side surface of the silicon column 1020 so as to encompass the silicon column 1020. A gate electrode 220 is arranged on the upper side surface of the first insulating body 320 so as to encompass the first insulating body 320. On the lower part of the silicon column 1020 is arranged a p+ high-density impurity region 410 (source region), and on the upper part, is arranged a p+ high density impurity region 520 (drain region), respectively. The p+ high-density impurity region 410 is arranged on an N well 810. On the upper part of the p+ high-density impurity region 410, is formed a silicide region 610, and on the upper part of the p+ high-density impurity region 520 is formed a silicide region 720, respectively. On the silicide region 710 is arranged a contact 1230. On the contact 1290 is arranged metal wiring 1130.

With the second SGT, the diameter Ts2 of the contact cross-sectional surface between the silicon column 1020 and the p+ high-density impurity region 410 is smaller than the diameter Td2 of the contact cross-sectional surface between the silicon column 1020 and the p+ high-density impurity region 520.

The third SGT arranged in a 2nd row 2nd column is provided with a silicon column 1030 comprising a high resistance region. The silicon column 1030 forms an overall reverse taper circular truncated cone. The first insulating body 330 is arranged on an upper side surface of the silicon column 1030 so as to encompass the silicon column 1030.

A gate electrode 220 is arranged on an upper side surface of the first insulating body 330 so as to encompass the first insulating body 330. On the lower part of the silicon column 1030 is arranged an n+ high-density impurity region 420 (source region), and on the upper part, is arranged an n+ high density impurity region 530 (drain region), respectively.

The n+ high-density impurity region 420 is arranged on an N well 810. On the upper part of the n+ high-density impurity region 420, is formed a silicide region 620, and on the upper part of the n+ high-density impurity region 530 is formed a silicide region 730, respectively. On the silicide region 730 is arranged a contact 1250. On the contact 1250 is arranged metal wiring 1130.

With the third SGT, the diameter Ts3 of the contact cross-sectional surface between the silicon column 1030 and the n+ high-density impurity region 420 is smaller than the diameter Td3 of the contact cross-sectional surface between the silicon column 1030 and the n+ high-density impurity region 530.

The fourth SGT arranged in the 1st row 2nd column is provided with a silicon column 1040 comprising a high resistance region. The silicon column 1040 forms a reverse taper circular truncated cone. The first insulating body 340 is arranged on an upper side surface of the silicon column 1040 so as to encompass the silicon column 1040.

A gate electrode 210 is arranged on an upper side surface of the first insulating body 340 so as to encompass the first insulating body 340. On the lower part of the silicon column 1040 is arranged an n+ high-density impurity region 420 (drain region), and on the upper part, is arranged an n+ high density impurity region 540 (source region), respectively.

The n+ high-density impurity region 420 is arranged on a P well 820. On the upper part of the n+ high-density impurity region 420, is formed a silicide region 620, and on the upper part of the n+ high-density impurity region 540 is formed a silicide region 740, respectively. On the silicide region 740 is arranged a contact 1270. On the contact 1270 is arranged metal wiring 1150.

With the fourth SGT, the diameter Ts4 of the contact cross-sectional surface between the silicon column 1040 and the n+ high-density impurity region 540 is smaller than the diameter Td4 of the contact cross-sectional surface between the silicon column 1040 and the n+ high-density impurity region 420.

In addition, on the first SGT gate electrode 210 is arranged a contact 1210. On contact 1210 is arranged metal wiring 1110. On the second SGT gate electrode 220 is arranged a contact 1220. On the contact 1220 is arranged metal wiring 1120. On the p+ high-density impurity region 410 is arranged a contact 1240. On the contact 1240 is arranged metal wiring 1140. On the fourth SGT n+ high-density impurity region 420 is arranged a contact 1270. On the contact 1270, is arranged metal wiring 1150. On the fourth SGT n+ high-density impurity region 420 is arranged a contact 1280. On the contact 1280 is arranged metal wiring 1150. In addition, an element separation insulating film 910 is formed on the side surface between the p+ high-density impurity region 410 and the n+ high-density impurity region 420.

With the present embodiment, all of the transistors composing the electronic circuits have the same structure as transistors relating to the first embodiment. Since it is capable of high speed operation, the semiconductor device relating to the present embodiment is also capable of high speed operation. In addition, since all of the silicon columns have a reverse taper circular truncated cone, the production of the silicon columns can be accomplished in a single step. Owing to this, the production of the semiconductor device relating to the present embodiment is simplified. In addition, since utilization is made of a bulk substrate as the substrate, in comparison with the use of an SOI substrate, the production costs can be maintained at low cost.

Next, an example of the production method of the semiconductor device relating to the fifth embodiment of the present invention is explained with reference to FIG. 60A-FIG. 66C. Moreover, with these drawings, the same labels are applied relative to the same structural elements. In FIG. 60A-FIG. 66C, A is a planar view, B is a cross-sectional view along the line a-a', and C is a cross-sectional view along the line b-b'.

Figure 60A:
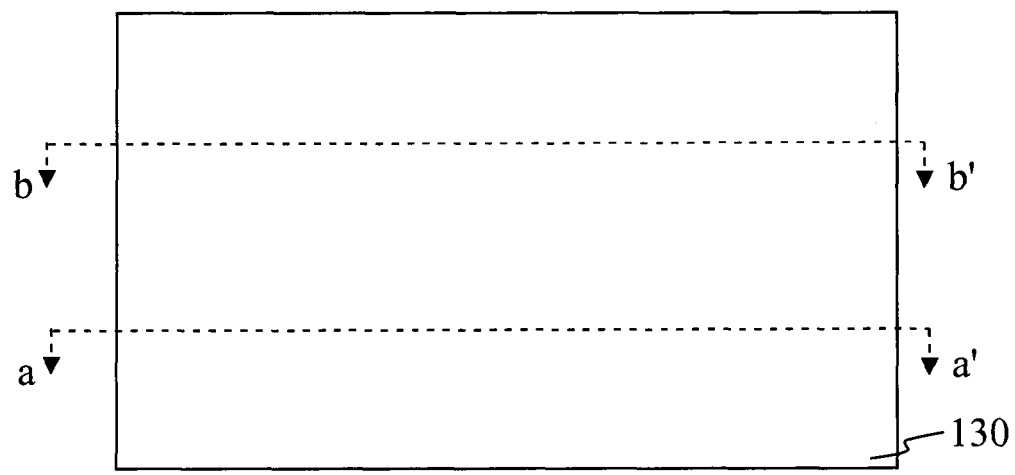
Figure 60B:
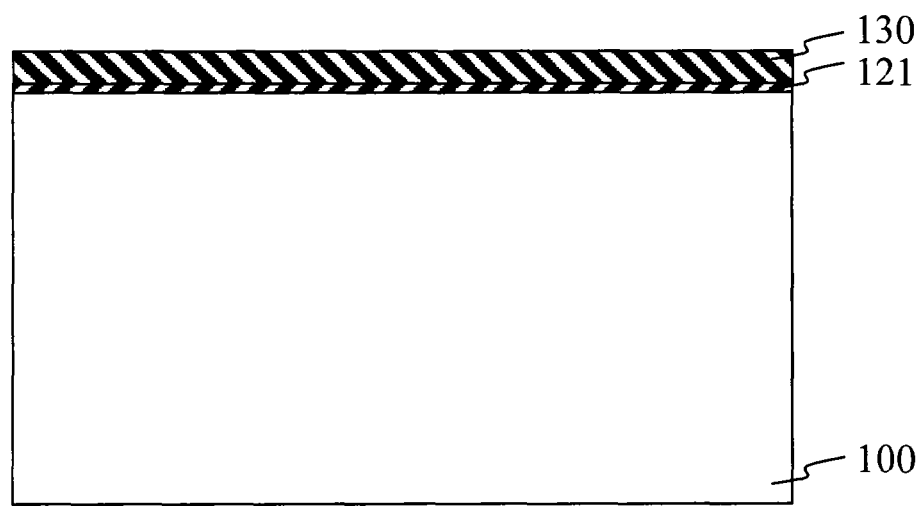
Figure 60C:
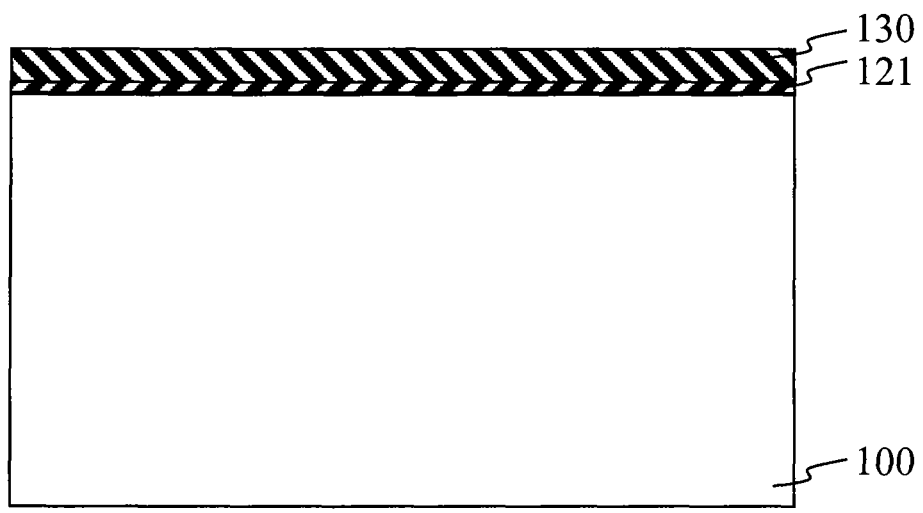

As shown in FIG. 60A-FIG. 60C a pad oxide film 121 and nitride film 130 are chronologically formed on Si substrate 100.

Figure 61A:
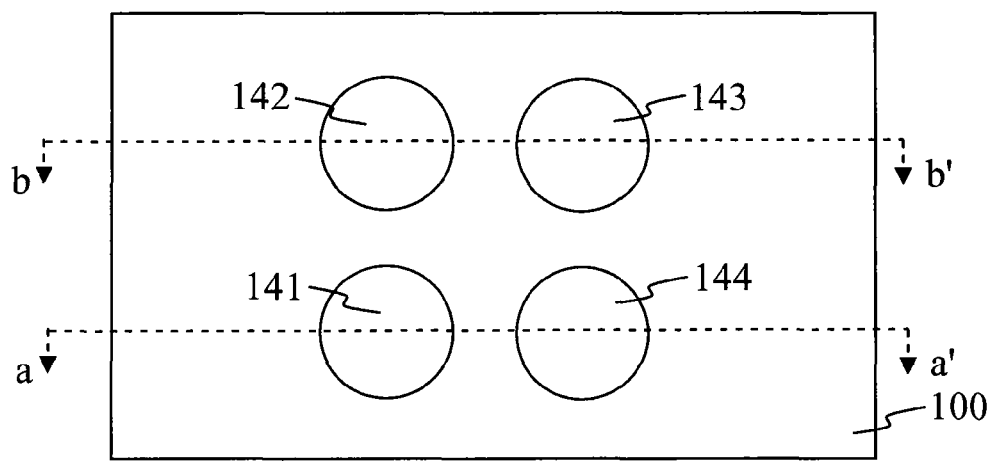
Figure 61B:
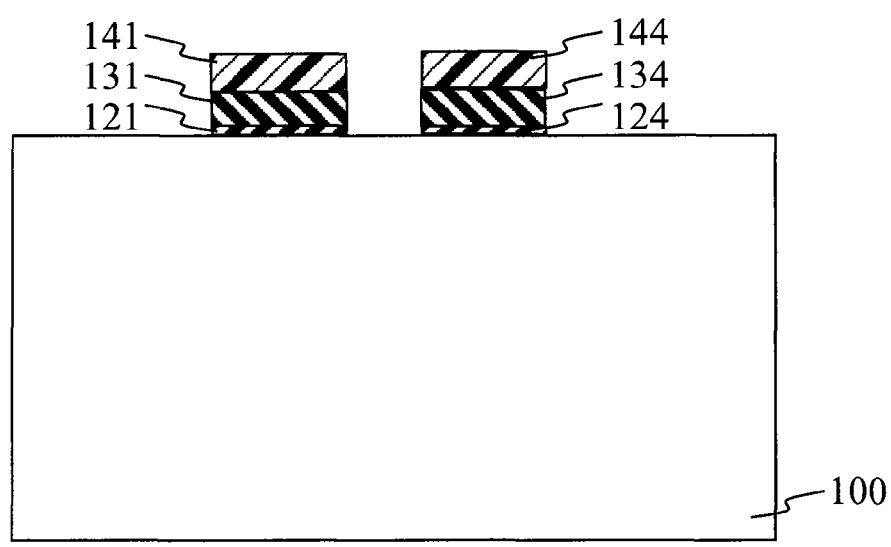
Figure 61C:
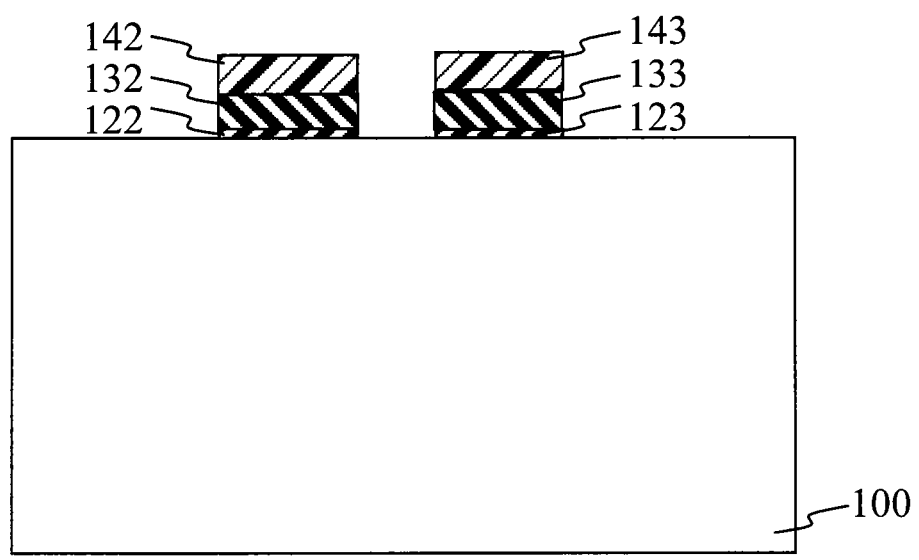

Resist patterns 141, 142, 143 and 144 are formed in a scheduled location which forms the silicon column. Continuing, by means of dry etching, using the resists patterns 141, 142, 143 and 144, nitride films 131, 132, 133 and 134, and oxide films 121, 122, 123 and 124 are respectively formed in a cylindrical shape. The semiconductor device involved in these steps is shown in FIG. 61A-FIG. 61C. Continuing, resist patterns 141, 142, 143 and 144 are removed.

Figure 62A:
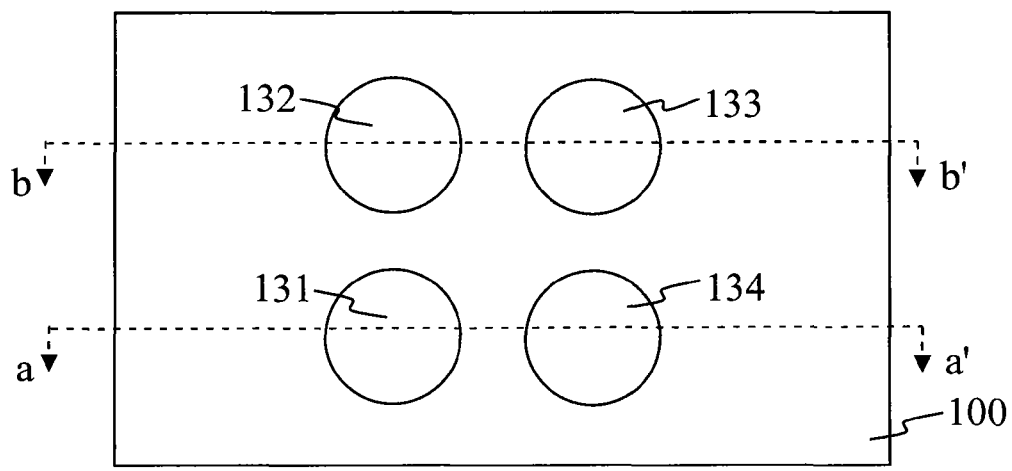
Figure 62B:
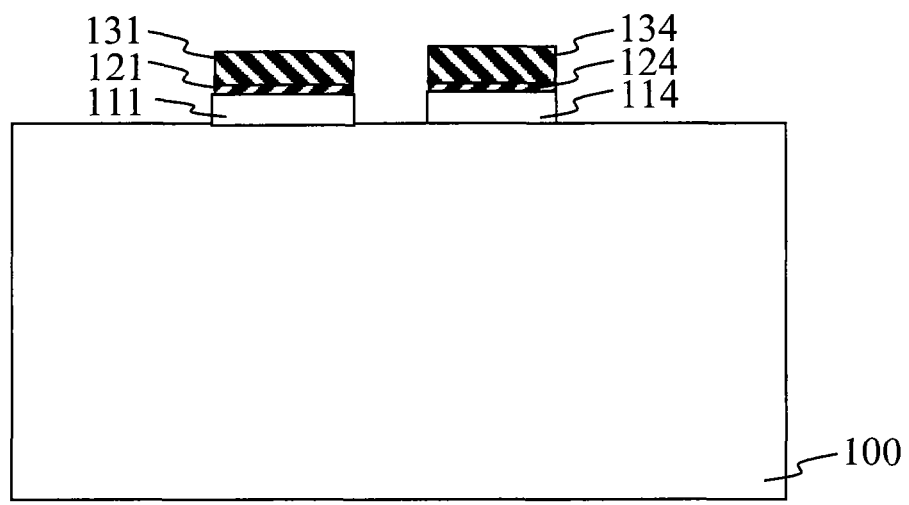
Figure 62C:
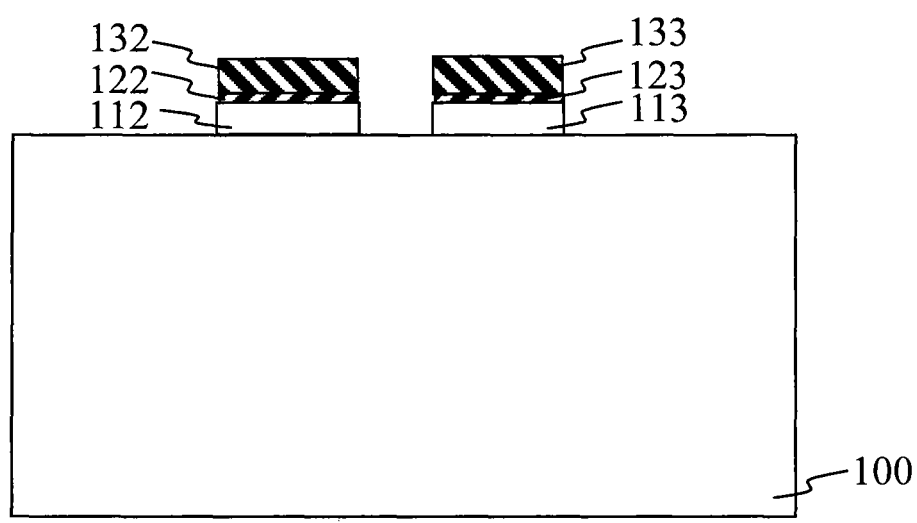

By dry etching, silicon columns 111, 112, 113 and 114 are respectively formed below the cylindrical nitride films 131, 132, 133 and 134. The semiconductor devices involved in these steps are shown in FIG. 62A-FIG. 62C.

Etching is accomplished in forming a nitride film 135 on the process results substance. As a result, as shown in FIG. 63A-FIG. 63C, formation is accomplished of a nitride film 136 in which the nitride film 135 sidewall is formed on the side surface of the nitride film 131, and a nitride film 137 in which the nitride film 135 sidewall is formed on the side surface of nitride film 132, and nitride film 138 in which the nitride film 135 sidewall is formed on the side surface of the nitride film 133, and a nitride film 139 in which the nitride film 135 sidewall is formed on the side surface of the nitride film 134.

As shown in FIGS. 64A-64C, using nitride films 136, 137, 138 and 139, reverse taper type silicon columns 115, 116, 117 and 118 are formed by dry etching.

As shown in FIGS. 65A-65C, nitride films 136, 137, 138 and 139, and oxide films 121, 122, 123 and 124 have been removed.

As shown in FIGS. 66A-66C, formation is accomplished of element separating insulation film 910, gate electrodes 210, 220, contacts 1210, 1220, 1230, 1240, 1250, 1260, 1270, 1290, and wiring 1110, 1120, 1130, 1140, 1150 and 1160.

Sixth Embodiment

Semiconductor Device

In the above embodiment, the source region and the drain region are all p type or n type silicon columns. However, by attaching a high resistance region to the inside of the silicon column, a reduction of the transistor OFF leakage electric current can be accomplished.

Therefore, an explanation is provided of the embodiments to which high resistance regions are attached within the silicon columns 1310 and 1410. FIG. 67 is a summary birds-eye view of the transistors relating to the sixth embodiment of the present invention. FIG. 68 is a simplified cross-sectional view along the cut line a-a' of FIG. 67, and FIG. 69 is a simplified cross-sectional view along the cut line b-b' of FIG. 67. FIG. 70 is a simplified cross-sectional view along the cut line c-c' of FIG. 67, and FIG. 71 is a simplified cross-sectional view along the cut line d-d' of FIG. 67.

The transistors relating to the sixth embodiment are provided with a silicon column 1010 comprising a high resistance region. On the silicon column 1010 is arranged a silicon column 1510, and below the silicon column 1010 is arranged a silicon column 1710. In addition, a silicon column 1310 is arranged above silicon column 1010 so as to cover the silicon column 1510, and the silicon column 1410 is arranged below silicon column 1410 so as to cover silicon column 1710, respectively. The silicon column 1010, silicon column 1310, and silicon column 1410, as an entirety, are circular truncated cones.

The silicon layer 1310 and silicon layer 1410 are p type or n type, which introduce arsenic or boron impurities. With the present embodiment, the silicon column 1310 functions as a source diffusion layer, and the silicon column 1410 functions as a drain diffusion layer, respectively. The silicon layer 1010 between the silicon layer 1310 and the silicon layer 1410 functions as a channel region. The silicon column 1510 and the silicon column 1710 respectively function as high resistance regions within the silicon column 1310 and the silicon column 1410.

The first gate insulating film 310 is arranged so as to encompass the silicon column 1010. The first gate insulating film 310 is composed from high-k film, for example oxynitride film, silicon nitride film, hafnium oxide, hafnium oxynitride, and titanium oxide and the like. A gate electrode 210 is provided so as to encompass the first gate insulating film 310. The gate electrode 210 is composed, for example, from titanium, titanium nitride, tantalum, tantalum nitride, and tungsten, and the like.

In the present embodiment, at the time of operation, through the impression of the gate electrode 210, a channel is formed in the silicon column 1010.

With the present embodiment, the Ts comprising the contact surface between the silicon column 1010 and the silicon column 1310 is smaller than the Td comprising the diameter between the silicon column 1010 and the silicon column 1410. Owing to this, as with the first embodiment, the transistor ON-current relating to the present embodiment is relatively large. In addition, the diameter Td' of the contact surface between the silicon column 1010 and the silicon column 1710 is greater than the diameter Ts' of the contact surface between the silicon column 1010 and the silicon column 1510. Moreover, at this time, Td' and Ts' are greater than 0. By such a structure, as explained hereafter, the Off-leakage electric current of the transistor relating to the present embodiment is relatively small.

The fact that the OFF-leakage current of the transistors relating to the sixth embodiment is smaller than the OFF-leakage current of transistors relating to the first embodiment is based on the analytical results accomplished through model simulation.

The transistor models relating to the first and sixth embodiments are respectively formed. Both models are joint in that the silicon gate work constant is 4.3 eV and the silicon column 1010 P type impurity concentration is $10^{15}$ (/cm$^3$), formed from a silicon column 1010 where the height is 100 nm, the gate electrode 210 height (L) is 100 nm, the film thickness of the gate insulating film is 2 nm, and the height of the silicon column 1410 and the silicon column 1310 is 100 nm, and from silicon column 1010.

With the transistor model relating to the first embodiment, the Td comprising the diameter of the contact surface between the silicon column 1010 and the silicon column 1410 (drain region) is 100 nm, and the Ts comprising the diameter between the contact surface of the silicon column 1010 and the silicon column 1310 (source region) is 80 nm. On the other hand, with the transistor model relating to the sixth embodiment, the Td comprising the diameter between the contact surface of the silicon column 1010 and the silicon column 1410 is 100 nm, and the diameter Td' between the contact surface of the silicon column 1010 and the silicon column 1710 is 80 nm, and the Ts comprising the diameter between the contact surface of the silicon column 1010 and the silicon column 1310 is 80 nm, and the diameter Ts' of the contact surface between the silicon column 1010 and the silicon column 1510 is 60 nm.

In addition, the impurity and concentration of the N-type impurity region of the silicon column 1410 and the silicon column 1310 is $10^{20}$ (/cm$^3$). Using the above structure, with the production method of the first embodiment, simulation was performed. FIG. 72 is a plotted view of the drain current (Id, log indication) and the gate voltage (Vg).

What this experiment, the OFF-leakage current is equal to the drain current (Id) when the gate voltage (Vg) is 0V. From FIG. 72 it is understood that the OFF-leakage current of the transistor relating to the sixth embodiment is smaller than the OFF-leakage current of the transistor model relating to the first embodiment. In addition, FIG. 73 is a plotted diagram of the drain current (Id) and the gate voltage (Vg). With this experiment, the ON current is equal to the drain voltage (Vd) when the drain voltage (Vd) in the gate voltage (Vg) is 1.2V. from FIG. 73, and is understood that the ON current of the transistor models relating to the first and sixth embodiments are substantially the same. Hence, according to FIG. 72 and FIG. 73, the transistors relating to the sixth embodiment, in comparison with the transistors relating to the first embodiment is greater than the ON-current when the ON-current does not change.

As indicated above, the transistors relating to the present embodiment by means of the above structure where Ts<Td and Ts'<Td', while supporting a relatively great ON current, shows a relatively small OFF leakage current. Owing to this, through the use of the present transistors, semiconductor device high-speed operation and energy power conservation is possible.

In the second to fifth embodiments are shown the semiconductor devices composed from transistors relating to the first embodiment. In the seventh to tenth embodiments, examples are shown of semiconductor devices composed from transistors relating to the sixth embodiment. The semiconductor devices relating to these embodiments function as NAND circuits. Moreover, NAND circuits do nothing more than show examples of electronic circuits, and other electronic circuits are also capable of high speed operation when using the transistors relating to the seventh to tenth embodiments.

Seventh Embodiment

Semiconductor Device

FIG. 74 is a summary top view of the semiconductor device relating to the seventh embodiment of the present invention. FIG. 75 is a simplified cross-sectional view along the cut line a-a' of FIG. 74, and FIG. 76 is a simplified cross-sectional view along the cut line b-b' of FIG. 74. FIG. 77 is a simplified cross-sectional view along the cut line c-c' of FIG. 74, and FIG. 78 is a simplified cross-sectional view along the cut line d-d' of FIG. 74.

The semiconductor device relating to the seventh embodiment, within the source region and the drain region, with the exception of the point of the formation of the respective high resistance regions, is the same as the semiconductor device relating to the second embodiment.

With the present embodiment, all of the transistors composing the electronic circuits have the same structure as transistors relating to the sixth embodiment. By this means, the semiconductor device of the present embodiment is capable of high speed operation, and by this means the semiconductor device relating to the present embodiment conserves electric power.

In addition, the method of producing the trapezoidal column is the same as for the semiconductor device relating to the second embodiment.

Eighth Embodiment

Semiconductor Device

FIG. 79 is a summary top view of the semiconductor device relating to the eighth embodiment of the present invention. FIG. 80 is a simplified cross-sectional view along the cut line a-a' of FIG. 80, and FIG. 81 is a simplified cross-sectional view along the cut line b-b' of FIG. 79. FIG. 82 is a simplified cross-sectional view along the cut line c-c' of FIG. 79, and FIG. 83 is a simplified cross-sectional view along the cut line d-d' of FIG. 79.

The semiconductor device relating to the eighth embodiment, within the source region and the drain region, with the exception of the point of the formation of the respective high resistance regions, is the same as the semiconductor device relating to the third embodiment.

With this embodiment, all of the transistors composing the electronic circuits have the same structure as the transistors relating to the sixth embodiment. By this means, a semiconductor device relating to the present embodiment is capable of high-speed performance. In addition, by this means, for example, a semiconductor device relating to the present embodiment conserves electric power. In addition, since all of the devices have a circular truncated cone having an ordered tapered shape, the production of the silicon columns can be accomplished in a single step. Therefore, production of the semiconductor device relating to the present embodiment becomes simplified.

In addition, the production method for producing a trapezoidal silicon column is the same as the semiconductor device relating to the third embodiment.

Ninth Embodiment

Semiconductor Device

FIG. 84 is a summary top view of the semiconductor device relating to the ninth embodiment of the present invention. FIG. 85 is a simplified cross-sectional view along the cut line a-a' of FIG. 84, and FIG. 86 is a simplified cross-sectional view along the cut line b-b' of FIG. 84. FIG. 87 is a simplified cross-sectional view along the cut line c-c' of FIG. 84, and FIG. 88 is a simplified cross-sectional view along the cut line d-d' of FIG. 84.

The semiconductor device relating to the ninth embodiment, within the source region and the drain region, with the exception of the point that respective high resistance regions are formed, is the same as the semiconductor device relating to the fourth embodiment.

With this embodiment, all of the transistors composing electronic circuits have the same structure as the transistors relating to the sixth embodiment. By this means, the semiconductor relating to the present embodiment is capable of high speed operation. In addition, by this means, the semiconductor device relating to the present embodiment conserves electric power. In addition, since as the substrate, use is made of a bulk substrate, in comparison with the case of using an SOI substrate as the substrate, the production costs can be maintained at low cost.

In addition, the production method of producing a trapezoidal silicon column is the same as the semiconductor device relating to the fourth embodiment.

Tenth Embodiment

Semiconductor Device

FIG. 89 is a summary top view of the semiconductor device relating to the tenth embodiment. FIG. 90 is a simplified cross-sectional view along the cut line a-a' of FIG. 89. FIG. 91 is a simplified cross-sectional view along the cut line b-b' of FIG. 89. FIG. 92 is a summary top view along the cut line c-c' of FIG. 89, and FIG. 93 is a summary top view along the cut line d-d' of FIG. 89.

The semiconductor device relating to the ninth embodiment, within the source region and the drain region, with the exception of the point that respective high resistance regions are formed, is the same as the semiconductor device relating to the fifth embodiment.

With this embodiment, all of the transistors composing the electronic circuit have the same structure as the transistors relating to the sixth embodiment. By this means, a semiconductor device relating to the present embodiment is capable of high speed operation. In addition, by this means, the semiconductor device relating to the present embodiment conserves electric power. In addition, as the substrate, since utilization is made of a bulk substrate, in comparison with the case of using an SOI substrate as the substrate, production costs can be maintained at low cost.

In addition, the production method for producing a trapezoidal silicon column is the same as for the semiconductor device relating to the fifth embodiment.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

What is claimed is:

1. A semiconductor device comprising:
    semiconductor elements including first and second silicon columns adjacent to each other on a substrate and separated by an insulation film;
    insulating bodies on the silicon columns and surrounding a side surface of the silicon columns;
    a gate on each of the insulating bodies and surrounding the insulating bodies;
    a source region at one of above or below each of the first and second silicon columns and a drain region at an opposite end of each of the first and second silicon columns, the drain regions adjacent to the source regions and separated by the insulation film,
    wherein a contact surface of the first and second silicon columns with the source regions is smaller than a contact surface of the silicon column with the drain regions.

2. The semiconductor device according to claim 1 further comprising:
    one or more separate first or second semiconductor elements as recited in claim 1 on the substrate, wherein the gate of the semiconductor element is connected to gates of the separate semiconductor elements, and
    the drain region of the semiconductor element is connected to drain regions of the separate semiconductor elements, and, the source region of the semiconductor element is connected to source regions of the separate semiconductor elements.

3. The semiconductor device according to claim 1, wherein the gates of each of the semiconductor elements are electrically coupled.

4. The semiconductor device according to claim 1, wherein the source and drain regions of the semiconductor elements are electrically coupled.

5. A semiconductor device operating as a NAND circuit, the device including a first semiconductor element comprising:
    a silicon column;
    an insulating body on the silicon column and surrounding a side surface of the silicon column;
    a gate on the insulating body and surrounding the insulating body;
    a source region residing above or below the silicon column; and
    a drain region residing below or above the silicon column,
    wherein a contact surface of the silicon column with the source region is smaller than a contact surface of the silicon column with the drain region;
    wherein the first semiconductor element comprises at least one of four semiconductor elements in an array on a substrate the array further comprising:

one or more additional semiconductor elements on the substrate that are different from the first semiconductor element and separate from the first semiconductor element, wherein the gate of the first semiconductor element is connected to gates of the one or more additional semiconductor elements, the drain region of the first semiconductor element is connected to drain regions of the one or more additional semiconductor elements, the source region of the first semiconductor element is connected to source regions of the one or more additional semiconductor elements; and wherein the drain regions of the one or more semiconductor elements in a 1st row and 1st column, a 2nd row and 1st column, and a 2nd row and 2nd column are respectively on a substrate side of the silicon column;

the source region of the one or more additional semiconductor elements in the 1st row and 2nd column is toward the substrate side of the silicon column; and the gates of the one or more additional semiconductor elements in the 1st row and 1st column and in the 1st row and 2nd column are mutually connected;

the gates of the one or more additional semiconductor elements in the 2nd row and 1st column and in the 2nd and row 2nd column are mutually connected;

the drain regions of the one or more additional semiconductor elements in the 1st row and 1st column, in the 2nd row and 1st column, and in the 2nd row and 2nd column are mutually connected; and the source region of the semiconductor element in the 2nd row and 2nd column is connected to the drain region of the semiconductor element in the 1st row and 2nd column.

* * * * *